(12) United States Patent
Nii et al.

(10) Patent No.: US 8,098,533 B2
(45) Date of Patent: Jan. 17, 2012

(54) SEMICONDUCTOR MEMORY DEVICE WITH ADJUSTABLE SELECTED WORD LINE POTENTIAL UNDER LOW VOLTAGE CONDITION

(75) Inventors: Koji Nii, Tokyo (JP); Shigeki Ohbayashi, Tokyo (JP); Yasumasa Tsukamoto, Tokyo (JP); Makoto Yabuuchi, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/457,936

(22) Filed: Jun. 25, 2009

(65) Prior Publication Data

US 2009/0268531 A1 Oct. 29, 2009

Related U.S. Application Data

(62) Division of application No. 11/492,031, filed on Jul. 25, 2006, now Pat. No. 7,570,525.

(30) Foreign Application Priority Data

| Aug. 2, 2005 | (JP) | ................................. 2005-224258 |
| May 23, 2006 | (JP) | ................................. 2006-143014 |

(51) Int. Cl.
*G11C 7/00* (2006.01)
(52) U.S. Cl. ............... 365/189.11; 365/154; 365/230.03
(58) Field of Classification Search .................. 365/154, 365/189.01, 189.11, 230.03, 154 X, 189.11 O, 365/230.03 X
See application file for complete search history.

(56) References Cited

U.S. PATENT DOCUMENTS

| 5,010,521 | A | 4/1991 | Matsui |
| 6,088,286 | A | 7/2000 | Yamauchi et al. |
| 6,222,780 | B1 * | 4/2001 | Takahashi ................ 365/189.09 |
| 6,426,914 | B1 | 7/2002 | Dennard et al. |
| 6,512,705 | B1 * | 1/2003 | Koelling et al. ......... 365/189.11 |

(Continued)

FOREIGN PATENT DOCUMENTS

JP 58019791 2/1983

(Continued)

OTHER PUBLICATIONS

K. Zhang et al., A 3-GHz 70Mb SRAM in 65nm CMOS Technology with Integrated Column-Based Dynamic Power Supply, ISSCC 2005, Digest of Technical Papers, Feb. 2005, pp. 474-475, 611.

(Continued)

*Primary Examiner* — VanThu Nguyen
(74) *Attorney, Agent, or Firm* — Buchanan Ingersoll & Rooney PC

(57) ABSTRACT

A level shift element adjusting a voltage level at the time of selection of a word line according to fluctuations in threshold voltage of a memory cell transistor is arranged for each word line. This level shift element lowers a driver power supply voltage, and transmits the level-shifted voltage onto a selected word line. The level shift element can be replaced with a pull-down element for pulling down the word line voltage according to the threshold voltage level of the memory cell transistor. In either case, the selected word line voltage level can be adjusted according to the fluctuations in threshold voltage of the memory cell transistor without using another power supply system. Thus, the power supply circuitry is not complicated, and it is possible to achieve a semiconductor memory device that can stably read and write data even with a low power supply voltage.

6 Claims, 42 Drawing Sheets

U.S. PATENT DOCUMENTS

| | | | | |
|---|---|---|---|---|
| 6,819,621 B2 | * | 11/2004 | Koelling et al. | 365/227 |
| 6,873,562 B2 | * | 3/2005 | Koelling et al. | 365/229 |
| 6,914,848 B2 | * | 7/2005 | Jamshidi et al. | 365/230.06 |
| 6,934,209 B2 | | 8/2005 | Marr | |
| 7,085,175 B2 | | 8/2006 | Remington et al. | |

FOREIGN PATENT DOCUMENTS

| | | |
|---|---|---|
| JP | 2005-038557 | 2/2005 |

OTHER PUBLICATIONS

M. Yamaoka et al, Low-Power Embedded SRAM Modules With Expanded Margins for Writing, ISSCC 2005, Digest of Technical Papers, Feb. 2005, pp. 480-481, 611.

Notice of Grounds of Rejection mailed Nov. 8, 2011 in corresponding JP Application No. 2006-143014, and English-language translation, 8 pps.

* cited by examiner

MC

WDR

SAME Vthn CHARACTERISTICS
SIMILAR LAYOUT AND W/L

DMC

DMC

58

56

MC

SEMICONDUCTOR MEMORY DEVICE WITH ADJUSTABLE SELECTED WORD LINE POTENTIAL UNDER LOW VOLTAGE CONDITION

CROSS REFERENCE TO RELATED APPLICATION

This application is a continuation application of U.S. patent application No. 11/492,031, filed on Jul. 25, 2006, the entire content of which is hereby incorporated in its entirety by reference.

BACKGROUND OF THE INVENTION

1. Field of the Invention

The present invention relates to a semiconductor memory device, and particularly to a construction of a static semiconductor memory device that can stably write and read data even under an operation condition of a low voltage.

2. Description of the Background Art

When transistor elements are miniaturized according to progress of miniaturization technology, voltage scaling according to the miniaturization is required from the viewpoint of reliability and power consumption of the elements. However, the miniaturization increases an influence on fluctuations in manufacturing parameters, so that a threshold voltage of transistors (insulated gate field effect transistor) forming memory cells is greatly varied, and an operation margin thereof lowers. Consequently, the semiconductor memory device cannot stably and reliably write and read data with a low power supply voltage.

Various constructions have been proposed for the purpose of stably writing and reading data even with a low power supply voltage.

A literature 1 (K. Zhang et al., "A 3-GHz 70 Mb SRAM in 65 nm CMOS Technology with Integrated Column-Based Dynamic Power Supply," ISSCC 2005, Digest of Technical Papers, February 2005, pp. 474-475) discloses a construction in which a level of a memory cell power supply voltage is changed according to reading and writing of data for improving a static noise margin SNM and a write margin.

In Literature 1, a memory cell power supply voltage is controlled on a column-by-column basis, or in units of columns of memory cells. In a data write operation, the memory cell power supply voltage in a selected column is set to a low voltage of (VCC-LO), and the cell power supply voltages for the unselected columns are set to a slightly high voltage of (VCC-HI) similar to that in a read operation so that a static noise margin in the read operation is improved, and a write margin is ensured.

A literature 2 (M. Yamaoka et al., "Low-Power Embedded SRAM Modules with Expanded Margins for Writing," ISSCC 2005, Digest of Technical Papers, February 2005, pp. 480-481) discloses a construction in which a memory cell power supply line in a selected column is set to a floating state in a data write operation, and the memory cell power supply lines in the other, unselected columns are kept at a predetermined voltage level similarly to that in a read operation. In Literature 2, a dummy bit line is employed for producing a word line deactivation timing signal WOFF according to a dummy bit line potential, and a word line driver is deactivated to drive a selected word line to an unselected state according to the dummy line potential.

In the construction disclosed in Literature 2, a discharging transistor setting a ground voltage level is provided for each word line separately from the word line driver. This discharging transistor is kept off in a standby state. When the selected word line is to be driven to an inactive state, the discharging transistor drives rapidly the word line to the unselected state with its large current driving power. After the word line is driven to the unselected state, the power supply to this word line driver is cut off so that a gate potential of the discharging transistor attains the L level according to the driver power supply voltage, and the discharging transistor is turned nonconductive.

A prior art reference 1 (Japanese Patent Laying-Open No. 2005-038557) discloses a construction in which a word line driver is formed using a level conversion circuit, and a selected word line is driven with an amplitude different from that of the memory cell power supply voltage. Prior Art Reference 1 also intends to improve write and read margins even when a threshold voltage of the memory cell transistor is varied, by converting the potential of the selected word line.

In the construction disclosed in Literature 1, the level of the memory cell power supply voltage is switched and controlled in units of memory cell columns, or on a column-by-column basis. Therefore, two kinds of voltages are required for the memory cell power supply voltage, which results in a problem that a power supply circuit becomes complicated for implementing the two-power-supply construction.

Although the memory cell power supply voltage can be switched, the switching voltage levels are fixed potentials produced by an internal power supply circuit. Therefore, even when variations occur in threshold voltage of the memory cell transistor due to fluctuations in process parameters, the switching voltage level does not change in close linkage with such variations, so that it is difficult to compensate for the changes in threshold voltage, and it is difficult to ensure reliably the write and read margins when changes occur in electric characteristics of the memory cell transistors such as threshold voltages.

In the construction disclosed in Literature 2, the memory cell power supply line in the selected column is set to the floating state in the data writing, and thereby the power supply voltage of the memory cells in the writing column, or write target column is lowered for ensuring the write margin. In Literature 2, improvement of the write margin and reduction of the power consumption is discussed, but no consideration is given to the improvement of the read margin in the case where threshold voltages of the memory cell transistors are varied.

In the construction disclosed in Prior Art Reference 1, the memory cell transistor is formed using a Thin Film Transistor (TFT), and the level conversion circuit changes the potential amplitude of a selected word line for improving the write and read margins even when variations occur in threshold voltage of the memory cell transistors. Specifically, in Prior Art Reference 1, when the data writing is to be performed, the selected word line is driven to a potential level higher than the memory cell power supply potential, and a current driving power of the access transistors of the memory cell is increased so that fast writing is performed, and the write margin is ensured. In data reading, the selected word line is driven to a voltage level lower than a high-side power supply voltage of the memory cell. Thereby, the gate potential of the access transistors of the memory cell is lowered to lower their current driving power so that the static noise margin is ensured to prevent data destruction in the data read operation.

In the construction disclosed in the Prior Art Reference 1, however, the operation power supply voltage of the level conversion circuit is supplied separately and independently from the memory cell power supply voltage, and the shifted voltage level by the level conversion circuit is fixed and is not affected by the threshold voltage of the memory cell. In the Prior Art Reference 1, the power supply for the level shift must be arranged independently of and separately from the circuitry of the memory cell power supply, which complicates the construction of the power supply related circuitry. The potential of the selected word line is fixed, and therefore cannot flexibly follow the variations in threshold voltage of the memory cell transistors.

In the data write operation, the selected word line is driven to the level higher than that of the memory cell power supply, and no consideration is given to the stability of data of unselected memory cells that are connected to the selected row in the data writing.

SUMMARY OF THE INVENTION

An object of the present invention is to provide a semiconductor memory device which allows stable reading and writing of data even with a low power supply voltage with a simple circuit construction.

Another object of the present invention is to provide a semiconductor memory device that adjusts a selected word line potential while flexibly following a threshold voltage of a memory cell transistor, and thereby can ensure write and read margins even with a low power supply voltage.

A semiconductor memory device according to a first aspect of the present invention includes a plurality of static memory cells arranged in rows and columns; a plurality of word lines, arranged corresponding to the respective memory cell rows, each connected to the memory cells in a corresponding row; and a plurality of word line drivers, arranged corresponding to the word lines, each for driving a corresponding word line to the selected state according to a word line select signal. Each word line driver includes a level shift element for shifting a voltage level of a driver power supply node to a voltage level lower than a voltage level of the driver power supply node. Each of the word line drivers drives the corresponding word line to the shifted voltage level of the voltage level of the driver power supply node by the level shift element when the corresponding word line is selected.

A semiconductor memory device according to a second aspect of the present invention includes a plurality of static memory cells arranged in rows and columns; a plurality of word lines, arranged corresponding to the respective memory cell rows, each connected to the memory cells in a corresponding row; a plurality of word line drivers arranged corresponding to the word lines, each for driving a corresponding word line to a selected state according to a word line select signal; and a plurality of pull-down elements arranged corresponding to the respective word lines, each for lowering a voltage level of a corresponding word line when the corresponding word line is selected.

A semiconductor memory device according to a third aspect of the invention includes a plurality of static memory cells, arranged in rows and columns, each including an access transistor and a drive transistor storing data; a plurality of word lines, arranged corresponding to the respective memory cell rows, each connected to the access transistors of the memory cells in a corresponding row; a plurality of word line drivers arranged corresponding to the word lines, each for driving a corresponding word line to a selected state according to a word line select signal; a plurality of active regions separated from each other, each continuously extending in a memory cell column direction so as to cross each of the word lines, and each electrically coupled to each of the word lines at a crossing point; and a plurality of replica gate electrodes arranged for each of the active regions with a same pitch and a same layout as gate electrodes of the access transistors in the memory cell column direction. These replica gate electrodes are aligned in the row and column directions, and each word line is coupled to the corresponding active region at a first side in the column direction of each of the replica gate electrodes.

The semiconductor memory device according to the third aspect of the invention further includes a plurality of control signal lines continuously extending in the column direction so as to cross each of the replica gate electrodes, electrically coupled to the replica gates in the corresponding columns, and each transmitting a control signal to the replica gate electrodes in the corresponding column; and a plurality of cell ground lines electrically coupled to the respective replica gate electrodes in each of the active regions at second sides opposite to the first sides in the column direction, and each for transmitting a ground voltage.

A semiconductor memory device according to a fourth aspect of the invention includes a plurality of static memory cells arranged in rows and columns; a plurality of word lines, arranged corresponding to the respective memory cell rows, each connected to the memory cells in a corresponding row; a plurality of word line drivers arranged corresponding to the word lines, each for driving a corresponding word line to a selected state according to a word line select signal; a plurality of cell power supply lines, arranged corresponding to the respective memory cell columns, each coupled to the cell power supply nodes of the memory cells in a corresponding column; a plurality of down power supply lines arranged corresponding to the respective memory cell columns, maintained at the ground voltage level in a data read operation and turning into a floating state in a data write operation; and a plurality of write assist elements arranged corresponding to the cell power supply lines, respectively, and according to a write column instruction signal, for stopping supply of the cell power supply voltage to the cell power supply line on the selected column, and for coupling the cell power supply line arranged corresponding to the selected column to the down power supply line in at least the corresponding column.

A semiconductor memory device according to a fifth aspect of the invention includes a plurality of static memory cells arranged in rows and columns; a plurality of word lines, arranged corresponding to the respective memory cell rows, each connected to the memory cells in the corresponding row; a plurality of word line drivers arranged corresponding to the word lines, each for driving a corresponding word line to the selected state when a corresponding word line is addressed; a plurality of driver precharge circuits, arranged corresponding to groups each including a predetermined number of word lines among the plurality of word lines, each for supplying a voltage at a first voltage level to word line drivers in the corresponding word line group when a word line in a corresponding word line group is selected; and a plurality of level shift circuits arranged corresponding to the respective driver precharge circuits, each for shifting the voltage at the first voltage level provided from the corresponding driver precharge circuit to a lower voltage level.

In the semiconductor memory device according to the first aspect, the level shift element included in the word line driver is used to shift the level of the driver power supply voltage for transmitting the level-shifted voltage to the selected word line. Therefore, the potential of the selected word line can be low in the read operation, and the conductance of the access transistor of the memory cell is small so that the static noise margin in the read operation is improved, and the device can stably read data.

Since only the level shift element is used, and a power supply dedicated for level shifting is not required, so that the power supply construction can be simple. A level conversion circuit is not employed for converting the voltage on the selected word line, which suppresses increase in layout area of the word line drivers.

In the semiconductor memory device according to the second aspect, each word line is connected to the pull-down element, and the potential of the selected word line can be lowered below the power supply voltage of the word line driver. Therefore, the static noise margin of the memory cell can be improved similarly to the semiconductor memory device according to the first aspect.

Since only the pull-down elements are used, a dedicated power supply for changing the voltage on the select word line is not required, which simplifies the power supply construction.

Each word line is simply connected to the pull-down element, and a level changing circuit for changing the voltage level of the selected word line is not required, which suppresses increase in layout area of the word line drivers.

In the semiconductor memory device according to the third aspect, the pull-down elements connected to the respective word lines are arranged with the same gate electrode pitch as the access transistors of the memory cells. The replica gate electrodes of the pull-down transistors are aligned in the row and column directions. As compared with a construction using dummy cells, the pull-down transistor elements can be arranged more efficiently. Further, by turning on a required number of pull-down transistors, the selected word line potential can be set to an optimum level so that the static noise margin in the read operation can be improved, and data can be stably read out.

In the semiconductor memory device according to the fourth aspect, the write assist element is used for electrically coupling the cell power supply line in the selected column to the down power supply line and thereby lowering the level cell power supply line. Therefore, the driving power of the load transistors in the memory cell decreases, but the driving power of the access transistor does not change, and is the same as that in the read operation so that the write margin can be increased without impairing the read margin, and the fast writing can be achieved. The cell power supply line and the down power supply line are electrically connected, and through the movement of electric charges, a voltage level of the cell power supply line is rapidly changed. Further, the voltage level of the cell power supply line is set to an intermediate voltage level through capacitance division, and the write margin can be optimized.

In the semiconductor memory device according to a fifth aspect of the invention, the level shift circuit for pull-down is connected to the driver power supply line transmitting a voltage to the word line driver, and therefore the potential of the selected word line can be lowered via the word line driver. Accordingly, the static noise margin of the memory cells can be improved in the read operation, similarly to the semiconductor memory device according to the first aspect.

Further, the power supply voltage of the word line driver is simply configured to be pulled down, and a power supply for changing the voltage on the selected word line is not required so that the power supply construction can be simple. The level shift circuit is arranged for being shared among the plurality of word line drivers so that it is possible to reduce the number of level shifting elements and to suppress the increase in array area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
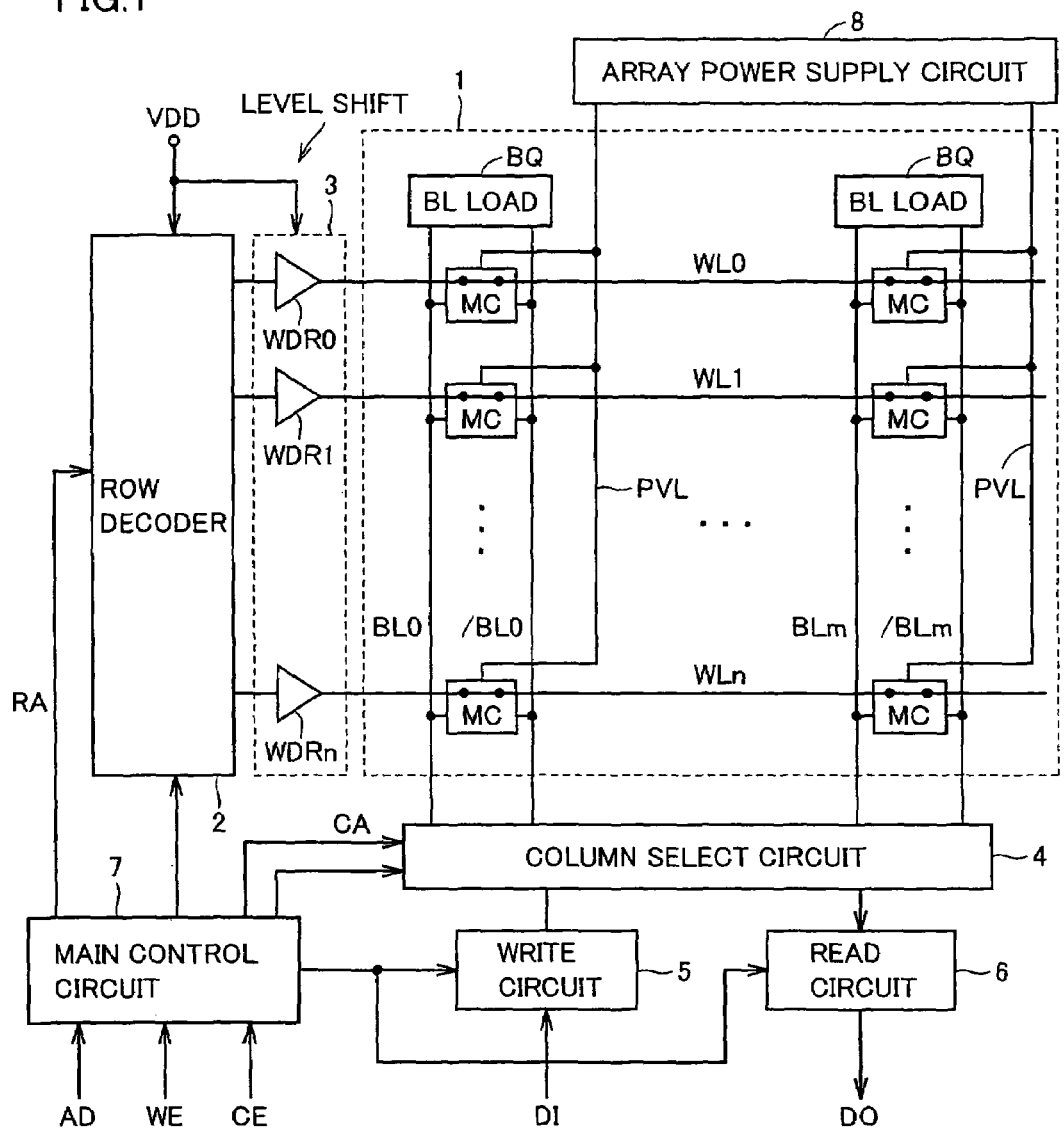
FIG. 1 schematically shows a whole construction of a semiconductor memory device according to a first embodiment of the invention.

FIG. 1 schematically shows a whole construction of a semiconductor memory device according to a first embodiment of the invention. In FIG. 1, a semiconductor memory device includes a memory cell array 1 having memory cells MC arranged in rows and columns. In memory cell array 1, memory cells MC are arranged in (n+1) rows and (m+1) columns.

Word lines WL0-WLn are arranged corresponding to the rows of memory cells MC, respectively, and memory cells MC in each row are connected to the word line in the corresponding row. Bit line pairs BL0 and /BL0-BLm and /BLm are arranged corresponding to the columns of memory cells MC, respectively. As will be described later in detail, memory cell MC is a static memory cell, and complementary data are transmitted to complementary bit line pair BLi and /BLi (i=0-m).

Bit line load (BL load) BQ is provided corresponding to each of bit line pairs BL0 and /BL0-BLm and /BLm. In a data reading operation, bit line load BQ pulls up a potential of the corresponding bit line, and supplies a column current for reading memory cell data.

For driving an addressed word line in memory cell array 1 to the selected state, there are provided a row decoder 2 for producing a row select signal according to a row address signal RA, and a word line drive circuit 3 for driving the selected word line to the selected state according to the row select signal received from row decoder 2. Row decoder 2 receives a power supply voltage VDD as an operation power supply voltage, and decodes internal row address signal RA to produce a row select signal.

Word line drive circuit 3 includes word line drivers WDR0-WDRn arranged corresponding to word lines WL0-WLn, for driving the corresponding word lines to the selected state according to the row select signal received from row decoder 2, respectively. Each of word line drivers WDR0-WDRn receives power supply voltage VDD as the operation power supply voltage, and performs level shifting (stepping down) of power supply voltage VDD to transmit the level-shifted voltage onto the corresponding word line when the corresponding word line is selected. Operations and effects of level shifting down of the word line select voltage will be described later in detail.

The semiconductor memory device further includes a column select circuit 4 that selects the bit line pair corresponding to a selected column according to an internal column address signal CA, a write circuit 5 that transmits the write data to the bit line pair corresponding to the column selected by column select circuit 4 in data writing, a read circuit 6 that produces read data by sensing and amplifying the data supplied from the bit line pair corresponding to the column selected by column select circuit 4 in data reading, and a main control circuit 7 that produces internal row address signal RA, internal column address signal CA and control signals required for various operations according to an address signal AD, a write instruction signal WE and a chip enable signal CE that are externally applied. Main control circuit 7 produces a word line activation timing signal and a column select timing signal to define operation timing and an operation sequence of row decoder 2 and column select circuit 4.

Write circuit 5 includes an input buffer and a write drive circuit, and produces internal write data according to externally applied write data DI in data writing. Read circuit 6 includes a sense amplifier circuit and an output buffer. In data reading, the output buffer further performs buffering on internal data sensed and amplified by the sense amplifier circuit, to produces external read data DO.

Write circuit 5 and read circuit 6 may write and read data of a multi-bit width, or memory cell array 1 may be configured to correspond to one bit of input/output data, and each of write and read circuits 5 and 6 performs input or output of one bit of data. For writing and reading the multiple bits of data, memory cell array 1, write circuit 5 and read circuit 6 shown in FIG. 1 are arranged corresponding to each data bit.

An array power supply circuit 8 supplies an array power supply voltage to a high-side power supply node of memory cell MC via a cell power supply line PVL. Cell power supply lines PVL shown in FIG. 1 are divided corresponding to the memory cell columns, respectively. However, such a construction may be employed that array power supply circuit 8 supplies the array power supply voltage commonly to these cell power supply lines PVL, and cell power supply lines PVL are arranged in a mesh-like form to be mutually connected in the row and column directions.

In this and subsequent embodiments, the array power supply voltage of array power supply circuit 8 is set to the same voltage level as power supply voltage VDD supplied to word line driver WDR. However, the present invention can be applied to the case where the array power supply voltage and the power supply voltage supplied to the word line drive circuit are at different voltage levels, respectively. Array power supply circuit 8 may be provided individually and separately from a circuit supplying the power supply voltage to peripheral circuits such as word line drive circuit 3.

Figure 2:
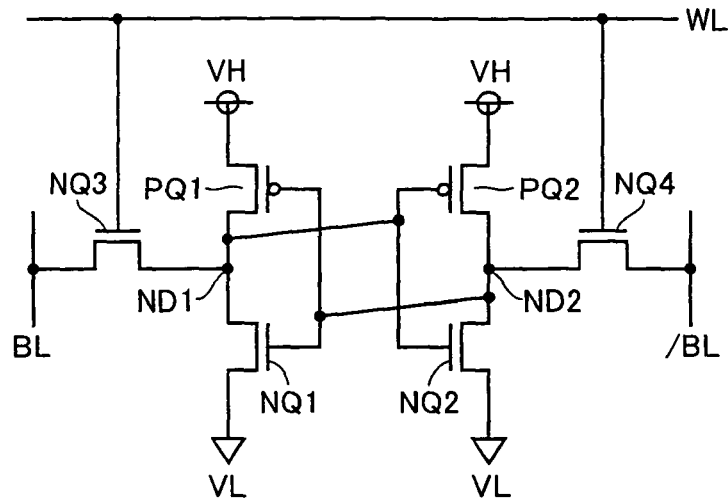
FIG. 2 shows an electrically equivalent circuit of a memory cell shown in FIG. 1.

FIG. 2 shows an example of a construction of memory cell MC shown in FIG. 1. In FIG. 2, memory cell MC has a construction of a full-CMOS single-port SRAM cell. Memory cell MC has a P-channel MOS transistor (insulated gate field effect transistor) PQ1 that is connected between a high-side power supply node VH and a storage node ND1, and has a gate connected to a storage node ND2; an N-channel MOS transistor NQ1 that is connected between storage node ND1 and a low-side power supply node VL, and has a gate connected to storage node ND2; a P-channel MOS transistor PQ2 that is connected between high-side power supply node VH and storage node ND2, and has a gate connected to storage node ND1; an N-channel MOS transistor NQ2 that is connected between storage node ND2 and low-side power supply node VL, and has a gate connected to storage node ND1; and N-channel MOS transistors NQ3 and NQ4 that couple storage nodes ND1 and ND2 to bit lines BL and /BL according to the voltage on word line WL, respectively.

Word line WL is any of word lines WL0-WLn shown in FIG. 1, and bit line pair BL and /BL is any of bit line pairs BL0 and /BL0-BLn and /BLn shown in FIG. 1.

In the construction of memory cell MC shown in FIG. 2, MOS transistors PQ1 and NQ1 form a CMOS inverter, and MOS transistors PQ2 and NQ2 form a CMOS inverter. These inverters have inputs and outputs cross-coupled, to form an inverter latch (flip-flop). Storage nodes ND1 and ND2 hold complementary data. Margins in the operations of reading and writing data depend on a data holding capability of this inverter latch.

Figure 3:
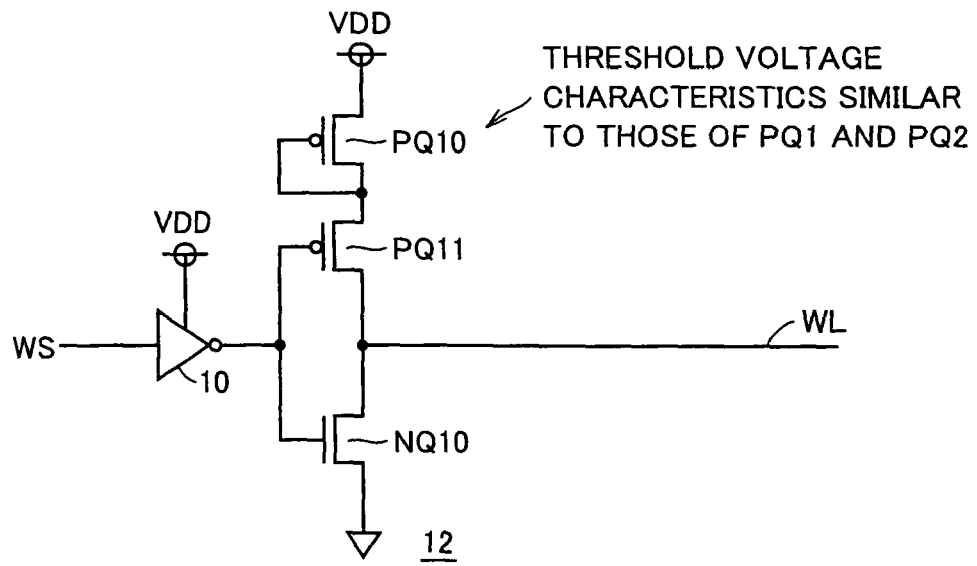
FIG. 3 schematically shows a construction of a word line driver shown in FIG. 1.

FIG. 3 shows an example of constructions of word line drivers WDR0-WDRn shown in FIG. 1. Since word line drivers WDR0-WDRn have the same construction, FIG. 3 shows word line driver WDR as a representative of these word line drivers.

In FIG. 3, word line driver WDR includes an inverter 10 receiving a word line select signal (decode signal) WS from row decoder 2, and a word line drive stage 12 driving word line WL to the selected state according to the output signal of inverter 10. Inverter 10 receives power supply voltage VDD as an operation power supply voltage, and inverts word line select signal WS.

Word line drive stage 12 includes a P-channel MOS transistor PQ10 connected at a first conduction node (i.e., a source node) to a node receiving power supply voltage VDD, a P-channel MOS transistor PQ11 connected between MOS transistor PQ10 and word line WL and receiving an output signal of inverter 10 at a gate thereof, and an N-channel MOS transistor NQ11 connected between word line WL and the reference potential node (which is at a ground potential level, and will be referred to as a "ground node" hereinafter) and receiving the output signal of inverter 10 at a gate thereof.

MOS transistor PQ10 has a gate and a drain connected together, and operates in a diode mode to lower power supply voltage VDD by an absolute value Vthp of its threshold voltage. Owing to lowering of the threshold voltage of the MOS transistor of one stage, the following operations can be performed even when power supply voltage VDD is as low as 1.2 V, for example. Word line drive stage 12 operates to lower reliably the voltage on the selected word line, and excessive lowering of the voltage on the selective word line is prevented to execute reliably the reading and writing of data while maintaining the access transistors of the memory cell conductive.

The threshold voltage of MOS transistor PQ10 has characteristics similar to those of the P-channel MOS transistors (PQ1 and PQ2) of the memory cell, and changes closely in linkage with fluctuations in threshold voltage of the load transistors (P-channel MOS transistors PQ1 and PQ2) of memory cell MC. When word line WL is selected, it is driven to the level of voltage (VDD-Vthp), and the actual voltage level thereof changes closely in linkage with fluctuations in threshold voltage of the load transistors of the memory cell.

Figure 4A:
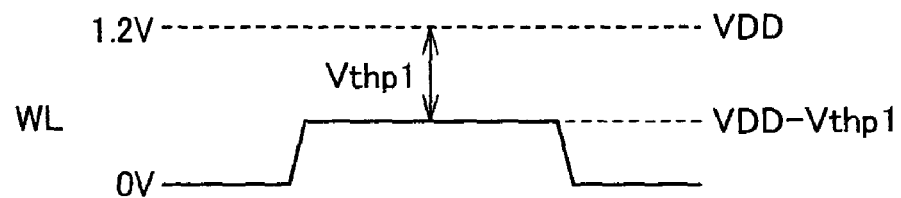
FIGS. 4A and 4B illustrate an operation of the word line driver shown in FIG. 3 and a static noise margin of the memory cell.

FIG. 4A illustrates a voltage level of selected word line WL in the case where the load transistors (P-channel MOS transistors PQ1 and PQ2) of the memory cell have a threshold voltage large in absolute value, Vthp. FIG. 4A represents a signal waveform of word line WL in the case where power supply voltage VDD is 1.2 V.

Figure 4B:
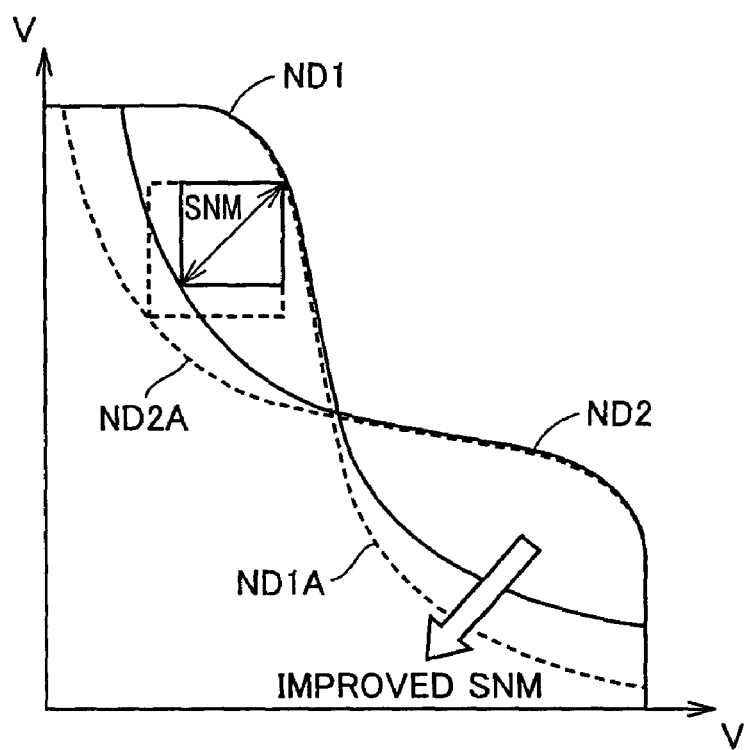

FIG. 4B represents transmission characteristics of the memory cell in the case where the load transistors of the memory cell have the threshold voltage of absolute value Vthp of a large value Vthp1. These transmission characteristics are input/output transmission characteristics of two CMOS inverters forming the memory cell. In FIG. 4B, curves ND1 and ND2 of solid lines represent transmission characteristics of storage nodes ND1 and ND2 that are exhibited when the selected word line WL is at the level of power supply voltage VDD. Static noise margin SNM is represented by a diagonal of a square of a solid line located between curves ND1 and ND2.

When absolute value Vthp1 of the threshold voltage of the load transistors (PQ1 and PQ2) in the memory cell increases, the input logical threshold of the inverter in the memory cell shifts upward, and the current driving power of the load transistor decreases. With the current driving power of the access transistors (NQ3 and NQ4) the output node of one inverter is discharged more strongly, and the held data is more likely to be destructed. Therefore, the data holding characteristics deteriorate, and the width between transmission curves ND1 and ND2 represented by solid lines, i.e., static noise margin SNM becomes small.

In this case, the absolute value of the threshold voltage of P-channel MOS transistor PQ10 arranged for level shifting in word line driver WDR increases with absolute value Vthp1 of the threshold voltage of the memory cell load transistor, and the voltage level of selected word line WL lowers (as indicated by voltage (VDD-Vthp1) in FIG. 4A. In this case, therefore, the conductance of the access transistors decreases, to suppress the rising of the L level voltage of the storage node in the memory cell. Also, as represented by curves ND2A and ND1A of broken lines in FIG. 4B, the transmission characteristic curves expand into a lower left region. Thereby, static noise margin SNM increases as represented by a diagonal of a square of a broken line, and the read margin is improved.

In the write characteristics of the data, the stability of the data holding characteristics of the memory cell is small when absolute value Vthp of the threshold voltage of the load transistor in the memory cell takes large value Vthp1, and the write characteristics are improved. In the write operation, therefore, even when the voltage level of selected word line WL is set to a voltage level lower than the voltage VDD, an influence on the write characteristics is suppressed because the write margin is large. Thus, fast writing can be achieved.

Figure 5A:
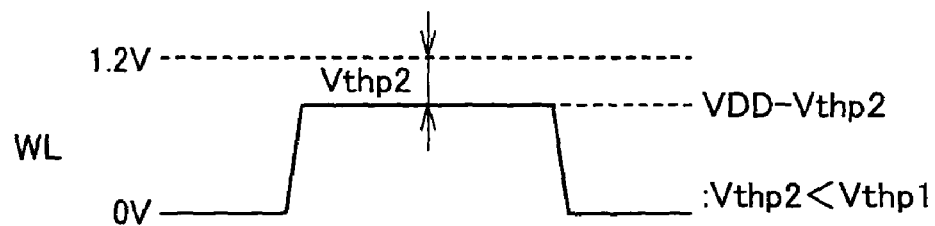
FIGS. 5A and 5B illustrate changes that occur in voltage of the selected word line and static noise margin of the memory cell when an absolute value of a threshold voltage of a memory cell transistor is made small.
Figure 5B:
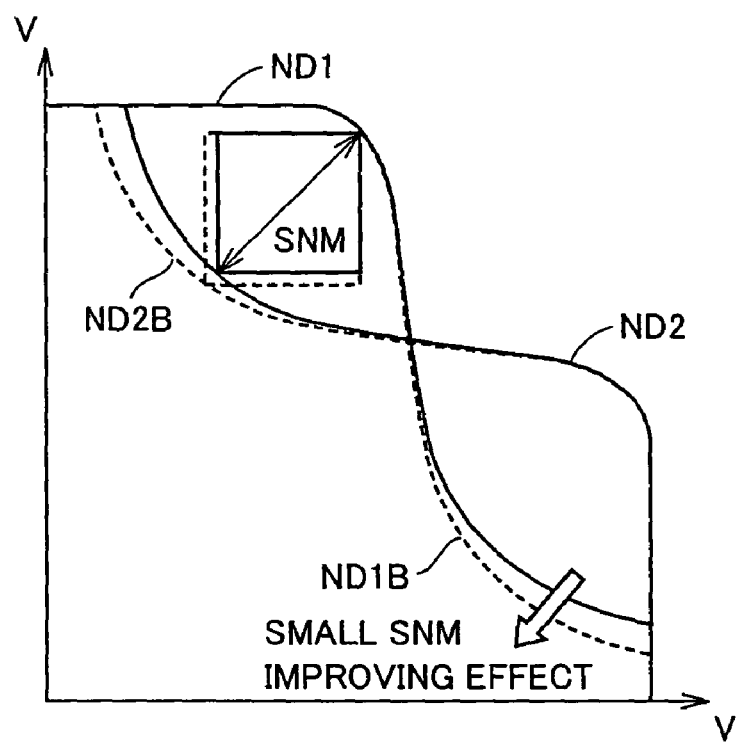

FIG. 5A shows changes that occur in potential of the selected word line when the load transistors in the memory cell has the threshold voltage of a small absolute value. FIG. 5B shows input/output transmission characteristics exhibited when the load transistor in the memory cell has the threshold voltage of a small absolute value.

In FIG. 5A, it is assumed that the load transistors in the memory cell has the threshold voltage of an absolute value Vthp2 smaller than the absolute value Vthp1 of the threshold voltage as described above. In this case, in the word line driver, the threshold voltage Vthp of diode-connected MOS transistor PQ10 for the level lowering likewise takes a value corresponding to the voltage Vthp2, and the selected word line WL attains the voltage level corresponding to voltage of (VDD-Vthp2).

As shown in FIG. 5B, when the threshold voltage of the load transistor in the memory cell is small in absolute value, and the word line WL is driven to the VDD level, static noise margin SNM is sufficiently large as represented by curves ND1 and ND2 of solid lines, and the read margin is ensured. The current supplying capability of the load transistor is improved, and charging of the storage node at the L level to the H level via the access transistor is suppressed. In the memory cell, the load transistors compensate for discharging by the drive transistors (NQ1 and NQ2) due to rise of the potential of the storage node, and the inverter latch of the memory cell stably holds the data. Therefore, the read margin is ensured as already described.

In this state, when the voltage level of selected word line WL lowers to the voltage of (VDD-Vthp2), the conductance of the access transistors slightly lowers, and the characteristics curves expands into the lower left region with respect to curves ND1 and ND2 of solid lines as represented by curves ND2B and ND1B of broken lines in FIG. 5B. Thus, static noise margin SNM is slightly improved.

Therefore, by employing the word line driver configured such that the threshold voltage of diode-connected P-channel MOS transistor PQ10 changes closely in linkage with the threshold voltage of the load transistor in the memory cell, the voltage level of the selected word line shifts to a lower side when absolute value Vthp of the threshold voltage of the load transistor in the memory cell shifts to a higher side. Conversely, when the absolute value of the threshold voltage of the load transistor in the memory cell shifts to a lower side, the voltage level of the selected word line shifts to a higher side. Therefore, when the absolute value of the threshold voltage of the load transistor in the memory cell shifts to a higher side to decrease static noise margin SNM, the voltage level of the selected word line lowers correspondingly, and the lowering width thereof increases so that the static noise margin SNM is improved. When absolute value Vthp of the threshold voltage of the load transistor in the memory cell shifts to a lower side, static noise margin SNM sufficiently increases, and improvement of the static margin more than needed is not required. In this case, the voltage level of the selected word line lowers to a small extent (voltage Vthp2), and the voltage level of selected word line WL lowers only to a level slightly lower than power supply voltage VDD.

When absolute value Vthp of the threshold voltage of the load transistors in the memory cell is low, the memory cell has large data holding characteristics, and there is tendency that data writing is difficult. In this case, however, the voltage level of the selected word line is set to a higher voltage level so that the current driving power of the access transistors is large, and the write margin is improved.

Therefore, the voltage level of the selected word line can be automatically adjusted according to the fluctuations in threshold voltage of the load transistor in the memory cell. When the read margin is small, the voltage level of the selected word line is set low to improve static noise margin SNM. When the read margin is large, the voltage level of the selected word line is adjusted not to lower excessively, and the voltage level of the selected word line can be set to increase the write margin. Thus, it is possible to achieve the static semiconductor memory device that can operate more stably by automatically correcting the voltage level of the selected word line with respect to variations in threshold voltage of the load transistors in the memory cell.

The load transistors PQ1 and PQ2 of the memory cell and the level-shifting MOS transistors of the word line driver are merely required to have the threshold voltage characteristics varied substantially in linkage, and are not required to have completely the same threshold voltage characteristics.

Figure 6:
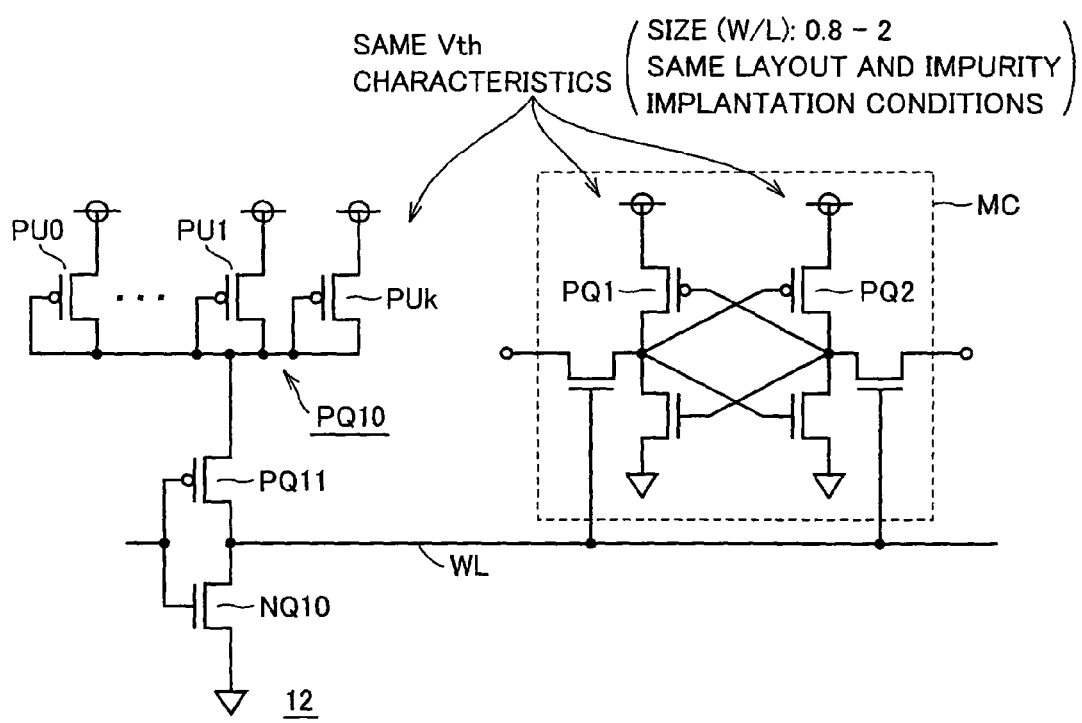
FIG. 6 shows a modification of a word line driver according to the first embodiment of the invention.

FIG. 6 shows an example of a construction of level-shifting transistor PQ10 in word line drive stage 12 included in the word line driver. In FIG. 6, level-shifting MOS transistor PQ10 includes a plurality of diode-connected unit P-channel MOS transistors PU0-PUk connected in parallel. Each of unit MOS transistors PU0-PUk has the same or substantially the same threshold voltage (Vth) characteristics as load transistors PQ1 and PQ2 included in memory cell MC. Specifically, a size (a ratio W/L of a channel width W to a channel length L) of each of unit transistors PU0-PUk is nearly 0.5 to 5 times larger than that of load transistors PQ1 and PQ2. Preferably, the above size is set to 0.8 to 2 times larger than that of load transistor PQ1 or PQ2. Ideally, the unit transistor has the same size as load transistors PQ1 and PQ2 (the gate width is the same where these the gate length is the same). When the size differs by one order of magnitude, it can be considered that a deviation occurs in linkage relationship of the electric characteristics between the load transistor and the level-shifting unit transistor (i.e., in linkage relationship of fluctuations in threshold voltage), and the influence of fluctuations in threshold voltage of the load transistor cannot be accurately reflected in the voltage on the selected word line. However, when the size differs by 0.5 to 5 times between the transistors, the correspondence or linkage relationship can be substantially ensured between the electric characteristics of the MOS transistors, and the fluctuations in threshold voltage of the load transistor in memory cell MC can be accurately reflected in the unit P-channel MOS transistor. Accordingly, the fluctuations in threshold voltage of the memory cell load transistor can be reflected in the threshold voltage of level-shift MOS transistor PQ10.

The size ratio of the unit transistor to the load transistor is preferably in a range from 0.8 to 2 for the following reason. In manufacturing steps, variations by about up to 10% is allowed with variations in manufacturing parameter, mask alignment and others taken into account. Therefore, the size ratio (the gate width when the gate length is the same) may be 0.9 so that the lower limit is set to 0.8, allowing for a margin of 10%. As compared with the case where the gate width is large, there is a tendency that large fluctuations occur in threshold voltage when the gate width is small. It can be considered that the linkage relationship with respect to the fluctuations in threshold voltage of the load transistors becomes small when the ratio of the gate width (size) of the load transistor exceeds two, although the linkage relationship is specifically affected by the specific gate width. Therefore, the size not exceeding two times is preferable.

Since the drive current quantity of word line drive stage 12 is set depending on the driving speed of the word line, the number of the unit P-channel MOS transistors forming level shift element PQ10 is appropriately determined depending on the quantity of the required word line drive current.

Unit transistors PU0-PUk are made the same in pattern layout and impurity implantation conditions as load transistors PQ1 and PQ2. This can further improve the linkage relationship between the threshold voltage characteristics of level-shift MOS transistor PQ10 and the threshold voltage characteristics of load transistors PQ1 and PQ2, and the voltage level of the selected word line attained by the level-shifting MOS transistor PQ10 can be accurately adjusted according to the fluctuations in threshold voltage of load transistors PQ1 and PQ2 so that the voltage level of the selected word line can be accurately corrected according to the fluctuations in threshold voltage of the load transistors. Thus, the operation margin can be improved over a wide range with respect to the variations in power supply voltage, temperature conditions and process.

When the plurality of unit P-channel MOS transistors PU0-PUk are used as level-shifting transistor PQ10, there is a possibility that each element is randomly subject to variations such as fluctuations of the impurity concentration or variations in edge form of the layout or others. However, by connecting a plurality of transistors in parallel to form the level-shifting transistor, the random variations can be averaged to cancel the random variations. By utilizing the transistors of substantially the same size as load transistors PQ1 and PQ2 of the memory cells (preferably, transistors of the size between the equal size (0.8 time) and about doubled size (or of the size in a range from 0.5 to 5 times) and achieving the same electric characteristics), it is possible to average the characteristic variations of unit P-channel MOS transistors PU0-PUk even when transistors of small sizes are used, and the voltage level of selected word line WL can be accurately corrected according to the variations in threshold voltage of load transistors PQ1 and PQ2 of memory cell MC.

According to the first embodiment of the invention, as described above, the level-shifting element is used to lower the voltage level of the selected word line, and the read characteristics and write characteristics can be stably maintained against the threshold voltage variations of the load transistors of the memory cells. In particular, by using the transistor having the same threshold voltage characteristics as the load transistors of the memory cell, the voltage level of the selected word line can be automatically corrected while accurately reflecting the variations in the load transistor of the memory cell.

The level-shifting element is simply used to shift the level of the driver power supply voltage and to transmit the level-shifted voltage to the selected word line, and the power supply related circuitry is the same as the conventional power circuitry so that complication of the construction of the power supply circuits can be prevented.

In the construction shown in FIG. 3, each word line driver WDR is provided with diode-connected P-channel MOS transistor PQ10 for level shifting. However, P-channel MOS transistor PQ10 for level shifting may shared among word line drivers WDR0-WDRn.

Second Embodiment

Figure 7:
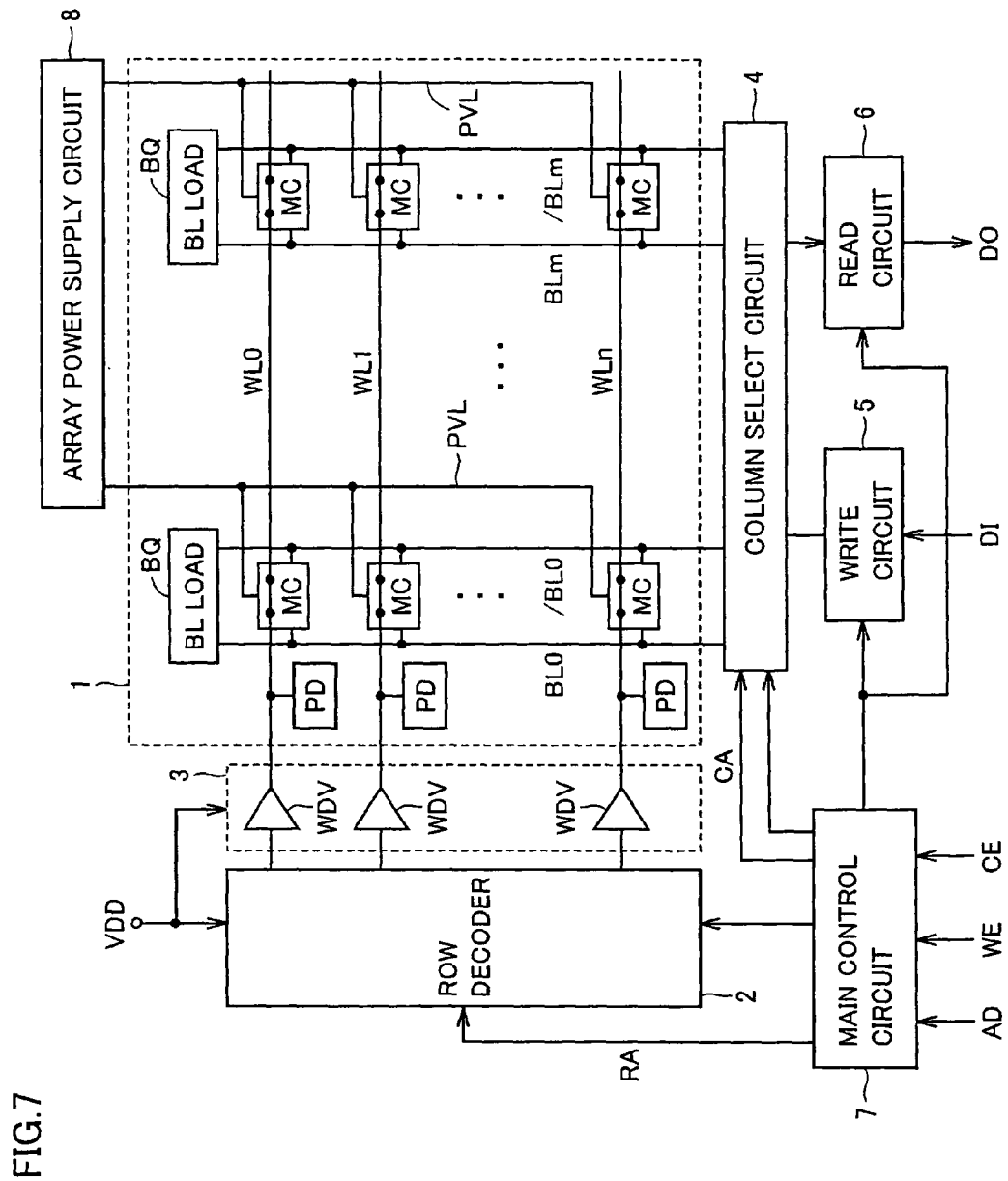
FIG. 7 schematically shows a whole construction of a semiconductor memory device according to a second embodiment of the invention.

FIG. 7 schematically shows a whole construction of a semiconductor memory device according to a second embodiment of the invention. The semiconductor memory device shown in FIG. 7 differs in the following constructions from the semiconductor memory device shown in FIG. 1.

Word line drive circuit 3 includes word line drivers WDV provided corresponding to word lines WL0-WLn, respectively. Word line driver WDV does not have a level shifting function. Word line drivers WDV receive power supply voltage VDD as the operation power supply voltage, and drive a selected word line among word lines WL0-WLn to the level of power supply voltage VDD according to the word line select signal applied from row decoder 2.

Pull-down elements PD are arranged for word lines WL0-WLn, respectively. Pull-down element PD forms a resistance-dividing circuit together with a charging P-channel MOS transistor (PQ15) included in word line driver WDV and will be described later with reference to FIG. 8, and performs the resistance division to set the voltage level of the selected word line to a voltage level intermediate between the levels of power supply voltage VDD and the ground voltage.

Other constructions of the semiconductor memory device shown in FIG. 7 are the same as those of the semiconductor memory device shown in FIG. 1. Corresponding portions are allotted with the same reference numerals, and description thereof is not repeated.

In this second embodiment of the invention, the voltage level of the selected word line is at the divided voltage level through resistance-division of power supply voltage VDD, and is lower than power supply voltage VDD so that the read and write margins can be maintained regardless of fluctuations in threshold voltage of the transistor of the memory cells, similarly to the first embodiment.

Figure 8:
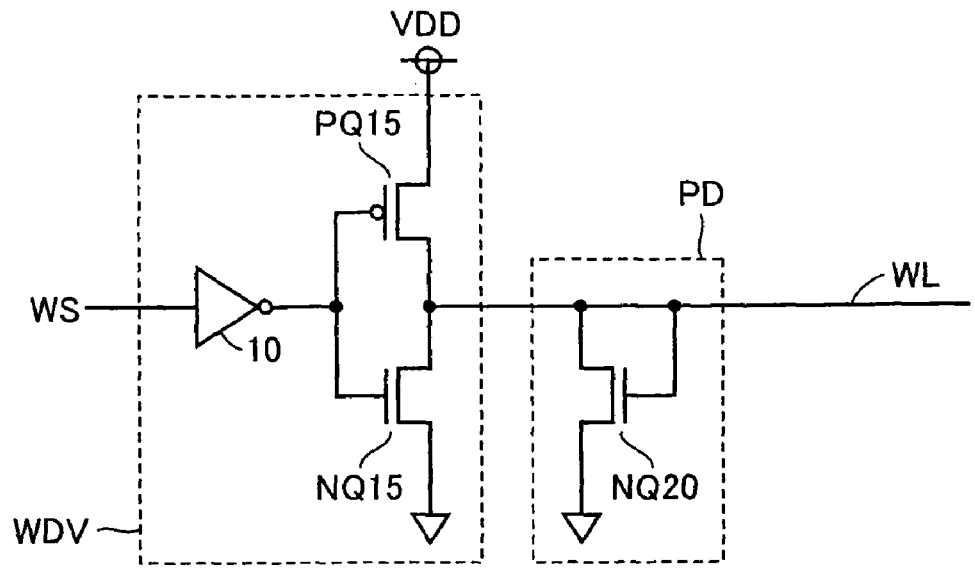
FIG. 8 shows, by way of example, constructions of a word line driver and a pull-down element shown in FIG. 7.

FIG. 8 shows an example of constructions of word line driver WDV and pull-down element PD shown in FIG. 7. In FIG. 8, word line driver WDV includes inverter 10 receiving word line select signal WS from row decoder 2, and P- and N-channel MOS transistors PQ15 and NQ15 forming a CMOS inverter that inverts the output signal of inverter 10 and drives word line WL.

When word line WL is selected, word line select signal WS is at the H level, and thereby the output signal of inverter 10 is at the L level so that P-channel MOS transistor PQ15 is turned on to transmit power supply voltage VDD from the power supply node to word line WL.

Pull-down element PD includes an N-channel MOS transistor NQ20 operating in a resistance mode. MOS transistor NQ20 has a gate and a drain connected to word line WL, and has a source coupled, e.g., to a ground node.

Therefore, when word line WL is selected, the on-resistance of MOS transistor PQ15 and the on-resistance of MOS transistor NQ20 form a resistance-dividing circuit, and word line WL is set to the voltage level corresponding to the division ratio thereof.

Pull-down transistor NQ20 is arranged in the memory cell array, and has threshold voltage characteristics similar to those of drive transistors NQ1 and NQ2 in a memory cell. When the threshold voltages of memory cell drive transistors NQ1 and NQ2 lower, the threshold voltage of pull-down transistor NQ20 likewise lowers to increase its driving current quantity, and the on-resistance equivalently lowers. In this case, the voltage level of the selected word line lowers correspondingly.

Figure 9:
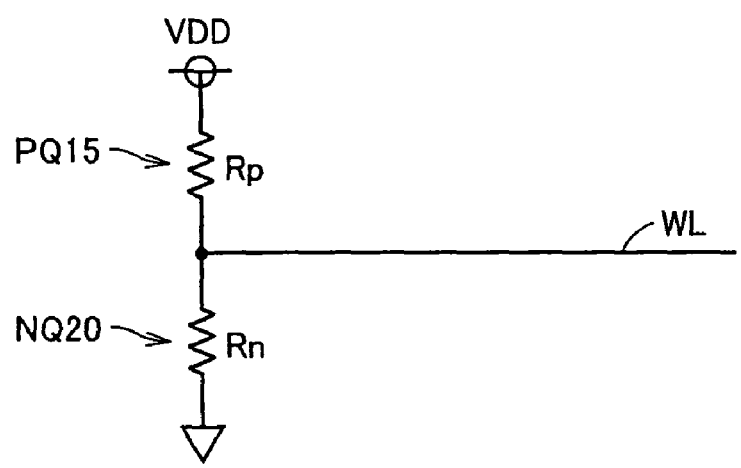
FIG. 9 shows an electrically equivalent circuit at the time of word line selection in the second embodiment of the invention.

FIG. 9 shows electrically equivalent circuits of word line driver WDV and pull-down element PD when word line WL is selected. When word line WL is selected, an on-resistance Rp provided by MOS transistor PQ15 is connected between the power supply node and word line WL, and an on-resistance Rn provided by MOS transistor NQ20 is connected between word line WL and the ground node. Therefore, the voltage level of word line WL is represented by VDD·Rn/(Rp+Pn).

Figure 10A:
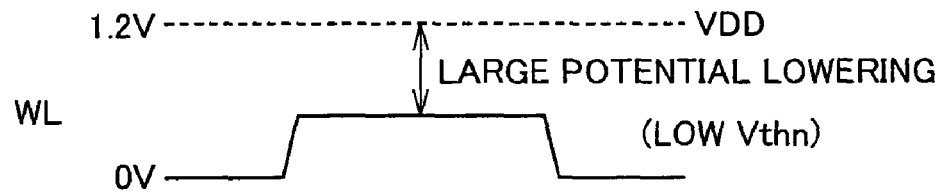
FIGS. 10A and 10B schematically illustrate changes that occur in voltage level of the selected word line and static noise margin when the absolute value of threshold voltage of the memory cell transistor is large in the second embodiment of the invention.
Figure 10B:
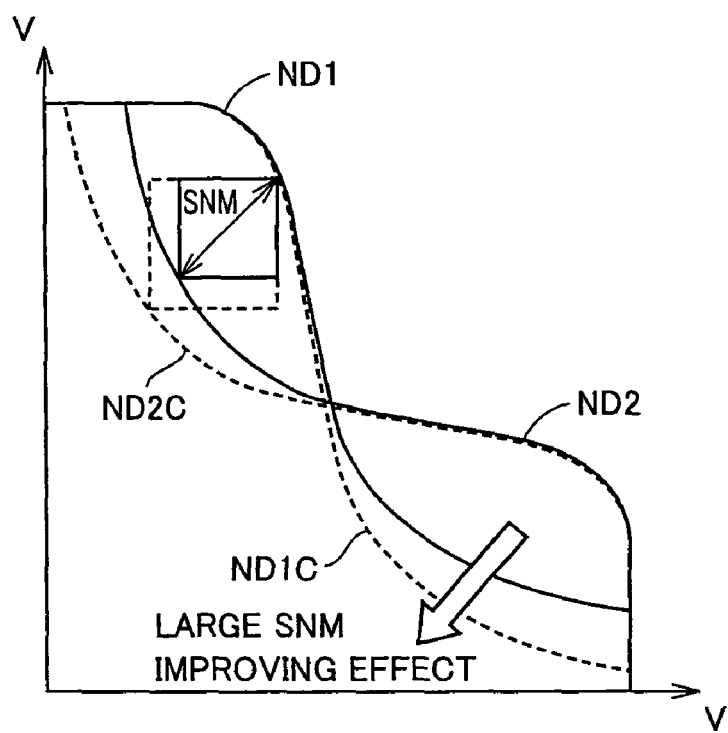

FIG. 10A shows voltage changes of the selected word line that occur when threshold voltages Vthn of drive transistors (NQ1 and NQ2) of the memory cell are low. FIG. 10B represents input/output transmission characteristics exhibited when the threshold voltages of memory cell drive transistors NQ1 and NQ2 are low. When threshold voltages Vthn of memory cell drive transistors NQ1 and NQ2 are low, the threshold voltage of N-channel MOS transistor NQ20 of pull-down element PD likewise lowers to increase its current driving power, and the conductance equivalently increases. Thus, on-resistance Rn lowers. Therefore, a voltage VWL of the selected word line is expressed by the following equation:

$$VWL=VDD/(1+(Rp/Rn)).$$

Therefore, when on-resistance Rn of MOS transistor NQ20 becomes small, the voltage dividing ratio becomes small, and the voltage level of selected word line voltage VWL lowers (the voltage drop quantity increases), assuming that on-resistance Rn of MOS transistor PQ15 is constant (i.e., assuming that fluctuation in threshold voltage of the transistor of the word line driver is less closely in linkage with that of memory cell transistors, and is much smaller than those of the memory cell transistors).

When the threshold voltages of drive transistors NQ1 and NQ2 of the memory cell are low, the potential of the storage node on the H side in the memory cell can be readily discharged so that a width between the voltage transmission characteristics of nodes ND1 and ND2 becomes narrow as represented by curves ND1 and ND2 of solid lines in FIG. 10B, and static noise margin SNM becomes small. In this case, the voltage level of word line WL is significantly lowered to decrease the conductance of the access transistors. This increases the resistance between the bit lines and storage nodes ND1 and ND2 in the memory cell, and rising of the potentials of storage nodes ND1 and ND2 is suppressed (i.e., pull-up of the storage node by the access transistor becomes weak at the time of word line selection).

Accordingly, the discharge starts quickly in response to a small change in voltage level of the storage node as represented by curves ND2C and ND1C, and the voltage transmission characteristic curves expand to the lower left region of curves ND1 and ND2 so that the width of the input/output transmission characteristics becomes wide, and static noise margin SNM increases. Accordingly, even when the threshold voltage of the drive transistor in the memory cell lowers greatly, the word line potential lowers greatly correspondingly, and the conductance of the access transistor is made small, so that the data reading can be stably performed with a large read margin.

Figure 11A:
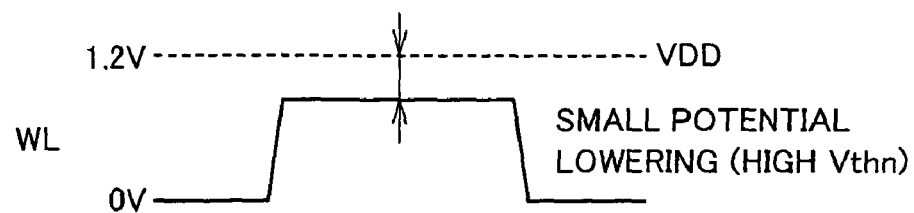
FIGS. 11A and 11B schematically show the selected word line voltage and improvement of the static noise margin that are achieved when the absolute value of threshold voltage of the memory cell transistor is large in the second embodiment of the invention.
Figure 11B:
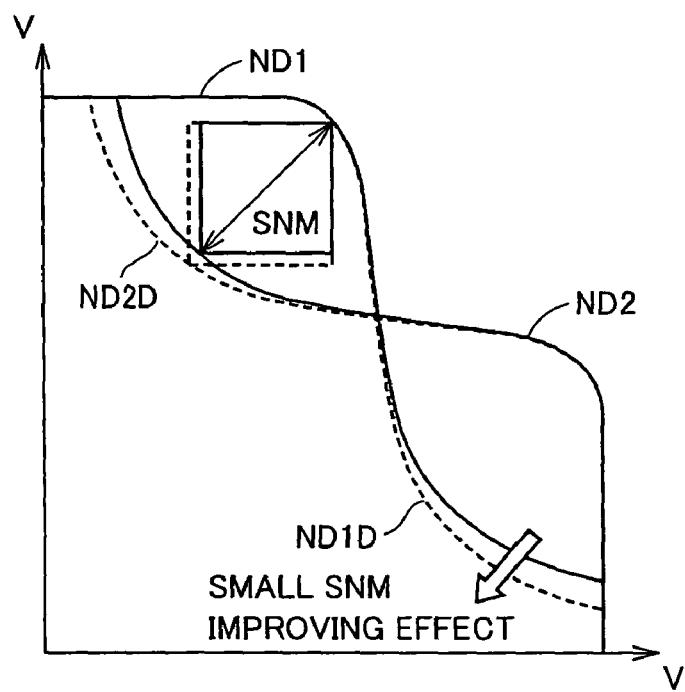

FIG. 11A represents voltage changes of selected word line WL that occur when threshold voltages Vthn of drive transistors NQ1 and NQ2 of the memory cell are high. FIG. 11B represents the input/output transmission characteristics exhibited when the threshold voltages of the drive transistors of the memory cell are low.

When threshold voltages Vthn of drive transistors NQ1 and NQ2 of the memory cell are large, the current driving capabilities are small, and the on-resistances thereof are large. Therefore, the on-resistance of N-channel MOS transistor NQ20 of pull-down element PD becomes large according to the foregoing equation, and selected word line WL attains a high voltage level that is lowered a little from the power supply voltage.

As shown in FIG. 11B, when threshold voltages Vthn of drive transistors NQ1 and NQ2 of the memory cell are high, the held potential level (i.e., H level) does not change even when the L level potential of the storage node among the internal nodes rises up, and accordingly, static noise margin SNM is kept large. When the voltage level of selected word line WL is lower than power supply voltage VDD, the conductance of the access transistor is made smaller corresponding to the voltage drop amount, and the static noise margin is slightly improved. When threshold voltage Vthn of the drive transistor in the memory cell shifts to a higher side, static noise margin SNM becomes sufficiently large, and excessive improvement is not necessary. In this case, the voltage on the selected word line lowers to only a small extent, and the voltage level of the selected word line lowers only a little from power supply voltage VDD.

In the case where threshold voltage Vthn of the drive transistor in the memory cell is low, the write margin is inherently large so that no problem arises even when the select voltage of the word line is set to a lower voltage level. When threshold voltage Vthn of the drive transistors in the memory cell shifts to a higher side, the voltage level of the selected word line shifts to a high side, and thus shifts to improve the write margin.

Figure 12:
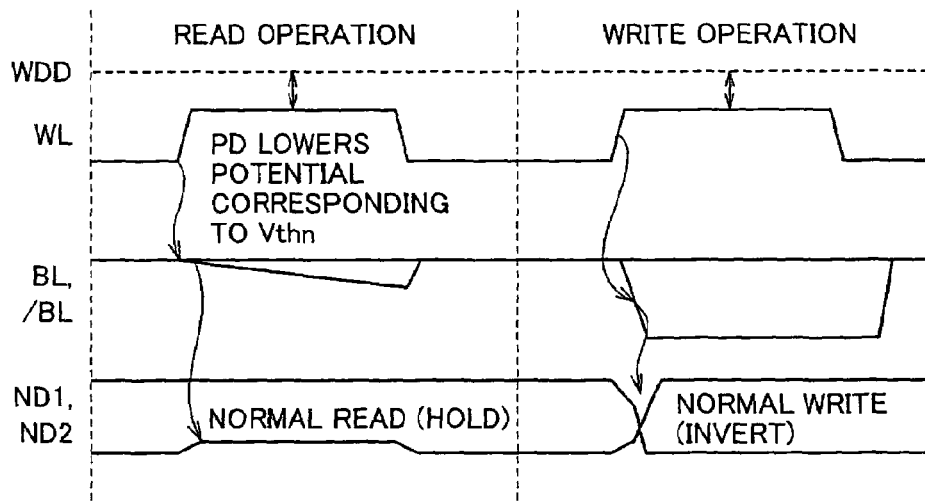
FIG. 12 is a signal waveform diagram representing voltage changes on main nodes of the semiconductor memory device of the second embodiment of the invention.

FIG. 12 represents the voltage changes of the bit line and storage node during data writing and reading in the second embodiment of the present invention.

In the data reading, when word line WL is to be driven to the selected state, pull-down element PD sets the selected word line voltage level below power supply voltage VDD. According to the driving of word line WL to the selected state, bit lines BL and /BL are coupled to storage nodes ND1 and ND2 of the selected memory cell, respectively, and the voltage levels thereof change according to the storage data of the selected memory cell. The voltage of storage node ND1 or ND2 holding the L level data in the memory cell rises due to a column current flowing through the bit line. In this case, however, pull-down element PD sets the voltage level of selected word line WL according to the threshold voltage of the drive transistors (NQ1 and NQ2), and the conductance of the access transistor is adjusted to ensure sufficiently the static noise margin SNM of the memory cell, so that the data can be read stably, and the data destruction does not occur.

In the data write operation, pull-down element PD likewise lowers the voltage level of word line WL. In this case, one of bit lines BL and /BL is driven to the L level according to the write data. The voltage level of the selected word line is set according to threshold voltage Vthn of the drive transistor in the memory cell so that the write margin is sufficiently ensured, and accurate and fast writing of data can be performed.

The operation waveforms represented in FIG. 12 can be applied to the first embodiment. In this case, in place of the voltage drop of the word line voltage by pull-down element PD, the level shift transistor (PQ10) of the word line driver performs the level adjustment of the word line voltage according to the threshold voltage of the load transistor.

As described above, the pull-down element can adjust the voltage level of the selected word line according to the fluctuations in threshold voltage of the drive transistor in the memory cell. Specifically, when the read margin is small (when the threshold voltage of the drive transistor in the memory cell is low), the voltage level of the selected word line is kept low to improve static noise margin SNM. Conversely, when the read margin is large (when the threshold voltage of the drive transistor in the memory cell is high), excessive lowering of the voltage level of the selected word line is prevented, and thereby fast writing is achieved. Thereby, the voltage level of the selected word line is automatically corrected against the variations in threshold voltage of the drive transistor in the memory cell, and correspondingly the write and read margins of the memory cell are corrected so that further stable operations of writing and reading data can be performed fast. This word line voltage adjusting operation can also be performed for the write margin such that correction is effected on the variations in threshold voltage of the memory cell drive transistor (i.e., variations in write margin) due to process fluctuations.

[First Modification]

Figure 13:
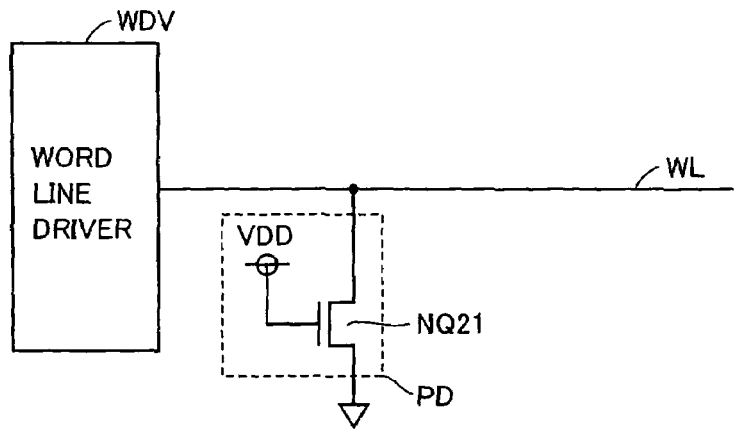
FIG. 13 shows a construction of a level shift element of a modification of the second embodiment of the invention.

FIG. 13 shows a modification of the pull-down element according to the second embodiment of the invention. In the construction shown in FIG. 13, pull-down element PD is formed of an N-channel MOS transistor NQ21 receiving power supply voltage VDD on its gate. MOS transistor NQ21 has a drain connected to word line WL and a source coupled to the ground node. Word line WL is driven by word line driver WDV, of which construction is substantially the same as that shown in FIG. 8.

In pull-down element PD shown in FIG. 13, MOS transistor NQ21 receives power supply voltage VDD on its gate, and is normally kept on to pull down the potential of word line WL by its channel resistance. Therefore, in the operation of driving the word line to the selected state, MOS transistor NQ21 is turned on before the potential of word line WL rises to or above threshold voltage Vthn of pull-down transistor NQ21, and the pull-down operation can start to function at an early time point.

The on-resistance of this MOS transistor NQ21 changes closely with the threshold voltage of the drive transistor in the memory cell, and increases (i.e., the current drive power decreases) as the threshold voltage of the memory cell drive transistor increases. Therefore, by using the construction shown in FIG. 13, the voltage level of selected word line WL can be adjusted according to the fluctuations in threshold voltage of memory cell drive transistors (NQ1 and NQ2), similarly to the foregoing construction shown in FIG. 8.

[Second Modification]

Figure 14:
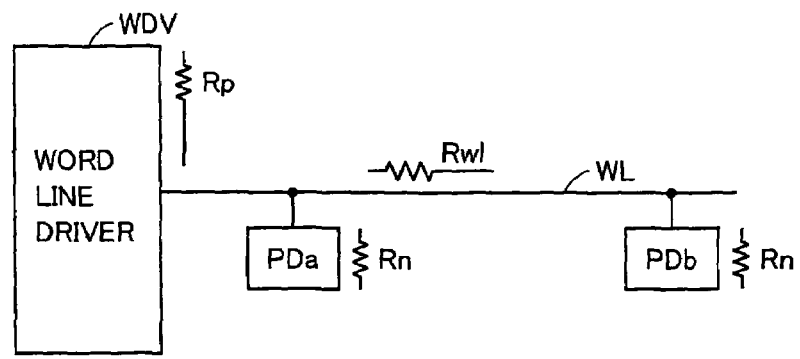
FIG. 14 shows an effect of a position of the pull-down element in the second embodiment of the invention.

FIG. 14 schematically shows a construction of a second modification of the semiconductor memory device according to the second embodiment of the invention. FIG. 14 shows a pull-down element PDa arranged near word line driver WDV as well as a pull-down element PDb arranged at an end remote from word line driver WDV. One of pull-down elements PDa and PDb is used.

When pull-down element PDa is arranged near word line driver WDV, the voltage level of word line WL is set to the voltage level of (VDD·Rn/(Rp+Rn)) without an influence of a line resistance Rwl of the word line. Therefore, the potential of word line WL can be set according to the value of on-resistance Rn of pull-down element PDa.

When pull-down element PDb having an on-resistance Rn is used, a voltage VWL1 on an end of word line WL near word line driver WDV is expressed by the following equation:

$$VWL1 = VDD \cdot (Rwl + Rn)/(Rp + Rwl + Rn).$$

A voltage VWL2 on the remote end of word line WL farther away from the word line driver is expressed by the following equation:

$$VWL2 = VDD \cdot Rn/(Rp + Rwl + Rn).$$

Therefore, word line resistance Rwl affects the potential of word line WL, and makes it difficult to adjust accurately the select voltage level of word line WL according to on-resistance Rn of pull-down element PDb. Therefore, it becomes difficult to adjust the voltage level of word line WL according to the threshold voltage fluctuations of the drive transistor in the memory cell. For correcting the select voltage level of word line WL according to the fluctuations in threshold voltage of the drive transistor in the memory cell, therefore, it is preferable to arrange pull-down element PD as near to word line driver WDV as possible, i.e., between the word line driver and the nearest memory cell, similarly to pull-down element PDa shown in FIG. 14.

When word line resistance Rwl is small and affects the resistance division ratio of pull-down element PD only to a small extent, pull-down element PDb at the remote end of the word line may be used. Both pull-down elements PDa and PDb may be used.

Pull-down element PDa may have either a construction of MOS transistor NQ20 shown in FIG. 8 or MOS transistor NQ21 normally receiving power supply voltage VDD on its gate as shown in FIG. 13.

[Third Modification]

Figure 15:
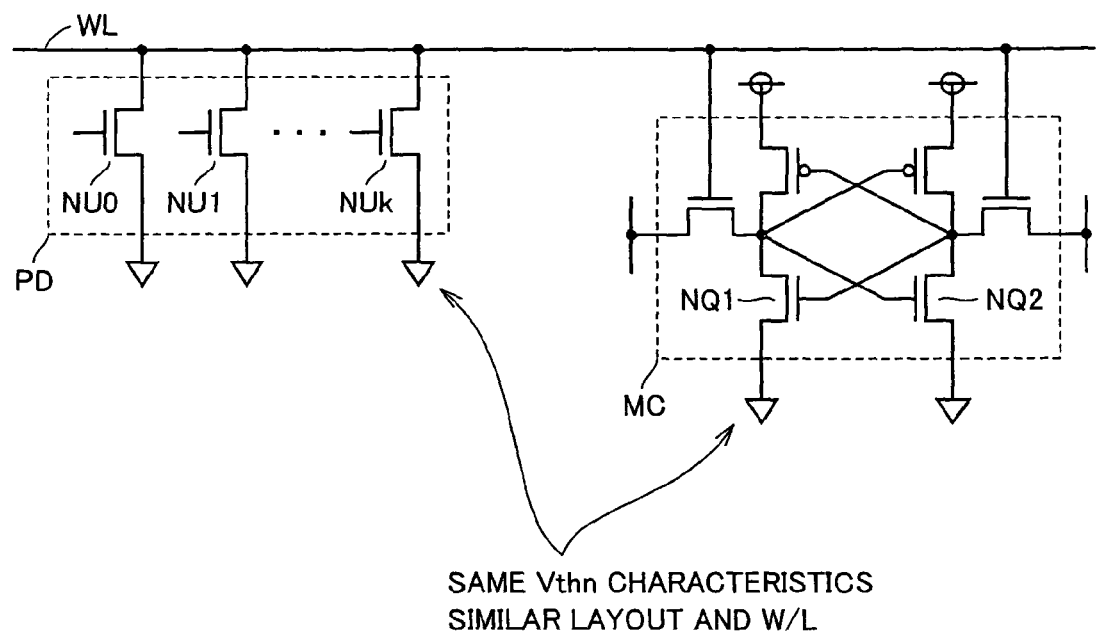
FIG. 15 schematically shows a modification of the pull-down element in the second embodiment of the invention.

FIG. 15 shows a construction of a third modification of the second embodiment of the invention. FIG. 15 shows pull-down element PD and memory cell MC. Pull-down element PD includes a plurality of unit N-channel MOS transistors NU0-NUk connected in parallel. Gates of these N-channel MOS transistors NU0-NUk are connected to word line WL, or commonly receives power supply voltage VDD. Unit N-channel MOS transistors NU0-NUk have the same threshold voltage conditions as drive transistors NQ1 and NQ2 in memory cell MC. Thus, the impurity implantation conditions, layouts or sizes (ratio, W/L of channel width W to channel length L) of the channel regions of unit N-channel MOS transistors NU0-NUk are set as similar to those of drive transistors NQ1 and NQ2 in the memory cell as possible. Therefore, these drive transistors NQ1 and NQ2 as well as unit N-channel MOS transistors NU0-NUk are formed in the same manufacturing steps. This enhances the linkage relationship with variations in characteristic of drive transistors NQ1 and NQ2 in memory cell MC, so that the select voltage level of word line WL can be corrected according to the variations in threshold voltage of memory cell drive transistors NQ 1 and NQ2, and the operation margin can be improved over a wide range against variations in power supply voltage, operation temperature conditions and process.

A resistance division ratio of the on-resistance (Rp) of the P-channel MOS transistor for charging in word line driver WDV and the resistance value (resistance value Rn) of pull-down element PD is usually determined such that the select voltage level of word line WL may lower about 100 mV-200 mV.

Since the plurality of unit N-channel MOS transistors NU0-NUk are used as pull-down element PD, there is a possibility that each element is affected by random variations such as fluctuation of the impurity concentration of each element or variations in edge form in the layout or others. However, by connecting the plurality of transistors in parallel to form pull-down element PD, these random variations can be averaged to cancel the random variations. The transistors of substantially the same size (transistors having the size between the equal size and about doubled size, and achieving the same electric characteristics) are used as drive transistors NQ1 and NQ2 in memory cell MC are utilized as the unit transistors. Thereby, even in the construction using the transistors of the small size, the select voltage level of word line WL can be accurately corrected according to the variations in threshold voltage of drive transistors NQ1 and NQ2 in memory cell MC by averaging the characteristic variations of unit N-channel MOS transistors NU0-NUk.

The number of unit N-channel MOS transistors NU0-NUk is optimized to achieve the optimum resistance division ratio according to the resistance value of on-resistance Rp of the P-channel MOS transistor for charging (i.e., charging P-channel MOS transistor) in word line driver WDV.

In pull-down element PD having the plurality of N-channel MOS transistors connected in parallel, it may be considered that the on-resistance is smaller than the combined resistance provided by the parallel connection. However, the voltage level of word line WL is set by the current driving power of the charging transistor included in word line driver WDV and the combined current driving power of unit N-channel MOS transistors NU0-NUk included in pull-down element PD. Therefore, the select voltage level of word line WL can be adjusted by adjusting the number of unit N-channel MOS transistors NU0-NUk included in pull-down element PD, and correspondingly the select voltage level can be adjusted or corrected according to the fluctuations in threshold voltage of drive transistors NQ1 and NQ2 in memory cell MC.

[Fourth Modification]

Figure 16:
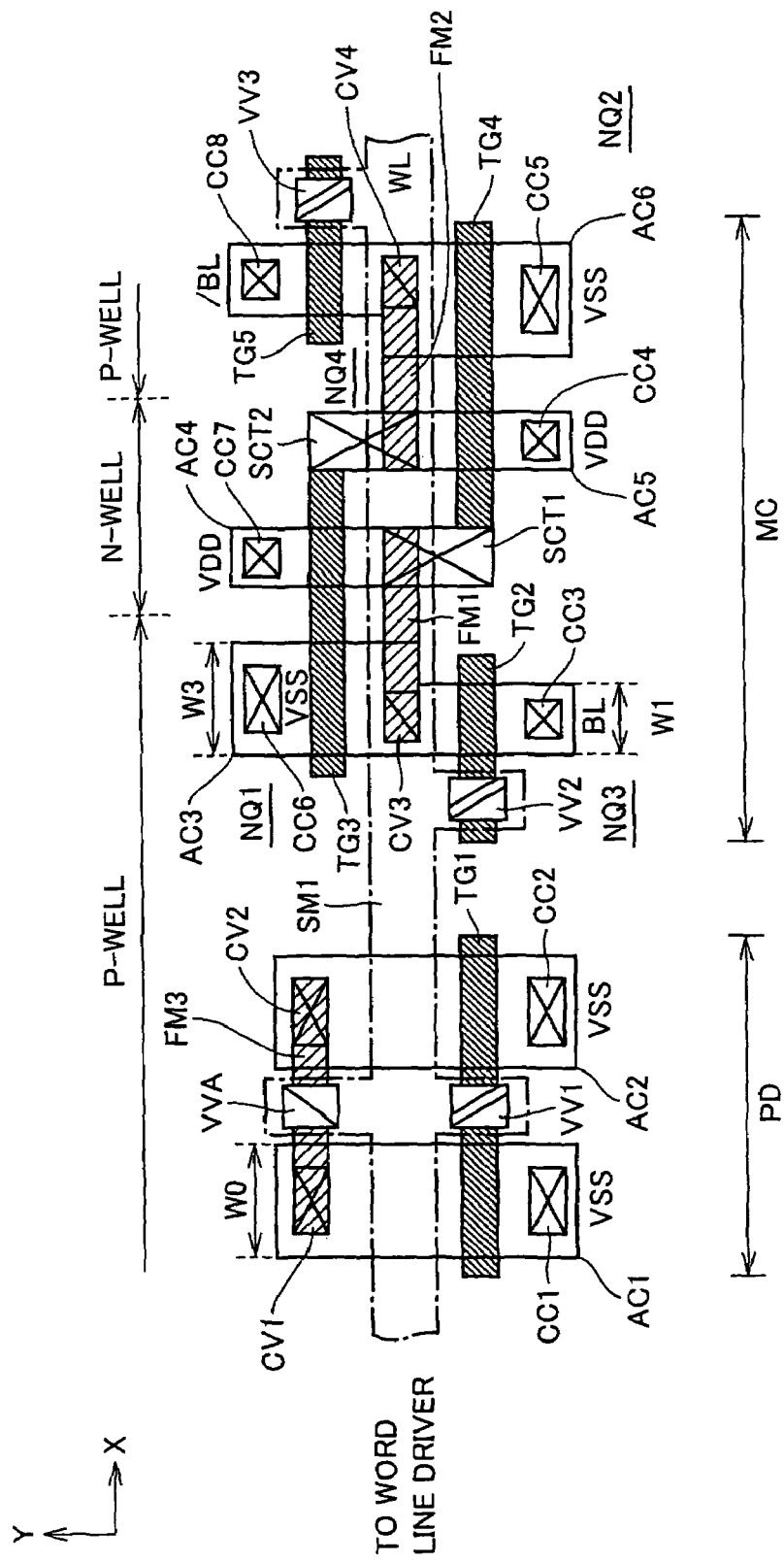
FIG. 16 schematically shows a planar layout of the pull-down element and the memory cell in the second embodiment of the invention.

FIG. 16 shows a construction of a fourth modification of the second embodiment of the invention. FIG. 16 shows a planar layout of pull-down element PD and memory cell MC. In FIG. 16, memory cell MC includes active regions AC4 and AC5 formed at an N-well region as well as active regions AC3 and AC6 that are formed at P-well regions on the opposite side of the N-well region, respectively. Load transistors (PQ1 and PQ2) are formed at active regions AC4 and AC5, respectively. Drive and access transistors NQ1 and NQ3 (or NQ2 and NQ4) are formed at respective active regions AC3 and AC6.

Active region AC3 has a narrow region of a length W2 in an X direction and a wide region of a length W3 in the X direction longer than length W2. A polycrystalline silicon interconnection line TG2 extends in the X direction across the narrow region of active region AC3. A polycrystalline silicon interconnection line TG3 extends in the X direction across the wide region. A contact CC3 for electrical connection to bit line BL is formed at an end in the X direction of the narrow region of active region AC3, and a contact CC6 for receiving a ground voltage VSS is arranged at an end in the X direction of the wide region. A contact CV3 electrically connected to a first metal interconnection line FM1 is formed at active region AC3, and is located between polycrystalline silicon interconnection line lines TG2 and TG3. First metal interconnection line FM1 extends in the X direction to active region AC4.

A contact CC7 for receiving power supply voltage VDD is formed at an end in the X direction of active region AC4, and a shared contact SCT1 is formed at the other end. Shared contact SCT1 has one end coupled to active region AC4, and the other end thereof is connected to a polycrystalline silicon interconnection line TG4 extending in the X direction across active regions AC5 and AC6. Therefore, shared contact SCT1 has both the functions as a contact and an intermediate connection interconnection line. Shared contact SCT1 is also connected electrically to metal interconnection line FM1 in an upper layer. Metal interconnection line FM1 connects impurity regions (drains) of the load transistors, drive transistor (NQ1) and access transistor (NQ3) to the storage node.

A shared contact SCT2 is formed at one end in the X direction of active region AC5, and is connected to polycrystalline silicon interconnection line TG3. Shared contact SCT2 is also connected electrically to active region AC5, and is connected to a metal interconnection line FM2 extending in the X direction. A contact CC4 for receiving power supply voltage VDD is formed at the other end of active region AC5. A polycrystalline silicon interconnection line TG4 extending in the X direction across active region AC5 forms the gate of the load transistor.

A contact CC5 coupled to the ground voltage is formed at an end in the X direction of the wide region in active region AC6, and polycrystalline silicon interconnection line TG4 extends in the X direction across active region AC6. This polycrystalline silicon interconnection line TG4 forms a gate of drive transistor NQ2. The other end of the wide region thereof is connected to metal interconnection line FM2 via a contact CV4.

A polycrystalline silicon interconnection line TG5 extends in the X direction across the narrow region of active region AC6, and a contact CC8 is formed at the end of this narrow region for electrical connection to complementary bit line /BL.

A metal interconnection line SM1 that extends in the X direction across memory cell MC and is parallel to metal interconnection line lines FM1 and FM2 is formed in a layer above these metal interconnection line lines FM1 and FM2. Metal interconnection line SM1 forms word line WL, continuously extends in the X direction, is coupled to the word line driver and is also coupled to pull-down element PD. Metal interconnection line SM1 is coupled at its portion protruding in the Y direction to polycrystalline silicon interconnection line TG5 via a via/contact VV3, and is coupled at its portion protruding in a −Y direction to polycrystalline silicon interconnection line TG2 via a via/contact VV2.

Owing to the connection by metal interconnection line SM1 forming the word line, the gates of the access transistors are connected to the word line. Each of active regions AC3 and AC6 has the wide and narrow regions formed, and has the memory cell drive transistor and the access transistor formed therein. The width in the X direction of each of active regions AC3 and AC6 corresponds to gate width W of the transistor. Therefore, length W1 corresponds to the gate width of the access transistor, and length W3 corresponds to the gate width of the drive transistor. Usually, gate width W3 of the drive transistor is set to a value 0.5 to 5 times (preferably, 0.8 to 2.0 times) larger than gate width W1 of the access transistor from the viewpoint of ensuring the static noise margin of the memory cell, Pull-down element PD is formed at active regions AC1 and AC2 which are spaced from each other and each of which has a rectangular form extending in the Y direction. These active regions AC1 and AC2 are formed in the P-well region. In the structure shown FIG. 16, the P-well of memory cell MC extends to the region for forming pull-down element PD, and memory cell MC and pull-down element PD share the P-well (because memory cell MC is adjacent to pull-down element PD). However, the P-wells separate from each other may be arranged for memory cell MC and for pull-down element PD, respectively.

Contacts CC1 and CC2 for receiving ground voltage VSS are formed at the lower ends in the Y direction of active regions AC1 and AC2, and vias/contacts CV1 and CV2 are formed at the other ends, respectively. These vias/contacts CV1 and CV2 are coupled to a metal interconnection line FM3. A metal interconnection line SM1 forming word line WL extends in the X direction across active regions AC1 and AC2, and is connected at its portion protruding in the Y direction to a via/contact VVA. A via VV1 is formed for a polycrystalline silicon interconnection line TG1, and connects polycrystalline silicon interconnection line TG1 to metal interconnection line SM1. Thereby, such a construction is achieved in each of active regions AC1 and AC2 that the gate and drain of the transistor of pull-down element PD are connected to the word line.

A width W0 in the X direction of active regions AC1 and AC2 is between widths W1 and W3 of the memory cell transistors. The gate of transistor in memory cell MC extends in the same direction (X direction) as the gate of the transistor of pull-down element PD. By arranging these gates of the transistors parallel to each other, it is possible to exert the same edge effect in photolithography, and variations in transistor form can be suppressed. Also, it is possible to suppress occurrence of a difference in impurity implantation that may occur due to shapes of the gates in the impurity implanting process, and the difference in transistor characteristic can be suppressed. Thus, the transistor characteristics of pull-down element PD can be set substantially equal to the transistor characteristics of the memory cell (i.e., linkage relationship can be achieved in variation in transistor characteristics between the pull-down element and the memory cell transistor), and the voltage level of the selected word line can be set accurately according to the variations in threshold voltage of the transistor in the memory cell.

In the foregoing description, the transistor that can follow the fluctuations in characteristic of the drive transistor in the memory cell is used for adjusting the voltage level of the selected word line. However, the pull-down element may be formed of the transistors following the variations in threshold voltage of the access transistor in the memory cell.

Specifically, when the threshold voltage of the access transistor in the memory cell lowers, the current driving power of the access transistor increases, and the static noise margin of the memory cell lowers. Thus, the voltage on the selected word line lowers to cause lowering of the conductance of the access transistor and lowering of the current driving power, so that the reduction of the static noise margin is suppressed, and the read margin is improved. As for the data writing, when the threshold voltage of the access transistor is low, the write margin is ensured so that the write margin is sufficiently ensured even when the word line voltage lowers.

When the threshold voltage of the access transistor increases, the current driving power of the access transistor lowers, and the static noise margin is substantially ensured. In this case, the threshold voltage of the pull-down element rises, and suppresses the voltage lowering of the selected word line so that excessive lowering of the selected word line voltage is suppressed. In the write operation, the write margin lowers according to the lowering of the current driving amount of the access transistor, but the amount of the voltage lowering of the selected word line is small, so that the deterioration of the write margin is suppressed, and fast writing is achieved.

The transistors forming the pull-down element may be configured to have the same electric characteristics as the drive transistors (NQ1 and NQ2) of the memory cell by employing the same impurity implantation conditions, layouts, sizes and others, whereby the on-resistance (equivalent on-resistance) of the pull-down element can be adjusted while accurately following the fluctuations in threshold voltage of the drive transistor in the memory cell, and the automatic correction of the voltage level of selected word line WL can be performed accurately.

Specifically, the size (a ratio of the channel length over the channel width, or the channel width when the channel length is the same with each other) of the unit channel MOS transistor shown in FIG. 16 may have the size in a range of the size 0.5 to 5 times, preferably about 0.8 to about 2 times larger than the size of memory cell drive transistors NQ1 and NQ2 or access transistors NQ3 and NQ4. This is because it can be consider that, by employing the unit N-channel MOS transistor having the size close to the size (a ratio between the gate width and the gate length) of the access transistor and/or drive transistor, these transistors can have similar behavior of the electric characteristics such as threshold voltage fluctuations. When the size differs by one order of magnitude, it is considered that the linkage relationship in electric characteristic between the unit transistor and the access and/or drive transistor is small, and/or it becomes difficult to reflect the fluctuations in electric characteristic of the drive transistor in the pull-down element via the unit transistor, Ideally, it is most preferable that the transistors have the same size (gate width), but the manufacturing steps are usually adjusted such that the variations in figure parameter of the transistors fall within the range of about 10% of variations. Even a normal manufacturing process may produce a pull-down unit transistor having a size 0.9 time larger than that of the memory cell transistor, and thus the lower limit of the size is set to be 0.8 time larger that of memory cell transistor taking the margin into account. In this case, the correspondence in fluctuation of threshold voltage can be ensured between the transistor of the memory cell and the pull-down transistor, and the selected word line voltage can be set to suppress accurately the fluctuations in threshold voltage of the memory cell transistor.

As compared with the case where the gate width is large, there is a tendency that the threshold voltage fluctuates greatly when the gate width is small. It can be considered that, when the gate width (size) of the pull-down unit transistor exceeds a doubled gate width (size) of the access transistor and/or drive transistor in the memory cell, the influence of the fluctuations in threshold voltage of the memory cell transistor is less reflected in the unit transistor, although this reflection degree specifically depends on the gate widths of the access transistors and drive transistors. Therefore, the upper limit of the size ratio is preferably two.

When the memory cell access transistor and the drive transistor have the equal gate lengths, the unit transistor of the pull-down element may have the gate width between the gate widths of the access transistors and drive transistors. In view of the static noise margin, drive transistors (NQ1 and NQ2) have gate widths larger than those of access transistors (NQ3 and NQ4) in many cases (assuming that the gate lengths are the same), and the pull-down unit transistor may have the gate width (size) between the gate widths of these access and drive transistors. In this case, the size (gate width) of the pull-down transistor is close to the sizes (gate widths) of the access and drive transistors, and the voltage of the selected word line can be set while reflecting the fluctuations in threshold voltage of the access transistors and/or drive transistors.

According to the second embodiment of the invention, as described above, the pull-down element is connected to the word line, and rising of the word line voltage level is suppressed so that the read margin can be stably ensured without an influence of variations in threshold voltage even with a low power supply voltage.

Third Embodiment

Figure 17:
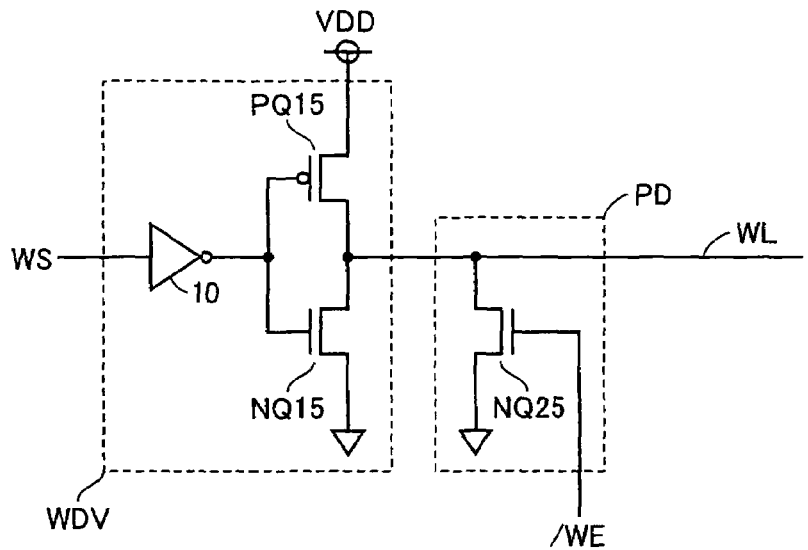
FIG. 17 schematically shows a construction of a word line driver and a pull-down element according to a third embodiment of the invention.

FIG. 17 shows a construction of pull-down element PD according to a third embodiment of the invention. In FIG. 17, pull-down element PD includes an N-channel MOS transistor NQ25 that is connected between a word line and the ground node, and receives a complementary write instruction signal /WE at a gate thereof. Word line driver WDV has the same construction as word line driver WDV shown in FIG. 8. Corresponding portions are allotted with the same reference numerals, and description thereof is not repeated.

Main control circuit 7 shown in FIG. 7 produces a complementary write instruction signal /WE, and the whole construction of a semiconductor memory device of the third embodiment of the invention is the same as that shown in FIG. 7.

Complementary write instruction signal /WE is produced from write instruction signal WE, and attains the H and L levels in the data read mode and the data write mode, respectively.

Figure 18:
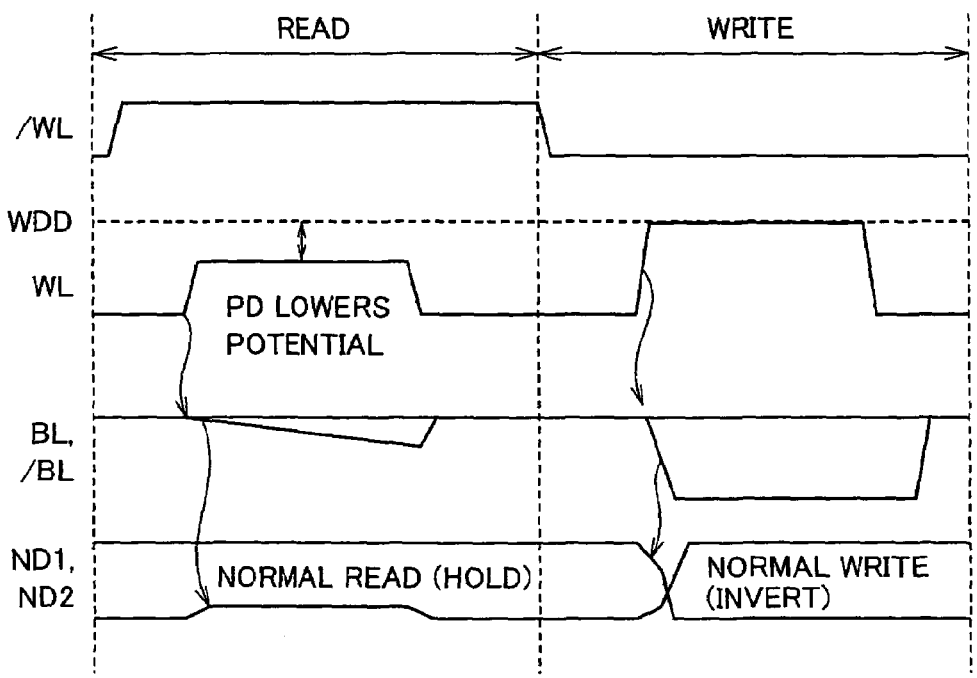
FIG. 18 is a signal waveform diagram representing operations of the word line driver and pull-down elements shown in FIG. 17.

FIG. 18 represents signal waveforms appearing on main nodes of the construction using the pull-down element PD shown in FIG. 17 in the read and write operations. In the data read operation, complementary write instruction signal /WE is set to the H level, and N-channel MOS transistor NQ25 in pull-down element PD is turned on. Selected word line WL is driven to the voltage level determined by the ratio between the on-resistance of P-channel MOS transistor PQ15 in the drive stage of word line driver WDV and the on-resistance of pulling-down N-channel MOS transistor NQ25. When the voltage on word line WL is low, the read margin (static noise margin SNM) is sufficiently ensured and the data is stably held even when the potentials of bit lines BL and /BL shown in FIG. 7 change according to the storage data of the memory cell and a column current (bit line current) raises the voltage level of internal storage nodes ND1 and ND2, and the data reading can be performed without destructing the data. In this read operation, the margin is ensured similarly to the first and second embodiments.

In the data writing, complementary write instruction signal /WE is set to the L level, and N-channel MOS transistor NQ25 for pull-down is turned off. In this case, charging P-channel MOS transistor PQ15 in word line driver WDV drives the selected word line WL to the level of power supply voltage VDD. Therefore, the voltage level of word line WL rises in the data write operation, and the write margin increases so that the data writing can be performed fast.

In the data writing, the pull-down operation by pull-down element PD stops, and the word line voltage level in the data write operation can be set to the power supply voltage level so that it is possible to prevent deterioration of the margin in the write operation and occurrence of failure in data writing. Thus, in both data reading and data writing, data can be stably read and written without an influence of the variations in threshold voltage of the memory cell, while ensuring a sufficient margin.

In pull-down element PD shown in FIG. 17, MOS transistor NQ25 has the same electric characteristics as the drive transistors (NQ1 and NQ2) in the memory cell, and is configured to satisfy the same conditions as pull-down MOS transistors NQ20 and NQ21 in the second embodiment already described.

According to the third embodiment of the present invention, as described above, the pull-down element is configured to stop the pull-down function in the data write mode, and can suppress lowering of the voltage level of the selected word line in the data write operation. In addition, the voltage level of the selected word line can be lowered in the data read operation so that sufficient margins can be ensured for reading and writing of data, and the data can be read and written stably.

The pull-down element may have the same construction as the pull-down element in the second embodiment already described. The gate of the pull-down transistor element is coupled to the control signal transmission line instead of the word line or the power supply voltage.

Fourth Embodiment

Figure 19:
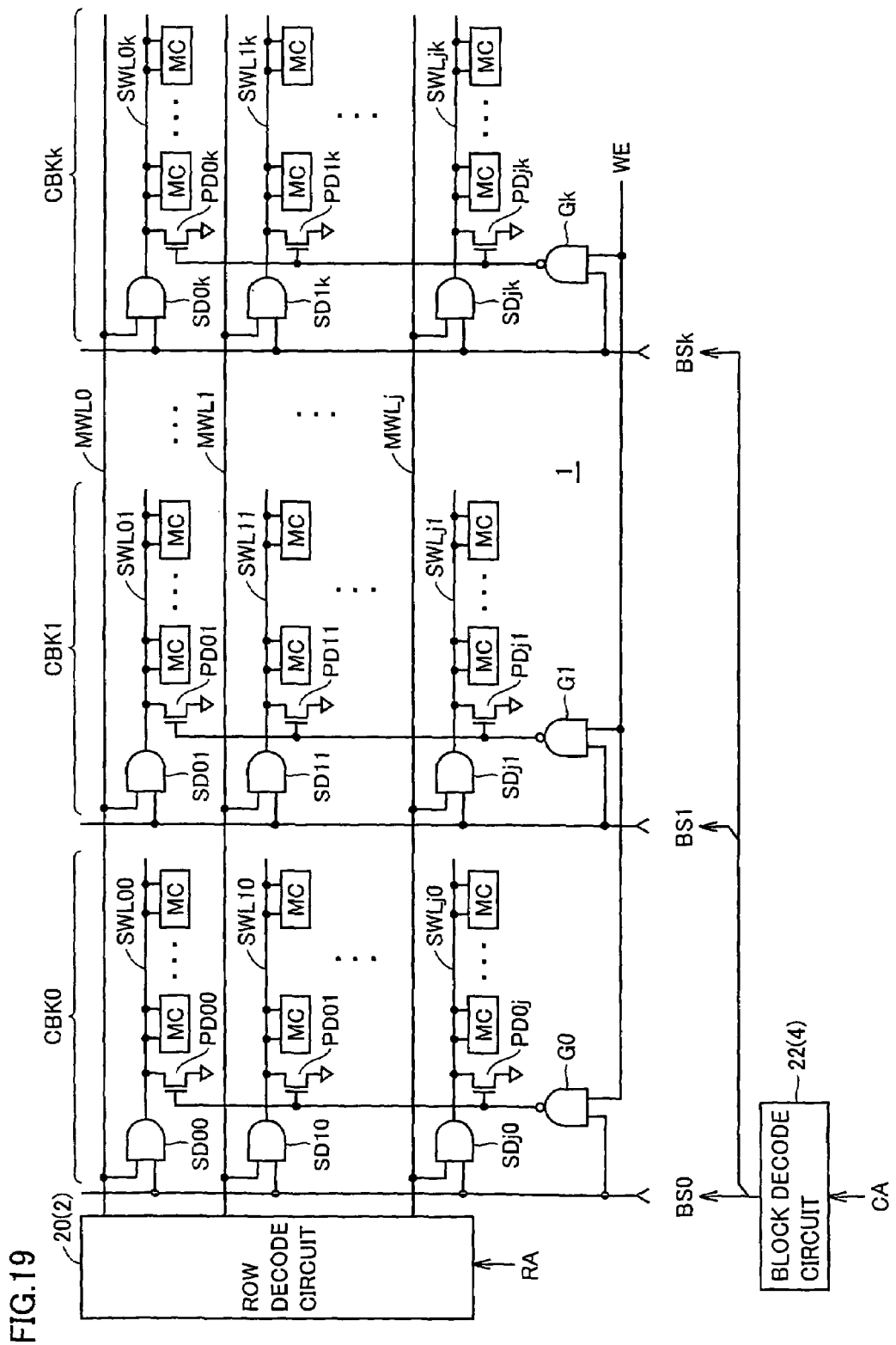
FIG. 19 schematically shows a construction of a memory cell array according to a fourth embodiment of the invention.

FIG. 19 schematically shows a construction of a main portion of a semiconductor memory device according to a fourth embodiment of the invention. In FIG. 19, memory cell array 1 is divided into a plurality of column blocks CBK0-CBKk. In each of column blocks CBK0-CBKk, memory cells MC are arranged in rows and columns, and sub-word lines are arranged corresponding to the memory cell rows. In FIG. 19, column block CBK0 includes sub-word lines SWL00, SWL10, ... and SWLj0 arranged corresponding to memory cell rows, respectively, and column block CBK1 includes sub-word lines SWL01, SWL11, ... and SWLj1 arranged corresponding to the memory cell rows, respectively. In column block CBKk, sub-word lines SWL0k, SWL1k, ... and SWLjk are arranged corresponding to the memory cell rows, respectively.

Main word lines MWL0, MWL1, ... and MWLj are provided commonly to the memory cell rows of these column blocks CBK0-CBKk. Main word lines MWL0-MWLj are driven to a selected state according to the row select signal applied from row decode circuit 20 (corresponding to the row decoder in FIG. 1).

Sub-word line drivers SD00-SDjk are arranged corresponding to sub-word lines SWL00-SWLjk, respectively. Sub-word line driver SDih (i=0, 1, ..., j, h=0, 1, ..., k) drives corresponding sub-word line SWLih to the selected state according to the signal potential on corresponding main word line MWLi and a block select signal BSh.

A block decode circuit 22 included in column select circuit 4 shown in FIG. 1 produces block select signals BS0-BSk according to column address signal CA, and the block select signal designating a column block including the selected column is driven to the selected state (H level).

Pull-down elements PD00-PDjk are arranged corresponding to sub-word lines SWL00-SWLjk, respectively. These pull-down elements PD00-PDjk are each formed of an N-channel MOS transistor (NQ25), respectively. Among pull-down elements PD00-PDjk, according to column block select signals BS0-BSk and write instruction signal WE, the pull-down elements in the selected column block are set to the off state in the data write operation. Specifically, pull-down control gates G0-Gk are arranged corresponding to column blocks CBK0-CBKk, respectively. Pull-down control gates G0-Gk receive block select signals BS0-BSk at their first inputs, respectively, and receives write instruction signal WE at their second inputs. Each of pull-down control gates G0-Gk produces a signal at the L level when a corresponding block select signal BSi is at the H level indicative of the selected state and write instruction signal WE is at the H level indicative of the write mode.

Pull-down control gate G0 applies its output signal commonly to the control gates of pull-down elements PD00, PD01, ... and PD0j in column block CBK0, and pull-down control gate G1 applies its output signal commonly to the control gates of pull-down elements PD01, PD11, ... and PDj1 in column block CBK1. Pull-down control gate Gk applies its output signal commonly to the control gates of pull-down elements PD0k-PDjk in column block CBKk.

In the data read operation, write instruction signal WE is at the L level, the output signals of pull-down control gates G0-Gk are at the H level and pull-down elements PD00-PDjk are conductive regardless of the state of block select signals BS0-BSk. When write instruction signal WE is at the H level, pull-down control gates G0-Gk operate as inverters, and pull-down control gate Gi corresponding to the selected column block produces the output signal at the L level so that the pull-down elements in the selected column block is turned off. In the other, unselected column blocks, the block select signals are at the L level indicative of the unselected state, so that the corresponding pull-down control gates produce the output signals at the H level, and the pull-down elements maintain the conductive state to keep the corresponding sub-word lines at the ground voltage level (sub-word lines in the unselected blocks are in the unselected state).

Figure 20:
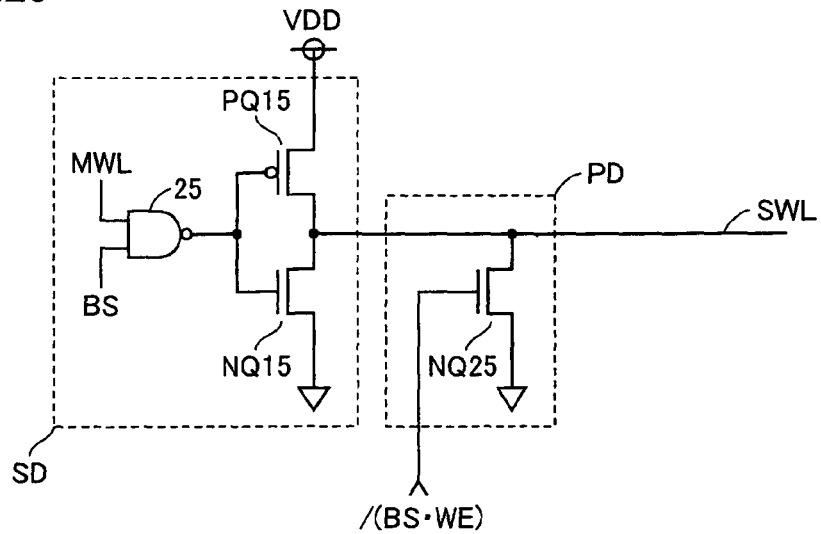
FIG. 20 shows, by way of example, constructions of a word line driver and a pull-down element shown in FIG. 19.

FIG. 20 shows constructions of the sub-word line driver and the pull-down element shown in FIG. 19. FIG. 20 representatively shows sub-word line driver SD and pull-down element PD arranged corresponding to one sub-word line SWL.

In FIG. 20, sub-word line driver SD includes an NAND circuit 25 receiving a signal on corresponding main word line MWL and column block select signal BS (BS0-BSk), and P-channel MOS transistor PQ15 and N-channel MOS transistor NQ15 that form a CMOS inverter inverting the output signal of NAND circuit 25.

Pull-down element PD is formed of N-channel MOS transistor NQ25 receiving, on its gate, a signal /(BE-WE) from the corresponding pull-down control gate.

As shown in FIG. 20, when sub-word line driver SD drives the corresponding sub-word line SWL to the H level, both MOS transistors PQ15 and NQ25 are turned on, and sub-word line SWL maintains the voltage level determined by the ratio between the on-resistances of these MOS transistors PQ15 and NQ25.

Figure 21:
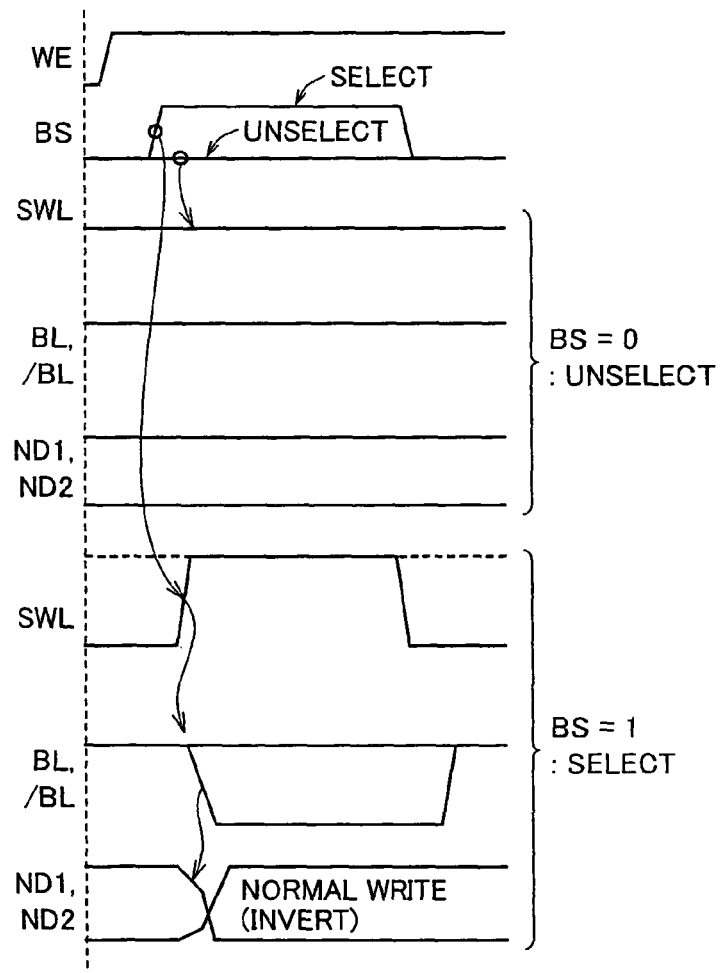
FIG. 21 is a signal waveform diagram representing operations of a sub-word line driver and the pull-down element shown in FIG. 20.

FIG. 21 represents signal waveforms appearing on main nodes during data writing in the semiconductor memory device according to the fourth embodiment of the invention. Referring to the signal waveform diagram of FIG. 21, description will now be given on the data writing operation of the constructions shown in FIGS. 19 and 20.

In the data write operation, write instruction signal WE is set to the H level. According to the externally applied column address signal (CA), block select signal BS for a column block including the selected column is driven to the selected state, and block select signals BS for the unselected blocks maintain the unselected state.

In the unselected block, as shown in FIG. 19, even when corresponding main word line MWL is driven to the selected state, sub-word line driver SD generates the output signal at the L-level, and sub-word line SWL maintains the ground voltage level. In the memory cell, therefore, the access transistor maintains the off state, and bit lines BL and /BL (not shown in FIG. 19) maintain the precharge voltage level. Storage nodes ND1 and ND2 among internal nodes of the memory cell in the unselected column block are maintained at the potential levels of corresponding storage nodes, and the voltage levels thereof do not change.

In the selected column block, column block select signal BS is "1" (H level), and sub-word line driver SD drives corresponding sub-word line SWL to the selected state according to the corresponding main word line MWL (one of main word lines MWL0-MWLj). In this selected column block, pull-down control gate (one of gates GiG0-GiGk) produces the output signal at the L level to turn off pull-down element PD. Therefore, charging P-channel MOS transistor PQ15 (the transistor for charging) included in sub-word line driver SD charges selected sub-word line SWL to the level of power supply voltage VDD. In the data write operation, therefore, the write margin is sufficiently ensured, and the voltage levels of storage nodes ND1 and ND2 in the memory cell can be rapidly set according to the write potentials appearing on bit lines BL and /BL, so that data can be written fast.

In the unselected memory cell, the voltage level of the corresponding sub-word line is in the unselected state, and deterioration of the reading is prevented in the unselected memory cells even when the write margin increases, and stable data writing can be achieved. The number of the memory cells connected to one sub-word line is made as small as possible, and data access (write/read) is made in parallel on the memory cells connected to the one sub-word line. Thus, it is possible to avoid the problem of deterioration of the static noise margin of the unselected memory cells in the data write operation, and the data can be written and read stably.

In the data read operation, write instruction signal WE is at the L level, and the output signals of pull-down control gates G0-GIi are at the H level independently of column block select signal BS. Therefore, all pull-down elements PD (PD00-PDjk) are in an on-state, and the voltage level of the selected sub-word line is set to the voltage level according to the ratio between the on-resistances of MOS transistors PQ15 and NQ25. Thus, the voltage level of the selected sub-word line is adjusted according to the threshold voltage characteristics of the drive transistors in the memory cell. When the threshold voltage of the drive transistors in the memory cell is high, the voltage level of the sub-word line and the on-resistance of the pull-down element become high. In this state, static noise margin SNM is sufficiently ensured, and therefore, the voltage level of the sub-word line is made high. When the threshold voltage of the memory cell drive transistor is low, a drive power of a drain current Ids thereof increases, and static noise margin SNM lowers. In this case, the voltage level of the selected sub-word line lowers (the on-resistance of the pull-down element decreases), and the static noise margin is improved (by adjusting the driving current amount of the access transistor).

The pull-down control gate may be formed of the pull-down element used in the second embodiment.

According to the fourth embodiment of the invention, as described above, the memory cell array is divided into a plurality of column blocks, and writing and reading of the data are performed in the selected column block. In an unselected column block, sub-word lines are kept inactive (in the unselected state), and it is possible to prevent the data destruction due to deterioration of the static noise margin of the memory cells in the unselected column. Thus, even when the columns are large in number, the reading and writing can be performed with stable margins against variation in threshold voltage of the memory cells.

Fifth Embodiment

Figure 22:
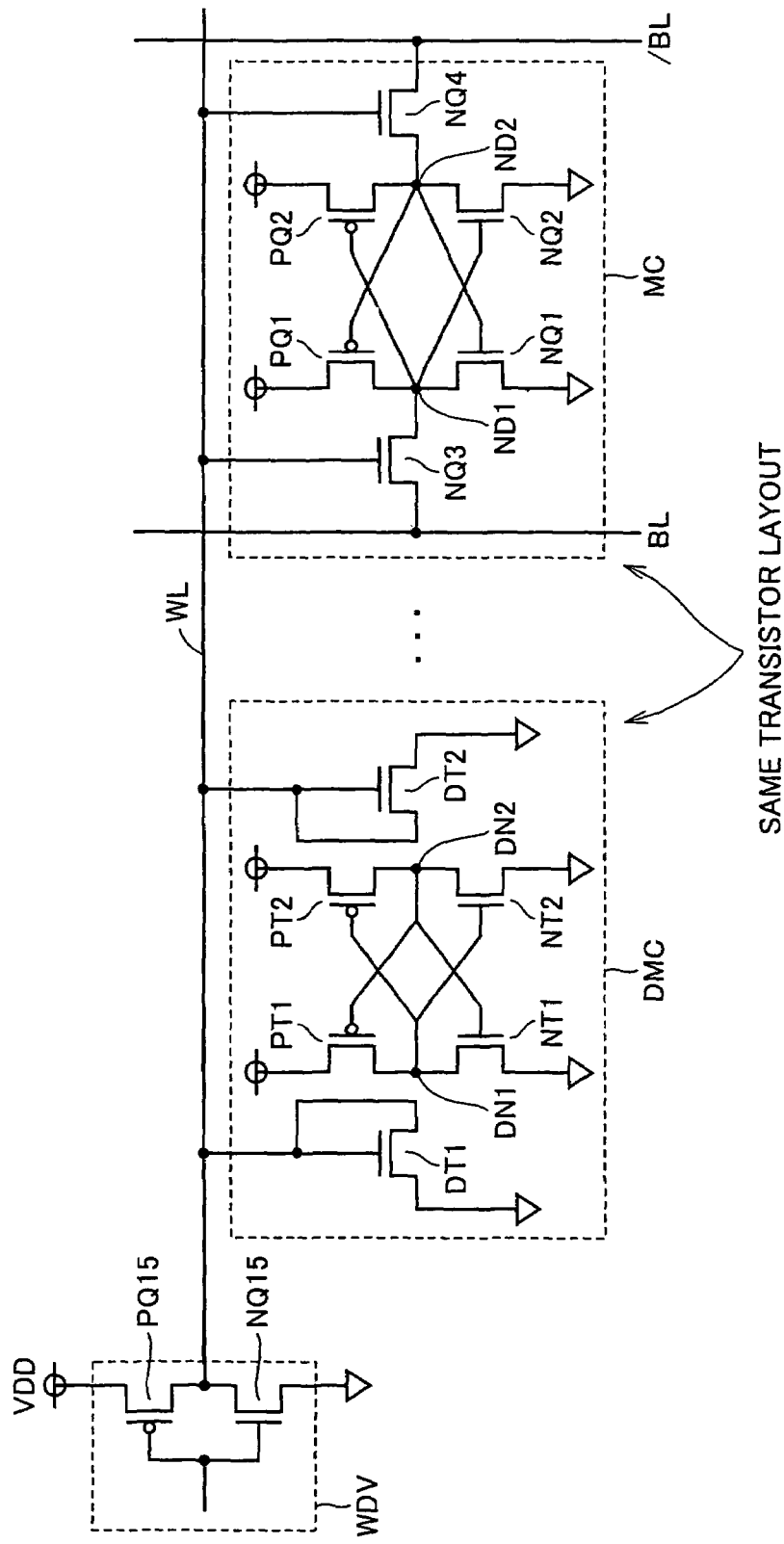
FIG. 22 shows a modification of a pull-down element of a fifth embodiment of the invention.

FIG. 22 shows a construction of a main portion of a semiconductor memory device according to a fifth embodiment of the invention. FIG. 22 shows a construction of a portion related to one word line WL. Word line driver WDV selectively drives word line WL to a selected or unselected state. The word line driver WDV includes P- and N-channel MOS transistors PQ15 and NQ15 forming the CMOS inverter in the drive stage.

Memory cells MC and a dummy cell DMC are connected to word line WL. Memory cell MC includes P-channel MOS transistors PQ1 and PQ2 as well as N-channel MOS transistors NQ1 and NQ2 forming a flip-flop, and further includes access transistors NQ3 and NQ4 coupling storage nodes ND1 and ND2 to bit lines BL and /BL, respectively according to the potential on word line WL.

Dummy cell DMC includes P-channel MOS transistors PT1 and PT2 corresponding to P-channel MOS transistors PQ1 and PQ2 of memory cell MC, respectively, N-channel MOS transistors NT1 and NT2 corresponding to N-channel MOS transistors NQ1 and NQ2 of memory cell MC, respectively, and N-channel MOS transistors DT1 and DT2 corresponding to access transistors NQ3 and NQ4 in memory cell MC, respectively.

Memory cell MC and dummy cell DMC are different in interconnection and connection from each other, but have the same layout with respect to the internal transistors. In dummy cell DMC, MOS transistors PT1, PT2, NT1 and NT2 have the same layout as MOS transistors PQ1, PQ2, NQ1 and NQ2 in memory cell MC, respectively, and are formed in the same manner.

In dummy cell DMC, each of N-channel MOS transistors DT1 and DT2 that correspond to access transistors NQ3 and NQ4 in memory cell MC, respectively, has a gate and a first node (drain node) coupled to word line WL, and has a second node (source node) coupled to the ground node. In dummy cell DMC, therefore, N-channel MOS transistors DT1 and DT2 are isolated from nodes DN1 and DN2 corresponding to storage nodes ND1 and ND2 in memory cell MC, respectively. MOS transistors DT1 and DT2 in dummy cell DMC have the same layout as access transistors NQ3 and NQ4 in memory cell MC, and differ from the access transistors only in the manner of interconnections. Therefore, MOS transistors DT1 and DT2 in dummy cell DMC have substantially the same electric characteristics as access transistors NQ3 and NQ4 in memory cell MC.

In the construction shown in FIG. 22, MOS transistors DT1 and DT2 of dummy cell DMC function as the pull-down element. MOS transistors DT1 and DT2 in dummy cell DMC are located near drive transistors NQ1 and NQ2 in memory cell MC so that similar variations occur in manufacturing parameters of the memory cells and the dummy cell, and the variations in electric characteristic (threshold voltage characteristic) of drive transistors NQ1 and NQ2 in memory cell MC are similar to the variations in electric characteristic (threshold voltage characteristic) of pull-down MOS transistors DT1 and DT2 in the dummy cell. Therefore, the fluctuations in transistor parameters of the memory cell can be reflected in the threshold voltage of pull-down transistors DT1 and DT2 in dummy cell DMC, and thus the voltage level of the selected word line can be set and corrected closely in linkage with the variations in threshold voltage of the memory cell.

It is assumed that a ratio of 1:23 is present between on-resistance Rp of P-channel MOS transistor PQ15 in word line driver WDV and combined on-resistance Rn of N-channel MOS transistors DT1 and DT2 in dummy cell DMC. When power supply voltage VDD is 1.2 V, voltage VWL on word line WL in the selected state can be expressed by the following equation:

$$1.2 \cdot 23/24 = 1.15.$$

Therefore, voltage drop of about 50 mV can be caused on selected word line WL. These on-resistance Rp and combined on-resistance Rn correspond to the current driving powers of MOS transistor PQ15 and MOS transistors DT1 and DT2, and a desired voltage ratio can be achieve by setting channel width W to an appropriate value. For example, when MOS transistor PQ15 has the on-resistance Rp of 1.5 KΩ, combined on-resistance Rn of N-channel MOS transistors DT1 and DT2 is 25 KΩ. According to this resistance values, the quantity of the through-current that flows from the power supply node of word line driver WDV via word line WL and pull-down MOS transistors DT1 and DT2 to the ground node is equal to $(1.2/(26.1 \times 10^{\wedge}3)$ and thus about 44 μA, where the symbol "^" indicates the power. This through-current flows through the word line in the selected row only during the word line select period, which sufficiently suppresses the increase in current consumption.

Figure 23:
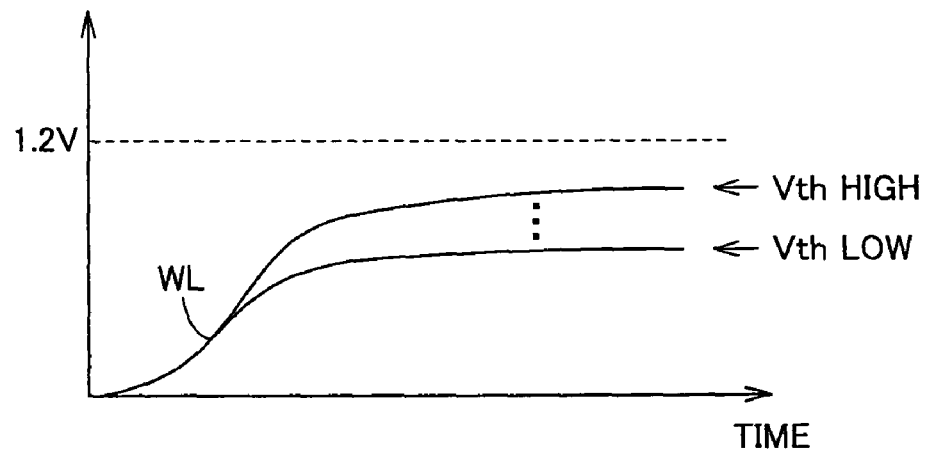
FIG. 23 illustrates changes in voltage level of a selected word line depending on changes in threshold voltage of the pull-down element shown in FIG. 22.

FIG. 23 schematically shows the potential of word line WL in the case where transistors DT1 and DT2 in dummy cell DMC are used as the pull-down element in FIG. 22. When threshold voltage Vth of drive MOS transistors NQ1 and NQ2 in memory cell MC rises, the threshold voltage of MOS transistors DT1 and DT2 in dummy cell DMC rises, and the on-resistance (conductance) rises so that drain current Ids thereof lowers. In memory cell MC, static noise margin SNM is improved, but the write characteristics deteriorate. In this case, the on-resistances of MOS transistors DT1 and DT2 in dummy cell DMC rise, and the voltage level of selected word line WL rises so that the write margin of memory cell MC is ensured.

When threshold voltage Vth of drive N-channel MOS transistors NQ1 and NQ2 in memory cell MC lowers, the write characteristics of the memory cell are improved, but static noise margin SNM lowers. In dummy cell DMC, threshold voltages of MOS transistors DT1 and DT2 likewise lower to increase the drain currents thereof, and the on-resistances lower. In this case, the voltage level of selected word line WL lowers according to the on-resistances of MOS transistors DT1 and DT2, and deterioration of static noise margin SNM of memory cell MC is suppressed.

Therefore, by using transistors DT1 and DT2 corresponding to the access transistors in dummy cell DMC as the pull-down element, it is possible to adjust automatically the voltage level of the selected word line WL closely in linkage with the fluctuations in threshold voltage of the drive transistor in memory cell MC, and the writing and reading of data can be stably performed.

In dummy cell DMC, the transistor corresponding to the access transistor in memory cell MC is used as the pull-down transistor. Therefore, when the influence of the threshold voltage fluctuations of the access transistor in the memory cell is larger than that of the threshold voltage fluctuations of the drive transistor, the read margin and write margin can be ensured by adjusting the voltage on the selected word line in accordance with and closely in linkage with the fluctuations in threshold voltage of the access transistor.

Dummy cell DMC and memory cell MC have the same layout, and the memory cell in the pull-down transistor and the corresponding access transistor are arranged with the same size (the same ratio of the gate width to the gate length). However, the dummy cell may be configured to have the size ratio from 0.8 to 2 similarly to the second embodiment according to the voltage drop quantity of word line WL.

Each memory cell row includes one dummy cell DMC and two pull-down transistors. However, the number of dummy cell(s) is appropriately determined according to the voltage lowering quantity of the word line.

[First Modification]

Figure 24:
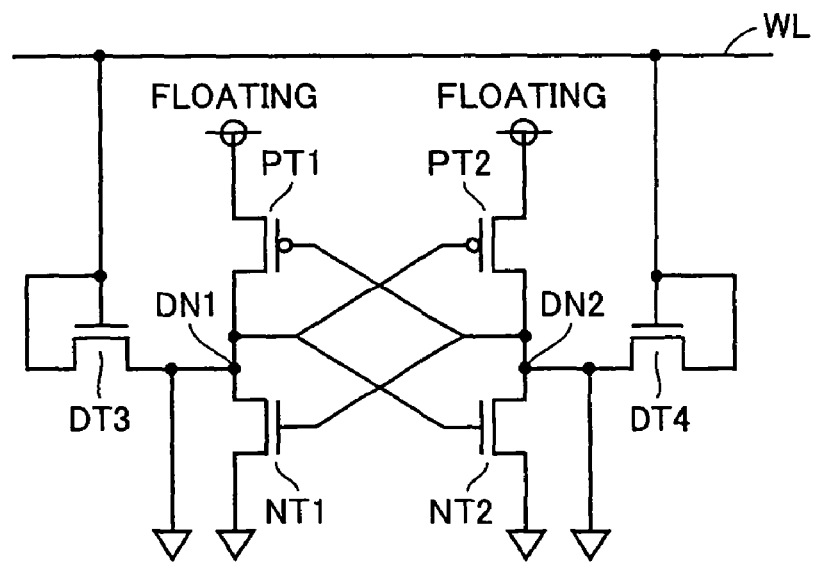
FIG. 24 shows a construction of a pull-down element of a modification of the fifth embodiment of the invention.

FIG. 24 shows a construction of dummy cell DMC of a modification of the fifth embodiment of the present invention. Dummy cell DMC shown in FIG. 24 has the same components as memory cell MC shown in FIG. 22. Memory cell MC and dummy cell DMC are the same in transistor layout, but differ in connection of interconnection lines from each other. Each of N-channel MOS transistors DT3 and DT4 that correspond to access transistors NQ3 and NQ4 in memory cell MC, respectively, is connected at its first node to word line WL, and is connected at its gate to word line WL. Second nodes of N-channel MOS transistors DT3 and DT4 are connected to internal nodes DN1 and DN2, respectively, as well as to the ground node.

MOS transistors PT1, PT2, NT1 and NT2 correspond to MOS transistors PQ1, PQ2, NQ1 and NQ2 forming the flip-flop in memory cell MC shown in FIG. 22.

In dummy cell DMC shown in FIG. 24, internal nodes DN1 and DN2 are coupled to second nodes of MOS transistors DT3 and DT4, respectively. The high-side power supply nodes of MOS transistors PT1 and PT2 are maintained in the electrically floating state.

In the construction of dummy cell DMC shown in FIG. 24, MOS transistors DT3 and DT4 function as the pull-down element. Nodes DN1 and DN2 are at the ground voltage level, and MOS transistors PT1 and PT2 clamp the source nodes corresponding to the high-side power supply nodes of MOS transistors PT1 and PT2 at the level of voltage Vthp (assuming that the absolute values of threshold voltages of MOS transistors PT1 and PT2 are Vthp).

In the connection construction shown in FIG. 24, the influence of the variations in threshold voltage of drive transistors NQ 1 and NQ2 in memory cell MC is similarly exerted on access N-channel MOS transistors NQ3 and NQ4 arranged near them. Thereby, pull-down MOS transistors DT3 and DT4 in dummy cell DMC exhibit the variations in threshold voltage similar to those of the drive transistors NQ 1 and NQ2 in memory cell MC, and the voltage level of word line WL can be set to the voltage level corresponding to the variations in threshold voltage of memory cell MC.

The transistors corresponding to the access transistors are used as the pull-down transistors, and the voltage on the selected word line can be adjusted by reflecting the fluctuations in threshold voltage of the memory cell access transistors in these pull-down transistors. When the access transistors and the drive transistors of a memory cell have the same size (the same ratio of the gate width to the gate length), the pull-down transistors of the dummy cell can set the voltage on a selected word line to the level reflecting the fluctuations in threshold voltage of both the access and drive transistors.

Figure 25:
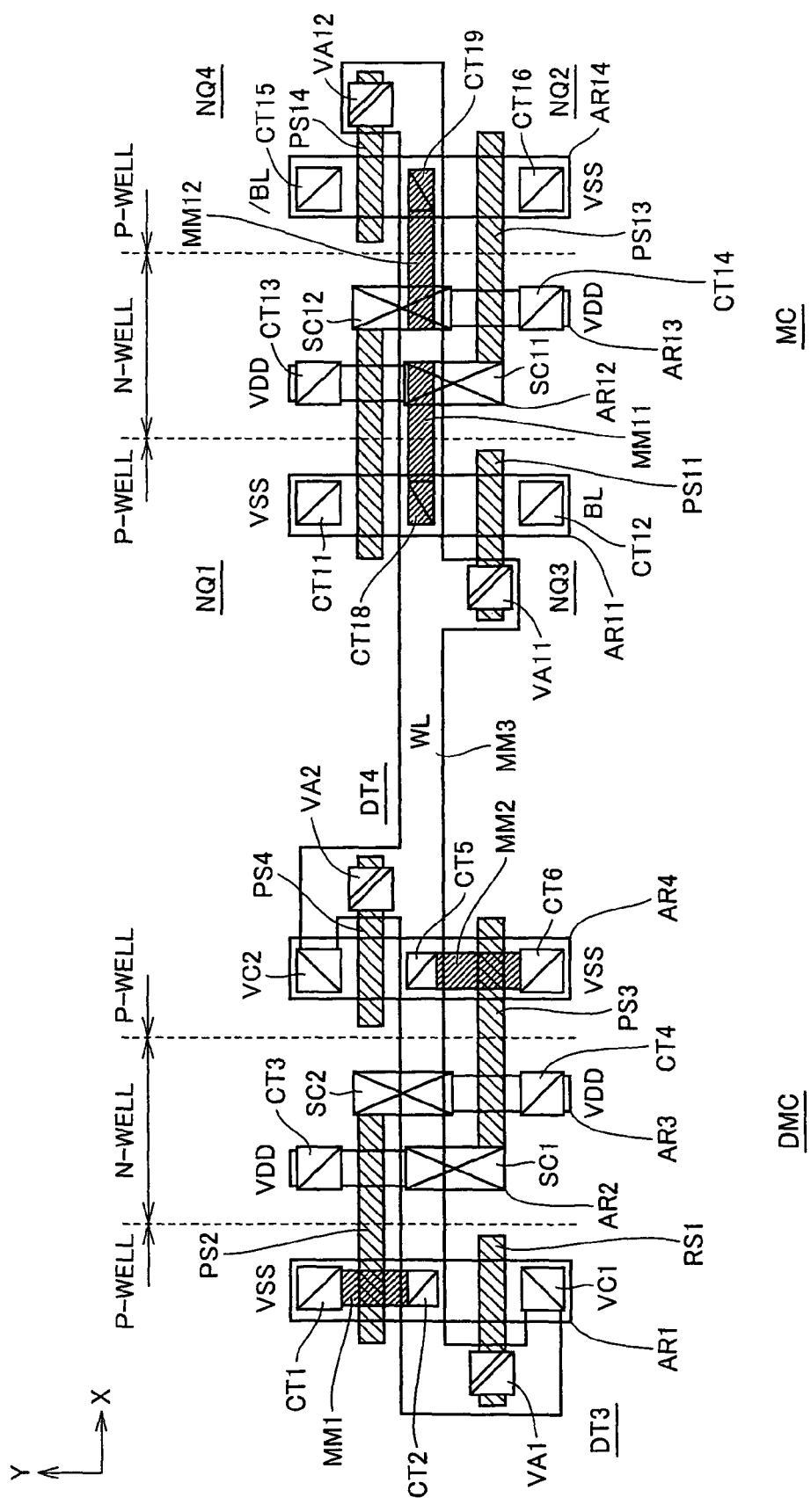
FIG. 25 schematically shows a planar layout of the pull-down element shown in FIG. 24.

FIG. 25 schematically shows a planar layout of dummy cell DMC shown in FIG. 24. FIG. 25 also shows a planar layout of memory cell MC.

In FIG. 25, dummy cell DMC includes, as transistor element formation regions, active regions AR2 and AR3 formed in an N-well as well as active regions AR1 and AR4 that are formed at P-well regions on the opposite sides of the above N-well, respectively. Each of active regions AR1-AR4 has a rectangular form having longer sides in the Y direction.

A contact CT1 and a contact/via VC1 are formed at the opposite ends of active region AR1, respectively, and a contact CT2 is formed in a central region of active region AR1.

A first polycrystalline silicon interconnection line PS extends in the X direction across active regions AR1 and AR2. A first polycrystalline silicon interconnection line line PS1 is formed near contact/via VC1, and extends across active region AR1. A first polycrystalline silicon interconnection line PS3 is formed in the memory cell region, and extends in the X direction across active regions AR3 and AR4. A first polycrystalline silicon interconnection line PS4 is arranged near a via/contact VC2 and extends in the X direction across active region AR4. A first polycrystalline silicon interconnection line PS2 is coupled to active region AR3 via a shared contact SC2, and active region AR2 is coupled to polycrystalline silicon interconnection line PS3 via a shared contact SC1. Each of shared contacts SC1 and SC2 is formed of a contact portion connected to the active region and an interconnection line portion continuously extending to polycrystalline silicon interconnection line PS2 or OS3, and has functions as a contact and an interconnection line that are achieved by one interconnection layer.

In active region AR1, a first metal interconnection line MM1 connects contacts CT1 and CT2 together. First metal interconnection line MM1 is formed in a layer higher than polycrystalline silicon interconnection line PS2. Contact CT1 is coupled to the ground line supplying ground voltage VSS.

A third metal interconnection line MM3 forming word line WL extends in the X direction across dummy cell DMC. Third metal interconnection line MM3 forming word line WL is coupled to polycrystalline silicon interconnection line PS1 through a via VA1, and is coupled to active region AR1 through via/contact VC1. Third metal interconnection line MM is coupled to first polycrystalline silicon interconnection line PS4 through a via VA2, and is coupled to active region AR4 through via/contact VC2.

In active region AR4, a first metal interconnection line MM2 connects contact CT5 and CT6 together, and contact CT6 is coupled to the ground node.

In each of active regions AR1 and AR4, the transistor corresponding to the drive transistor in the memory cell is coupled at its source and drain to the ground node, and the transistor (DT3 or DT4) corresponding to the access transistor in the memory cell is connected at its gate and drain to the word line, and is connected at its source to the ground node.

Third metal interconnection line MM3 is used as a word line WL3 because the second metal interconnection line is used for arranging the line transmitting power supply voltage VDD in the memory cell.

Contacts CT3 and CT4 in active regions AR2 and AR3 are not coupled to the power supply line transmitting power supply voltage VDD, but are kept in the electrically floating state.

Similarly to dummy cell DMC, memory cell MC includes, at the N-well, active regions AR12 and AR13 each having a rectangular form elongated in the Y direction, and further active regions AR11 and AR14 that are formed in the P-wells on the opposite sides of the N-well, respectively, and each of which has a rectangular form elongated in the Y direction. A polycrystalline silicon interconnection line PS11 is formed across active region AR1, and is coupled through a via VA11 to third metal interconnection line MM forming word line WL.

In a central portion of active region AR11, a contact CT18 is coupled to first metal interconnection line M11, which is coupled to active region AR12 via a shared contact CS11. Contact CT18 electrically couples first metal interconnection line MM11 to active region AR11, and thereby implements a connection of the transistor to the storage node in the memory cell. A shared contact SC11 is connected to a polycrystalline silicon interconnection line PS13 that is located in memory cell MC and extends in the X direction over active regions AR13 and AR14.

In active region AR12, a contact CT13 for the power supply node is formed at an end remote from shared contact SC11. In active region AR13, a contact CT14 receiving the power supply voltage is formed in a position mirror-symmetrical to contact CT13. Active region AR13 is also provided, at an end region remote from contact CT14, with a shared contact SC12 connected to a polycrystalline silicon interconnection line PS12 extending in the X direction and crossing active regions AR12 and AR11.

Shared contact SC12 is connected to a contact CT19 formed in a central region of active region AR14. Contact CT19 is electrically connected to a region in active region AR14, and first metal interconnection line MM12 provides the connection of the transistors of the other storage node in the memory cell.

A contact CT15 above active region AR14 is coupled to bit line /BL, and a contact CT16 formed at a position remote from contact CT15 is coupled to the ground line transmitting ground voltage VSS.

A polycrystalline silicon interconnection line PS14 extending in the X direction across active region AR14 is arranged for active region AR14, and is connected through a via VA12 to third metal interconnection line MM3 forming the word line.

In the layout shown in FIG. 25, MOS transistor DT1 in dummy cell DMC is formed in active region AR1, has a gate formed of polycrystalline silicon interconnection line PS1, has an impurity region connected to word line WL (third metal interconnection line MM3) and has a source coupled to a node receiving ground voltage VSS via contacts CT2 and CT1.

MOS transistor DT4 is formed in active region AR4, has a gate connected to polycrystalline silicon interconnection line PS4 and is electrically connected at a first conduction node to the third metal interconnection line forming word line WL through via/contact VC2. The source node (second conduction node) of MOS transistor DT4 is coupled to the ground node via contacts CT5 and CT6.

In the region for forming memory cell MC, active region AR11 is used to form access transistor NQ3 and drive transistor NQ1, and active region AR14 is used to form access transistor NQ4 and drive transistor NQ2. Shared contacts SC11 and SC12 correspond to storage nodes ND1 and ND2, respectively.

As shown in FIG. 25, therefore, dummy cell DMC and memory cell MC have the same layout, and are aligned in the X direction. In the active regions of dummy cell DMC, first metal interconnection lines MM1 and MM2 extend in the Y direction to connect contacts CT1 and CT5 to contacts CT2 and CT6, respectively. In dummy memory cell DMC, first metal interconnection lines MM11 and MM1 couple shared contacts SC11 and SC12 to contacts CT18 and CT19 in active regions AR11 and AR14, respectively.

First metal interconnection lines MM1, MM2, MM11 and MM12 are different from each other only in extending direction, and first metal interconnection lines MM1 and MM2 of memory cell MC are formed in the same manufacturing steps as first metal interconnection lines MM11 and MM12.

Further, in dummy cell DMC, third metal interconnection line MM3 forming word line WL is connected to via/contacts VC1 and VC2 corresponding to the contacts connected to bit lines BL and /BL of memory cell MC. Therefore, dummy cell DMC and memory cell MC can be formed in the same manufacturing steps with the same layout. The transistors in memory cell MC and dummy cell DMC are arranged in the same arrangement direction, and the same cell pattern can be arranged repeatedly so that access transistors DT3 and DT4 in dummy cell DMC can be used to provide, as the pull-down element for the selected word line voltage, the transistors having the same electric characteristics as the memory cell transistors.

Dummy cell DMC has the same layout as memory cell MC, and the word line voltage pull-down transistors in the dummy cell can be interconnected to the word line in the same interconnecting steps as memory cell MC.

In dummy cell DMC, gates of the P- and N-channel MOS transistors forming the inverter are connected together, but drain nodes thereof are isolated from each other. The first metal interconnection line connects contact CT2 to shared contact SC1, and the first metal interconnection line connects contact CT5 to shared contact SC2. Thereby, the drain nodes of the P- and N-channel MOS transistors can be connected to nodes DN1 and DN2 corresponding to the storage nodes, respectively.

[Second Modification]

Figure 26:
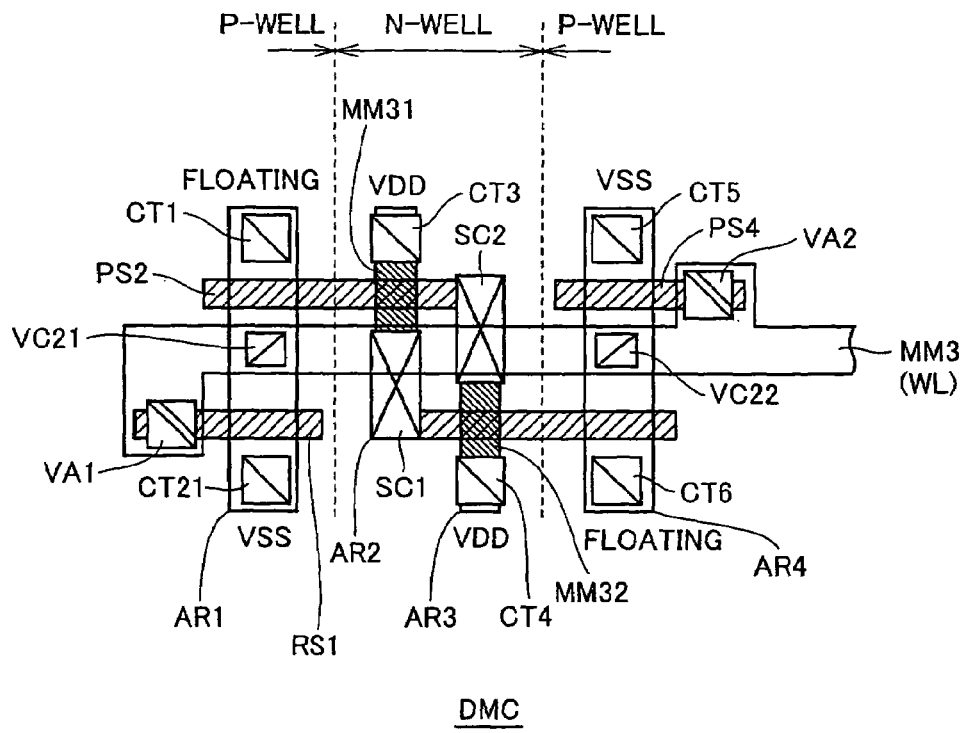
FIG. 26 schematically shows a planar layout of a pull-down element of a second modification of the fifth embodiment of the invention.

FIG. 26 schematically shows a layout of dummy cell DMC of a second modification of the fifth embodiment of the invention. The layout of memory cell MC corresponding to dummy cell DMC shown in FIG. 26 is the same as that of memory cell MC shown in FIG. 25, and third metal interconnection line MM3 forming word line WL is shared between memory cells MC arranged in the row direction. Therefore, FIG. 26 does not show the layout of the memory cells. Dummy cell DMC is aligned to the memory cells.

In dummy cell DMC shown in FIG. 26, arrangement of active regions AR1-AR4 and therefore arrangement of the transistors are the same as the arrangement of active regions AR1-AR4 and the arrangement of the transistors shown in FIG. 25. The interconnection layout of dummy cell DMC shown in FIG. 26 differs from that of dummy cell DMC shown in FIG. 25 in the following points:

In active region AR1, a contact/via VC21 arranged between polycrystalline silicon interconnection lines PS1 and PS2 is not coupled to active region AR1, but is coupled to third metal interconnection line MM3 forming word line WL. Third metal interconnection line MM3 is coupled to polycrystalline silicon interconnection line PS1 through via VA1. A bit line contact CT21 of active region AR1 is not coupled to the word line, but is coupled to a node supplying ground voltage VSS.

Contact CT1 on the other end of active region AR1 is maintained in the floating state. Contact/via VC21 is coupled merely to third metal interconnection line MM3 forming the word line, and shared contact SC1 is isolated from contact/via VC21.

In active region AR4 within the other P-well, a contact/via VC22 arranged in a region between polycrystalline silicon interconnection lines PS4 and PS3 is coupled to third metal interconnection line MM3, and the impurity region at the center of active region AR4 is coupled to word line WL through contact/via VC22. Third metal interconnection line MM3 is coupled to polycrystalline silicon interconnection line PS4 through via VA2. Contact CT5 is isolated from third metal interconnection line MM3, and is coupled to a node supplying ground voltage VSS instead of the bit line. In active region AR4, contact CT6 arranged on the other end is isolated from the ground voltage supply node, and is maintained in the floating state.

Shared contacts SC1 and SC2 formed in active regions AR2 and AR3 are coupled to polycrystalline silicon interconnection lines PS3 and PS2, respectively. Power supply contact CT3 is electrically connected via a first metal interconnection line MM31 in the layer above polycrystalline silicon interconnection line PS2 to shared contact SC1, and shared contact SC2 is electrically coupled to power supply contact CT4 via a first metal interconnection line MM32.

Other arrangements relating to dummy cell DMC shown in FIG. 26 are the same as those shown in FIG. 25. Corresponding portions are allotted with the same reference numerals, and description thereof is not repeated.

Figure 27:
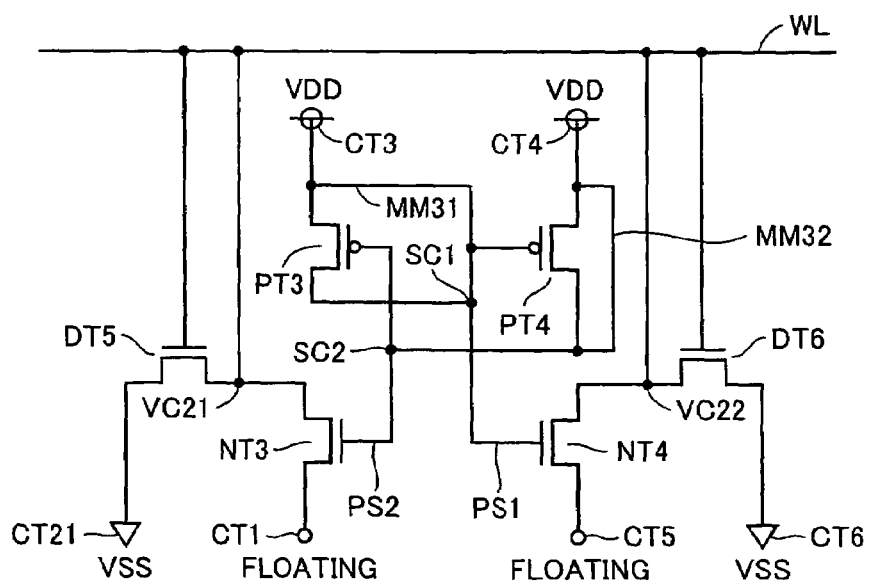
FIG. 27 shows an electrically equivalent circuit of the pull-down element shown in FIG. 26.

FIG. 27 shows an electrically equivalent circuit of dummy cell DMC shown in FIG. 26. In FIGS. 26 and 27, N-channel MOS transistors DT5 and NT3 are formed in active region AR1. Contact/via VC21 corresponds to the connection node (shared impurity region) of MOS transistors DT5 and NT3, and is electrically coupled to word line WL. A gate of MOS transistor DT5 is coupled to word line WL through via VA1. The other conduction node of MOS transistor DT5 receives ground voltage VSS through contact CT21.

In active region AR2, a P-channel MOS transistor PT3 is formed, and active region AR3 has a P-channel MOS transistor PT4 formed therein. Polycrystalline silicon interconnection line PS2 forms gates of MOS transistors PT3 and NT3, and is connected to shared contact SC2. Polycrystalline silicon interconnection line PS1 forms gates of MOS transistors PT4 and NT4, and is coupled to shared contact SC1. Therefore, the drain nodes of MOS transistors PT3 and NT3 are isolated from each other, and the drain nodes of MOS transistors PT4 and NT4 are likewise isolated from each other. The source nodes of MOS transistors PT3 and PT4 receive power supply voltage VDD through contacts CT3 and CT4.

In active region AR4, N-channel MOS transistors NT4 and DT6 are formed therein. The connection node between MOS transistors NT4 and DT6 is connected to word line WL through contact/via VC22, and the gate of MOS transistor DT6 is connected to word line WL. The source node of MOS transistor DT6 receives ground voltage VSS via contact CT6. Contact CT5 maintains the source node of MOS transistor NT4 in the floating state.

According to the arrangement of dummy cell DMC shown in FIG. 27, the voltage level of word line WL can likewise be pulled down by MOS transistors DT5 and DT6 having the same transistor layout as the drive transistors arranged near the access transistors0 in the memory cell. Although MOS transistors NT3 and NT4 each have the gate maintained at the level of power supply voltage VDD and therefore are normally conductive, the source nodes thereof are in the floating state. Therefore, MOS transistors NT3 and NT4 do not affect the discharging operation performed by MOS transistors DT5 and DT6.

MOS transistors PT3 and PT4 have gate, source and drain nodes connected to the power supply node, and are normally maintained in the off state. A node in the floating state is not present in dummy cell DMC (the source nodes of transistors NT3 and NT4 are maintained at the word line potential).

Dummy cell DMC may be supplied with ground voltage VSS instead of power supply voltage VDD. In this case, MOS transistors NT3 and NT4 can normally be maintained in the off state so that the parasitic capacitance of the word line can be reduced, and it is possible to reduce the influence on driving speed of the word line to the selected state.

Even in the case where the transistors in dummy cell DMC shown in FIG. 27 are used as the word line pull-down elements, the same fluctuations occur in parameter of the N-channel MOS transistors in dummy cell DMC and memory cell MC in the manufacturing steps, and the word line WL can be set to the voltage level reflecting the fluctuations in threshold voltage of drive N-channel MOS transistors (NQ1 and NQ2) of the memory cell by using MOS transistors DT5 and DT6.

In these first to third modifications, the size ratio between the transistor in the memory cell (the access and drive transistors are formed in the same rectangular region, and have the same gate width) and the pull-down transistor in the dummy cell may be in a range from 0.5 to 5, and preferably from 0.8 to 2, similarly to the second embodiment.

According to the fifth embodiment of the invention, as described above, the transistor in the dummy cell corresponding to the access transistor is used as the pull-down element for the word line, and the fluctuations in threshold voltage of the memory cell can be reflected in the dummy cell aligned to the memory cell and having the same transistor layout as the memory cell. Thus, a selected word line can be accurately set to the voltage level reflecting the variations in threshold voltage of the N-channel MOS transistors in the memory cell, and the selected word line voltage can be automatically and precisely corrected to perform reading and writing of the data in the memory cell.

Sixth Embodiment

Figure 28:
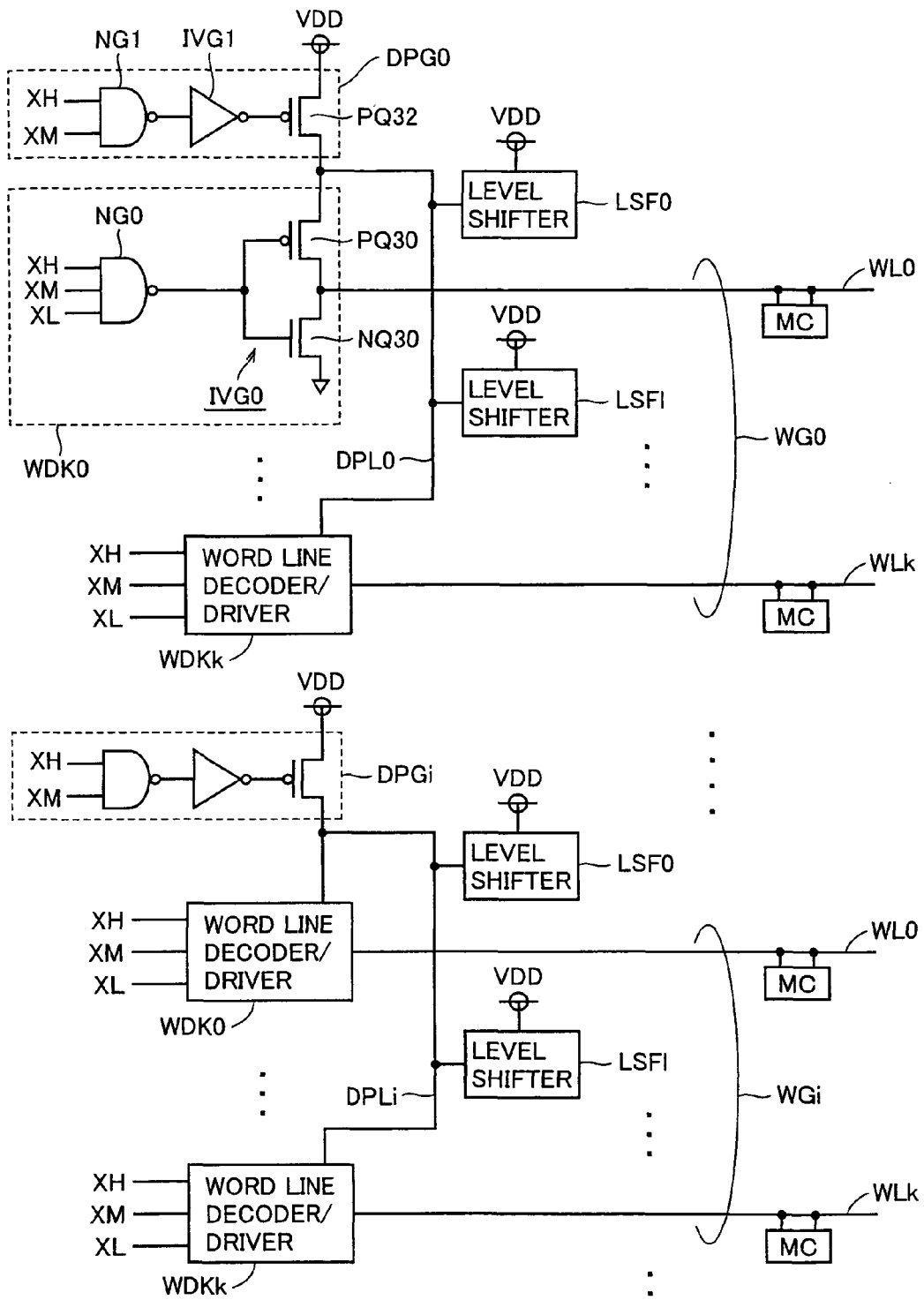
FIG. 28 schematically shows constructions of an array and a word line selecting portion of a semiconductor memory device according to a sixth embodiment of the invention.

FIG. 28 schematically shows a construction of a main portion of a semiconductor memory device according to a sixth embodiment of the invention. In FIG. 28, the word lines are divided into a plurality of word line groups WG0-WGi each including word lines WL0-WLk. Each of word lines WL0-WLk is connected to a plurality of memory cells MC, but FIG. 28 shows only one of memory cells MC connected to each word line. Bit lines BL and /BL are arranged corresponding to each memory cell column, but are not shown in FIG. 28 for the sake of simplicity.

In each of word line groups WG0-WGi, word line decoders/drivers WDK0-WDKk are arranged corresponding to word lines WL0-WLk, respectively. In each of word line groups WG0-WGi, word line decoders/drivers WDK0-WDKk each decode row address predecode signals XH, XM and XL, and drive a corresponding word line to a selected state when the corresponding word line is to be selected. A combination of predecode signals XH, XM and XL for each word line decoder/driver is different from combinations for the other word line decoders/drivers, and one word line is designated among the word lines.

Word line decoder/driver WDK0 includes an NAND gate NG0 for decoding predecode signals XH, XM and XL, and an inverter IVG0 for driving the corresponding word line to the selected state according to an output signal of NAND gate NG0. Inverter IVG0 includes a P-channel MOS transistor PQ30 and an N-channel MOS transistor NQ30. Other word line decoders/drivers WDK have the same configurations as word line decoder/driver WDK0, although these word line decoders/drivers WDK receive different combinations of predecode signals XH, XM and XL, respectively. Therefore, internal configurations of the other word line decoders/drivers WDK are not shown.

In each of word line groups WG0-WGi, word line decoders/drivers WD0-WDKk commonly receive the operation power supply voltage via driver power supply lines DPL (DPL0-DPLi). Driver power supply line precharge circuits DPG0-DPGi precharge driver power supply lines DPL0-DPLi to the level of power supply voltage VDD, respectively. Driver power supply line precharge circuit DPG0 includes an NAND gate NG1 for decoding predecode signals XH and XM, an inverter circuit IVG1 for inverting the output signal of NAND gate NG1, and a P-channel MOS transistor PQ32 for transmitting power supply voltage VDD to a corresponding one of driver power supply lines DPL0-DPLk. Driver power supply line precharge circuits DPG0-DPGi have the same construction, and therefore the reference numerals for the components are assigned only to the components in driver power supply line precharge circuit DPG0.

The combination of predecode signals XH and XM designates one of word line groups WG0-WGi. In the selected word line group, therefore, driver power supply line precharge circuit DPG (one of DPG0-DPGk) becomes inactive (non-conductive) to stop precharging of corresponding driver power supply line DPL (one of DPL0-DPLi) to the level of power supply voltage VDD.

Driver power supply line precharge circuits DPG0-DPGi are employed for preventing excessive drop of the voltage levels of driver power supply lines DPL0-DPLk in a long cycle, i.e., when the successive accesses are made and when the word line is kept in the selected for a long period of time.

Level shifters LSF0-LSF1 are provided for driver power supply lines DPL0-DPLi, respectively. Level shifters LSF0-LSF1 clamp the lower limit voltage levels of corresponding driver power supply lines DPL0-DPLi at the voltage level of (VDD-Vthp), respectively.

Figure 29:
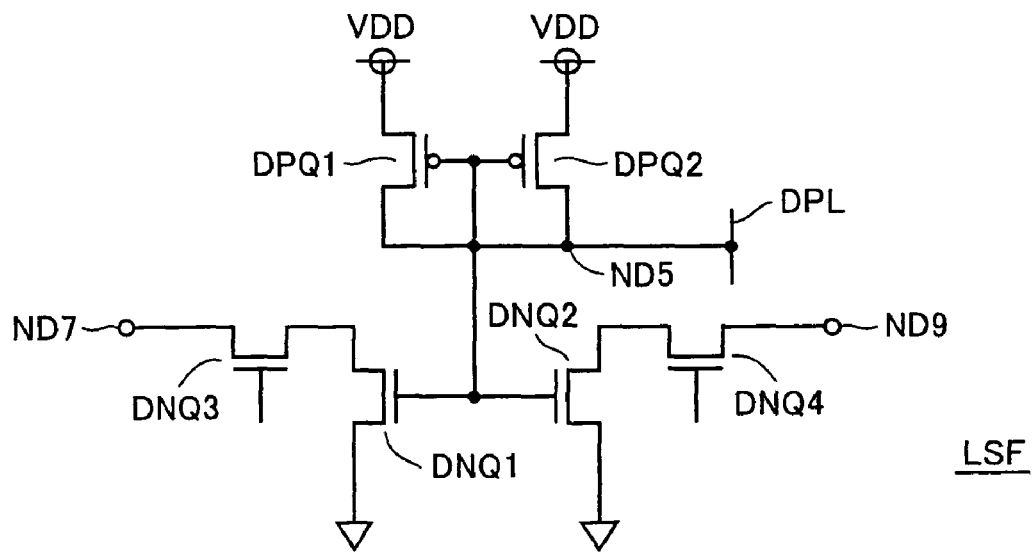
FIG. 29 shows, by way of example, a construction of a level shifter shown in FIG. 28.

FIG. 29 shows an example of the constructions of level shifters LSF0-LSF1. Since level shifters LSF0-LSF1 have the same construction, FIG. 29 representatively shows only one of level shifters LSF0-LSF1, and reference character "LSF" is used for representing the level shifter representatively.

Level shifter LSF includes P-channel MOS transistors DPQ1 and DPQ2 that are arranged between the power supply node and a node ND5, and have gates connected to node ND5, N-channel MOS transistors DNQ3 and DNQ1 connected in series, and N-channel MOS transistors DNQ4 and DNQ2 connected in series. Nodes ND7 and ND9 are kept in the electrically floating state, and both the gates of MOS transistors DNQ1 and DNQ2 are connected to node ND5.

MOS transistors DPQ1 and DPQ2 have the threshold voltages of absolute value of Vthp, and diode-connected MOS transistors DPQ1 and DPQ2 maintain node ND5 at the voltage level of (VDD-Vthp) to keep MOS transistors DNQ1 and DNQ2 conductive. The connection node between MOS transistors DNQ3 and DNQ1 is isolated from node ND5, and the connection node between MOS transistors DNQ2 and DNQ4 is isolated from node ND5. Therefore, MOS transistors DNQ1 and DNQ2 maintain the nodes ND7 and ND9 in the floating state at the ground voltage level.

This level shifter LSF is the same in transistor layout as the components in memory cell MC, but is different in connection manner of interconnection lines. MOS transistors DPQ1 and DPQ2 exhibit fluctuations in threshold voltage similar to the fluctuations in threshold voltage of the load transistor in the memory cell. Therefore, the voltage (VDD-Vthp) of driver power supply line DPL is maintained at the voltage level reflecting the fluctuations of threshold voltage of the load P-channel MOS transistor included in memory cell MC.

Figure 30:
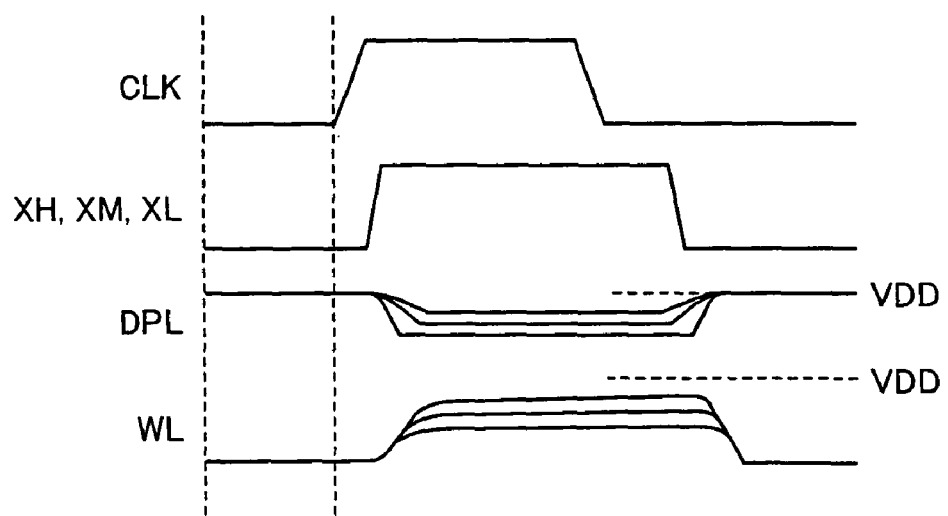
FIG. 30 is a signal waveform diagram representing an operation for word line selection of the construction shown in FIG. 28.

FIG. 30 is a signal waveform diagram representing an operation of the semiconductor memory device shown in FIGS. 28 and 29. Referring to FIG. 30, description will now be given on the operations of the semiconductor memory device shown in FIGS. 28 and 29.

In an operation signal waveforms shown in FIG. 30, the semiconductor memory device operates in synchronization with a clock signal CLK, and the address signal is externally applied in synchronization with clock signal CLK. Clock signal CLK may be a clock signal defining an operation cycle of a processor outside the semiconductor memory device (in which case the processor supplies the address signal to the semiconductor memory device in synchronization with the clock signal), or may be applied from the external processor to the semiconductor memory device together with the address signal with clock signal CLK.

When clock signal CLK rises, an externally applied row address signal is made definite, and a predecoder (not shown) establishes the states of predecode signals XH, XM and XL. It is assumed that word line group WG0 is selected. In this case, the output signal of NAND gate NG1 attains the L level according to the combination of predecode signals XH and XM, so that the output signal of inverter IVG1 attains the H level, and MOS transistor PQ32 is turned off. Accordingly, the precharging of driver power supply line DPL0 to power supply voltage VDD is completed. When driver power supply line DPL0 is at the level of power supply voltage VDD, MOS transistors DPQ1 and DPQ2 shown in FIG. 29 are in an off state, and driver power supply line DPL is rendered floating at the level of power supply voltage VDD.

The word line decoders/drivers WDK0-WDKk perform the decode operation, and the word line decoder/driver arranged corresponding to the selected word line provides such an operation according to the predecode signals XH, XM and XL that the output signal of NAND gate NG0 attains the L level, and accordingly, inverter IVG0 produces the output signal at the H level. Assuming that word line WL0 is selected, MOS transistor PQ30 in word line decoder/driver WDK0 charges word line WL0. The charging current of word line WL (WL0) is supplied from driver power supply line DPL (DPL0), so that the voltage level of driver power supply line DPL0 lowers. When the voltage level of driver power supply line DPL0 lowers, the clamping function works in level shifters LSF0-LSF1, and MOS transistors DPQ1 and DPQ2 maintain the voltage level of driver power supply line DPL0 at the level of (VDD-Vthp).

When absolute value Vthp of the threshold voltage of the load transistor included in memory cell MC increases, and the driving current quantity decreases, the write margin is improved, and static noise margin SNM deteriorates. In this case, the voltage clamping level of driver power supply line DPL is lower than power supply voltage VDD (Vthp is large), and selected word line WL0 attains the voltage level lowered more, and the static noise margin of the memory cell is improved.

When absolute value Vthp of threshold voltage of the load MOS transistor in memory cell MC is low, the driving current quantity increases, and the write margin deteriorates (the data write margin becomes small) although static noise margin SNM is improved. In this case, the clamping level of driver power supply line DPL is equal to voltage of (VDD-Vthp), so that the extent of voltage lowering is small, and the voltage level of selected word line WL WL0 is close to power supply voltage VDD so that the write margin is improved.

Therefore, the voltage level of the selected word line can be automatically adjusted closely in linkage with the fluctuations in threshold voltage Vth of the load MOS transistor in the memory cell, and the writing and reading of data can be performed stably and accurately.

In particular, the transistors having the same transistor layout as the memory cell are used as the level shifter, and therefore the voltage level of the word line can be adjusted accurately in synchronization with or corresponding to the fluctuations in threshold voltage of the load transistors in the memory cell.

The number of word lines WL0-WLk included in each of word line groups WG0-WGi may be appropriately determined according to the bit number of the predecode signals.

The number of level shifters LSF coupled to one driver power supply line is merely required to allow supply of the current for driving one word line, and is appropriately determined according to the size of the transistor of the level shifter.

[First Modification]

Figure 31:
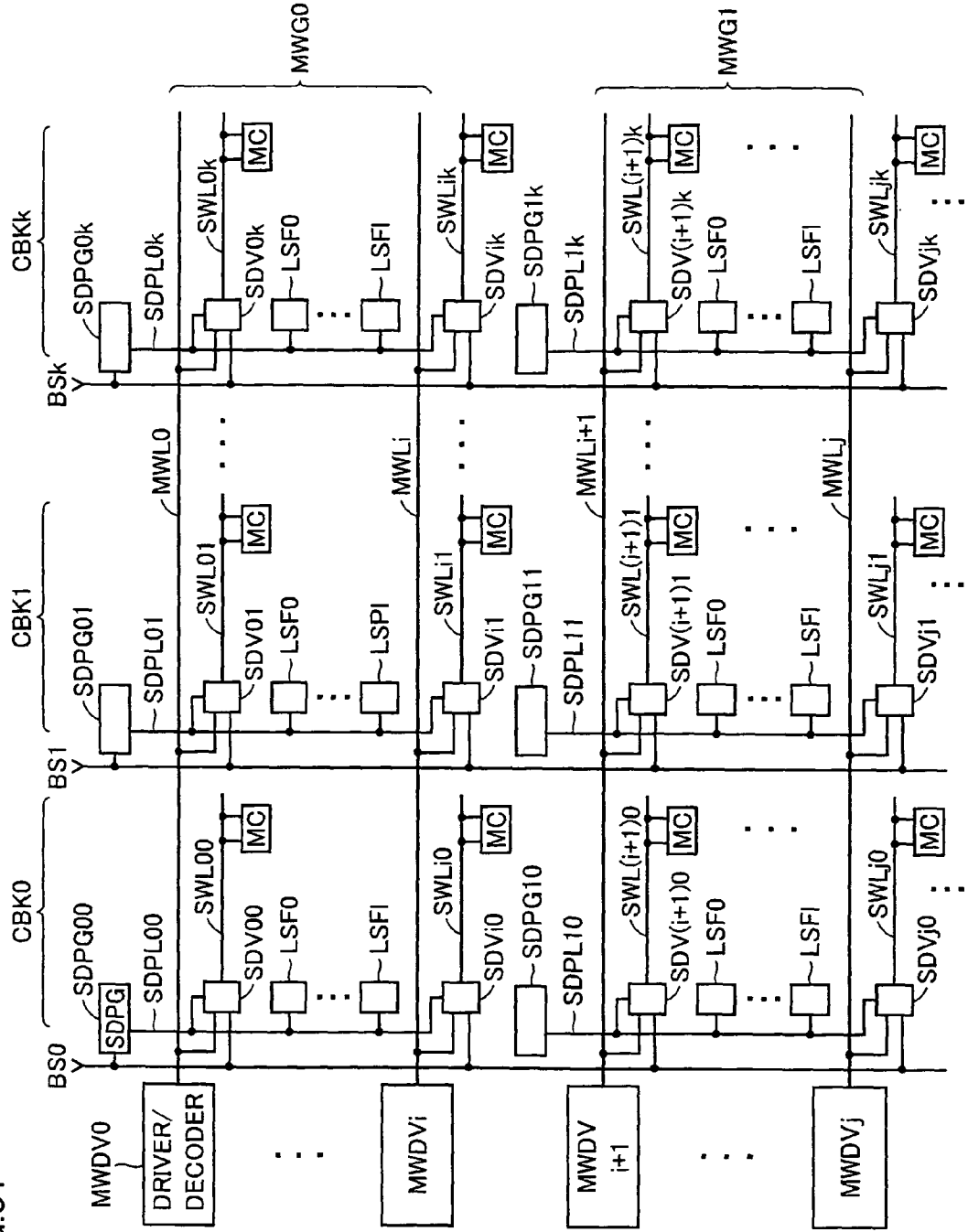
FIG. 31 schematically shows a construction of an array of a modification of the sixth embodiment of the invention.

FIG. 31 shows a construction of a modification of the array in the semiconductor memory device of the sixth embodiment of the invention. In FIG. 31, the word lines are formed into a hierarchical construction including main word lines and sub-word lines. The main word lines are divided into main word line groups MWG each including a plurality of main word lines. FIG. 31 representatively shows a main word line group MWG0 including main word lines MWL0-MWLi as well as main word line group MWG1 including main word lines MWLi+1-MWLj.

Main word line drivers/decoders MWDV0-MWDVi and MWDVi+1-MWDVj are arranged corresponding to main word lines MWL0-MWLi and MWLi+1-MWLj, respectively. Main word line drivers/decoders MWDV0-MWDVi, MWDVi+1-MWDVj drive one main word line to the selected state.

The memory cell array is divided into column blocks CBK0-CBKk. In each column block, sub-word lines SWL are arranged corresponding to main word lines MWL0-WMLj. In FIG. 31, sub-word lines SWL00-SWL0k are arranged corresponding to main word line MWL0, and sub-word lines SWLi0-SWLik are arranged corresponding to main word line MWLi. Sub-word lines SWL(i+1)0-SWL(i+1)k are arranged corresponding to main word line MWLi+1, and sub-word lines SWLj0-SWLjk are arranged corresponding to main word line MWLj. Each of sub-word lines SWL00-SWLjk is connected to memory cells MC in one row of the corresponding column block.

These sub-word lines SWL00-SWLjk are provided with sub-word line drivers SDV00-SDVjk. Each of sub-word line drivers SDV00-SDVjk responds to column block select signal BS (BS0-BSk) and the signal potential of a corresponding main word line MWL (one of MWL0-MWLj), to drive the corresponding sub-word line to the selected state.

Thus, the sub-word lines are arranged corresponding to the respective memory cell rows in each of the column blocks to be designated by block select signals BS0-BSk, and a sub-word line corresponding to the selected main word line is driven to the selected state in the selected column block.

In each of main word line groups MWG0-MWG1, driver power supply line precharge circuits SDPG are arranged corresponding to column blocks CBK0-CBKk, respectively. For main word line group MWG0 in FIG. 31, driver power supply line precharge circuits SDPG00-SDPG0k are arranged corresponding to column blocks CBK0-CBKk, respectively. For main word line group MWG1, driver power supply line precharge circuits SDPG10-SDPG1k are arranged corresponding to column blocks CBK0-CBKk, respectively. These driver power supply line precharge circuits SDPG00-SDPG0k supply the operation power supply voltage to the sub-word line drivers in the column blocks of the corresponding main word line groups via sub-word line driver power supply lines SDPL00-SDPL1k, respectively.

Each of sub-word line driver power supply lines SDPL00-SDPL1k is connected to level shift elements LSF0-LSF1.

The construction of each of driver power supply line precharge circuits SDPG00-SDPG1k has the same construction as driver power supply line precharge circuits DPG0-DPGk, except for that column block select signal BS (BS0-BSk) is applied together with predecode signals XH and XM. Main word line drivers/decoders MWDV0-MWDVj have the same constructions as word line drive decoders/drivers WDK-WDKk shown in FIG. 28. Main word line drivers/decoders MWDV0-MWDVj drive corresponding main word lines MWL0-MWLj to the selected state according to predecode signals XH, XM and XL.

Level shift elements LSF0-LSF1 each are the same in construction as that shown in FIG. 26 and in transistor layout as memory cell MC, and each include a diode-connected P-channel MOS transistor that corresponds to the load transistor, and is coupled to the corresponding one of driver power supply lines SDPL00-SDPL1k.

In the hierarchical word line configuration shown in FIG. 31, the sub-word line is driven to the selected state only in the column block including the memory cell in a selected column, and the corresponding word line driver power supply line precharge circuit and level shifters LSF0-LSF1 shift down the voltage level of the corresponding sub-word line to the level of (VDD-Vthp). In the unselected column blocks, all the sub-word lines are in the unselected state, and the corresponding driver power supply line precharge circuits DPG maintain the corresponding driver power supply lines SDPL at the level of power supply voltage VDD. In the write operation, therefore, a sufficient read margin can be ensured in the unselected memory cells, and fast data writing can be performed without causing data destruction in the unselected memory cells.

It is possible to reduce the number of the memory cells in a half selected state in which the corresponding word line is selected and the corresponding bit line is not selected. In the data write operation, therefore, it is possible to reduce the possibility that the data destruction occurs due to the read margin deterioration of the memory cells in the half selected state.

In the hierarchical word line configuration shown in FIG. 31, the main word line and the sub-word line in each column block are in one-to-one correspondence relationship. However, each column block may be configured such that one main word line corresponds to a plurality of sub-word lines, and the sub-word line driver drives the corresponding sub-word line to the selected state according to the predecode signal (XL) and the signal on the associated main word line.

[Second Modification]

Figure 32:
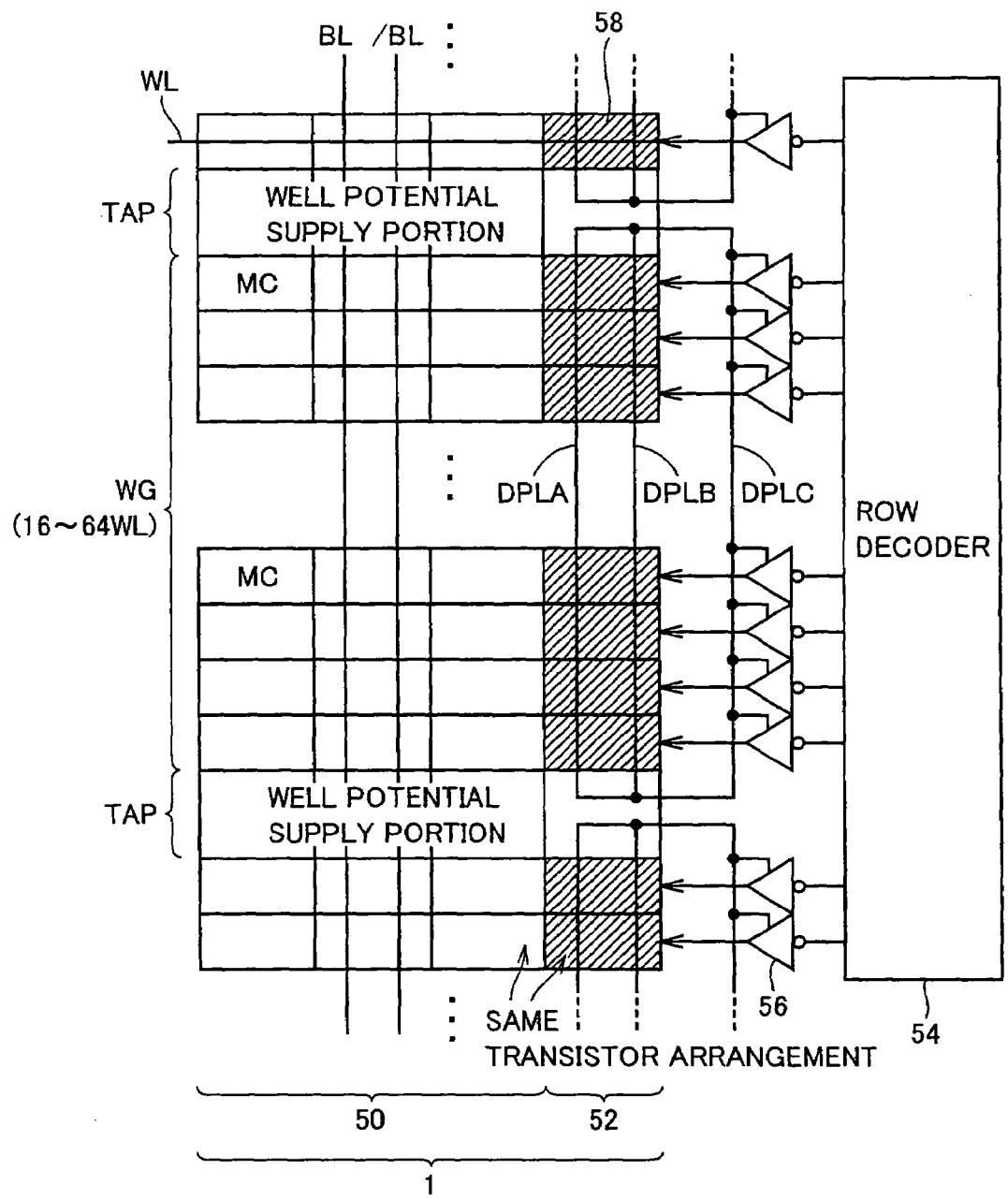
FIG. 32 schematically shows constructions of an array and a word line drive portion of a second modification of the sixth embodiment of the invention.

FIG. 32 schematically shows a construction of a memory array of the second modification of the sixth embodiment of the invention. In FIG. 32, memory cell array 1 includes a normal memory array 50 having memory cells MC arranged in rows and columns, and a word line voltage adjusting portion 52 for adjusting the select voltage level of word line WL. Word line voltage adjusting portion 52 includes word line voltage adjusting circuits 58 arranged corresponding to the memory cell rows (word lines), respectively. Each word line WL is connected to the memory cells in the corresponding row.

Each word line voltage adjusting circuit 58 is aligned to memory cells MC, and has the same transistor arrangement as memory cell MC, although the construction thereof will be described later in detail. By changing internal line connections, word line voltage adjusting circuit 58 can achieve a function of adjusting the voltage level of the word line.

Corresponding to each word line WL, there is arranged a word line driver 56 that drives a corresponding word line to the selected state according to a word line select signal applied from a row decoder 54. Word lines WL are divided into groups each including a predetermined number (e.g., in a range from 16 to 64) of word lines, and driver power supply lines DPLC are arranged corresponding to word line groups WG, respectively. Driver power supply line DPLC is commonly coupled to clamping power supply lines DPLA and DPLB arranged in the word line voltage adjusting portion for each word line group WG. Driver power supply line DPLC and clamping power supply lines DPLA and DPLB form a loop in each word line group WG, and supplies the operation power supply voltage to word line drivers 56 in the corresponding word line group. For example, clamping power supply lines DPLA and DPLB are formed of the interconnection lines in the same layer as bit lines BL and /BL, and word line voltage adjusting circuit 58 having the same construction (transistor arrangement) as memory cell MC clamps the voltage of driver power supply line DPLC at the level of voltage (VDD-Vthp).

Well potential supply portion TAP is arranged between word line groups WG, and a well bias voltage is supplied to the well region in which each memory cell MC and word line voltage adjusting circuit 58 are arranged. Well potential supply portion TAP supplies the well voltage at a predetermined level to each of N-well regions for forming the P-channel MOS transistors (load transistors) of memory cells MC and P-well regions for forming the N-channel MOS transistors (access transistors and driver transistors).

Figure 33:
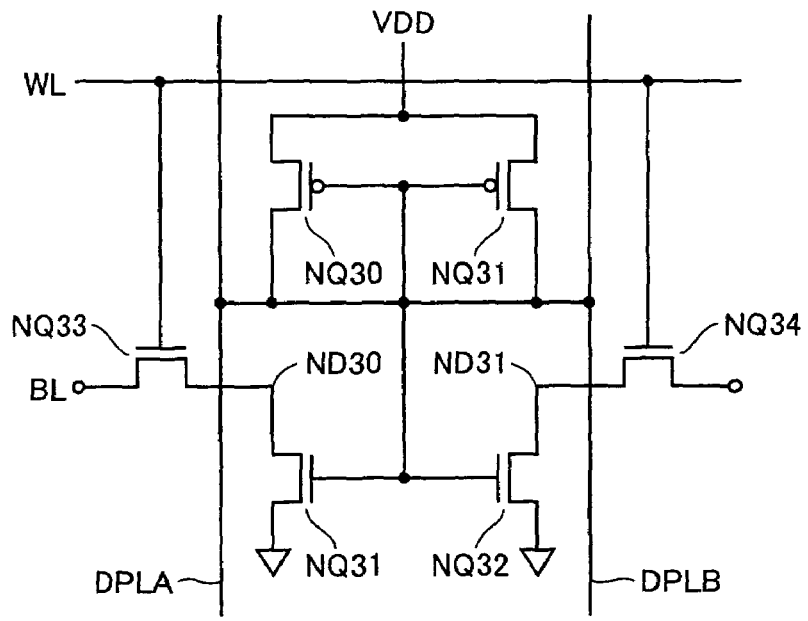
FIG. 33 shows a construction of a word line voltage adjusting circuit shown in FIG. 32.

FIG. 33 shows a construction of a word line voltage adjusting circuit 58 shown in FIG. 32. In FIG. 33, word line voltage adjusting circuit 58 includes P-channel MOS transistor PQ30 that is connected between the power supply node and clamp power supply line DPLA and has a gate coupled to clamping power supply lines DPLA and DPLB, a P-channel MOS transistor PQ31 that is connected between the power supply node and clamping power supply line DPLB and has a gate coupled to clamping power supply lines DPLA and DPLB, an N-channel MOS transistor NQ31 that is connected between a node ND30 and the ground voltage and has a gate coupled to clamping power supply lines DPLA and DPLB, an N-channel MOS transistor NQ32 that is connected between a node ND31 and the ground node and has a gate coupled to clamping power supply lines DPLA and DPLB, an N-channel MOS transistor NQ33 that has a first conduction node coupled to node ND30 and has a gate connected to word line WL, and an N-channel MOS transistor NQ34 that has a first conduction node connected to node ND31 and has a gate connected to word line WL.

Second conduction nodes of MOS transistors NQ33 and NQ34 are maintained in the electrically floating state (open state). In memory cell MC, the second conduction nodes of the transistors corresponding to MOS transistors NQ33 and NQ34 are coupled to bit lines BL and /BL, respectively.

The electrically equivalent circuit of memory cell MC is the same as that of memory cell MC shown in FIG. 2. Word line voltage adjusting circuit 58 shown in FIG. 33 is aligned in the row direction to memory cells MC.

In the construction of word line voltage adjusting circuit 58 shown in FIG. 33, MOS transistors PQ30 and PQ31 operate in the diode mode to clamp the lower limit voltage levels of clamping power supply lines DPLA and DPLB at the level of voltage (VDD-Vthp), where Vthp represents the absolute value of the threshold voltage of MOS transistors PQ30 and PQ31.

MOS transistors NQ31 and NQ32 are normally kept on by the voltages on clamping power supply lines DPLA and DPLB, and maintain the nodes ND30 and ND31 at the ground voltage level, respectively. MOS transistors NQ33 and NQ34 are selectively turned on according to the voltage level of word line WL. However, the second conduction nodes corresponding to the nodes coupled to bit lines BL and /BL in the memory cell are in the electrically floating state (open state), nodes ND30 and ND31 are isolated from clamping power supply lines DPLA and DPLB, and the on/off states of MOS transistors NQ33 and NQ34 do not affect the clamped voltage levels of clamping power supply lines DPLA and DPLB.

Gate capacitances of MOS transistors NQ33 and NQ34 serve as the load capacitance of the dummy cell for word line WL. As shown in FIG. 33, the electrically equivalent circuit of word line voltage adjusting circuit 58 is the same in the electrically equivalent circuit, but differs in the connection of internal interconnection lines of the transistors in memory cell MC with respect to the arrangement of the transistors in memory cell MC (see FIG. 2).

The construction of the word line voltage adjusting circuit shown in FIG. 33 is the same as that of the level shifter shown in FIG. 29, except for that two clamping power supply lines DPLA and DPLB are employed.

Figure 34:
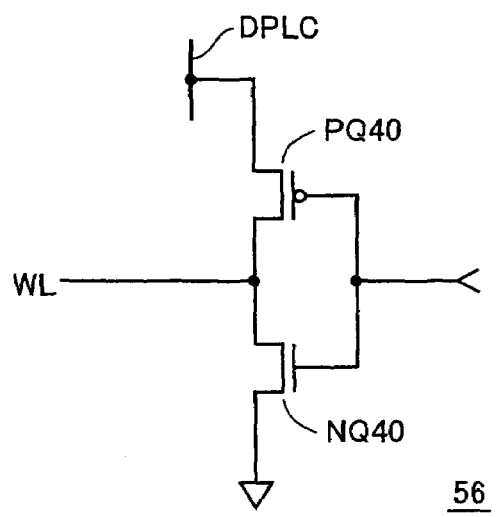
FIG. 34 schematically shows a construction of a word line driver shown in FIG. 32.

FIG. 34 shows a construction of word line driver 56 shown in FIG. 32. In FIG. 34, word line driver 56 includes P-channel MOS transistors PQ40 and NQ40 forming a CMOS inverter. A source node of MOS transistor PQ40 is coupled to driver power supply line DPLC. When word line WL is selected according to the word line select signal applied from the row decoder shown in FIG. 32, MOS transistors PQ40 and NQ40 drive word line WL to the level of the voltage on driver power supply line DPLC (the level of the clamped voltage on the clamping power supply line).

Memory cell MC has the same interconnection layout and the same transistor arrangement as memory cell MC shown in FIG. 25, and the transistor arrangement of word line voltage adjusting circuit 58 is the same as that of memory cell MC. Therefore, the transistor arrangements of memory cell MC and word line voltage adjusting circuit 58 are repeated in the row direction. The current supplying power of the diode-connected clamping transistor in word line voltage adjusting circuit 58 is the same as the load transistor in the memory cell. However, the word line voltage adjusting circuit is arranged corresponding to each word line included in word line group WG, and adjusts the voltage level of the word line driver power supply line in parallel. When a word line is selected, therefore, only one word line is driven to the selected state in the corresponding word line group, and the selected word line can be driven sufficiently rapidly to the level of voltage (VDD-Vthp).

The memory cell and the word line voltage adjusting circuit employ the same transistor arrangement, and the following description will be given on the transistor arrangement and interconnection layout of word line voltage adjusting circuit 58. The positional relationship between the transistors in memory cell MC and the transistors in word line voltage adjusting circuit 58 is the same as that between the memory cell and the dummy cell shown in FIG. 25, with the dummy cell being replaced with word line voltage adjusting circuit 58.

Figure 35:
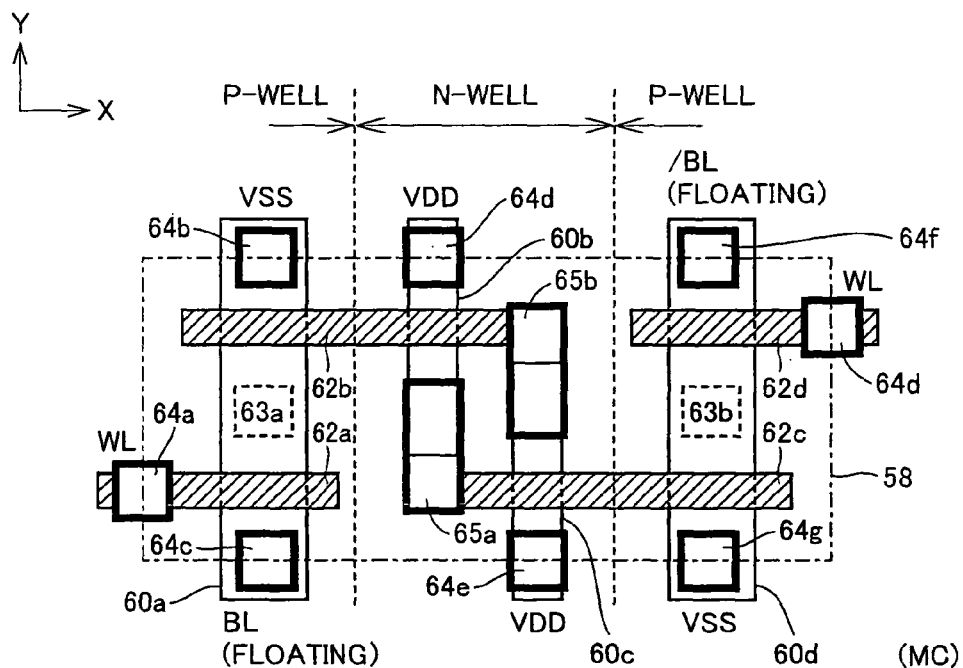
FIG. 35 shows a planar layout of a word line voltage adjusting circuit shown in FIG. 33.

FIG. 35 shows a layout of the active regions and the first polycrystalline silicon interconnection lines of word line voltage adjusting circuit 58. In FIG. 35, word line voltage adjusting circuit 58 includes active regions 60b and 60c formed in an N-well, and active regions 60a and 60d formed in P-wells on the opposite sides of the N-well, respectively. Each of active regions 60a-60d have a rectangular form elongated in the Y direction.

A contact 64c for the bit line and a contact 64b for the ground voltage are formed on the opposite ends in the Y direction of active region 60a, respectively. A polycrystalline silicon interconnection line 62a extends in the X direction across active region 60a. A word line contact 64a is formed at one end of polycrystalline silicon interconnection line 62a.

Active region 60b is provided, at its opposite ends, with a power supply contact 64d and a shared contact 65a, respectively. Active region 60c is provided, at its lower end in the Y direction, with a power supply contact 64e, and is provided, at an upper region in the Y direction, with a shared contact 65b. Shared contact 65b is coupled to a polycrystalline silicon interconnection line 62b that extends in the X direction across active regions 60b and 60a, and polycrystalline silicon interconnection line 62b is electrically coupled to active region 60c.

Shared contact 65a is electrically connected to a polycrystalline silicon interconnection line 62c that extends in the X direction across active regions 60c and 60d. In this manner, active region 60b is electrically connected to polycrystalline silicon interconnection line 62c.

Active region 60d is provided, at its opposite ends in the Y direction, with a bit line contact 64f and a ground contact 64g, respectively. A polycrystalline silicon interconnection line 62d extends in the X direction across active region 60d, and is electrically coupled to word line contact 64d formed at a boundary region of word line voltage adjusting circuits 58.

The arrangement of transistors and the arrangement of gates in word line voltage adjusting circuit 58 shown in FIG. 35 are substantially the same as those of memory cell MC, and the transistor arrangement shown in FIG. 35 is repeated in the X direction mirror-symmetrically between neighboring arrangements. Therefore, the arrangements of transistors and the interconnection lines are the same in the X-direction arrangement in word line voltage adjusting circuit 58 and in the Y-direction arrangement in memory cell MC, and word line voltage adjusting circuit 58 and memory cell MC can be arranged without affecting the layout pattern of the memory cells in memory cell array. Since the word line voltage adjusting circuit 58 and memory cell MC have the same transistor arrangement, the electric characteristics of the transistors in memory cell MC can be the same as the electric characteristics of each in word line voltage adjusting circuit 58 transistor (manufacturing these transistors and the interconnection lines under the same conditions).

Figure 36:
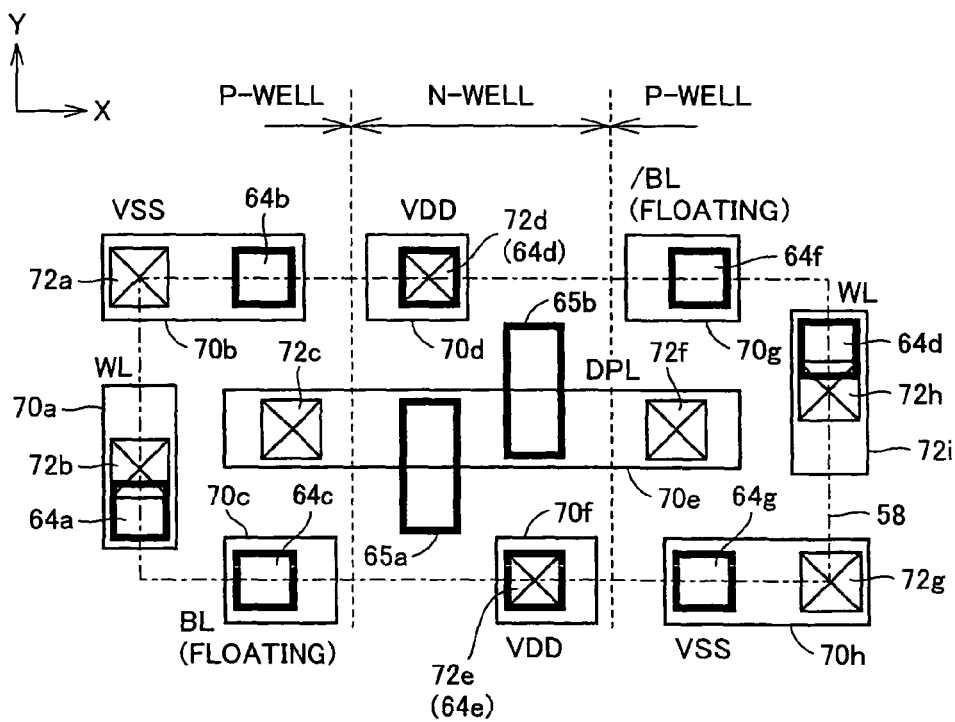
FIG. 36 shows an interconnection line layout in a layer above the planar layout shown in FIG. 35.

FIG. 36 schematically shows an interconnection line layout in a layer above the transistor arrangement interconnection shown in FIG. 35. FIG. 36 shows the layout of the first metal interconnection lines and vias connected to the first metal interconnection lines. In FIG. 36, the same contacts as those shown in FIG. 35 are allotted with the same reference numerals, and description thereof is not repeated.

For word line contact 64a arranged in a boundary region of word line voltage adjusting circuit 58, there is arranged a first metal interconnection line 70a of a rectangular form elongated in the Y direction. A via 72b having a portion overlapping with word line contact 64a is formed on first metal interconnection line 70a.

A first metal interconnection line 70b of a rectangular form elongated in the X direction is formed for ground contact 64b (i.e., contact for grounding). A via 72a for connection to the ground line is formed at an end of first metal interconnection line 70b.

For contact 64c formed in a lower portion of active region 60a shown in FIG. 35, a rectangular-shaped first metal interconnection line 70c is formed, to provide an intermediate layer for the bit line.

A rectangular first metal interconnection line 70d is formed for power supply contact 64d formed in the N-well active region (active region 60b in FIG. 35), and a via 72d overlapping with power supply contact 64d is formed on first metal interconnection line 70d. A rectangular-shaped first metal interconnection line 70f is formed for power supply contact 64e located under the active region in the N-well, and a via 72e overlapping with contact 64e is formed in the layer above first metal interconnection line 70f. A first metal interconnection line 70e extending in the X direction is contacted with shared contacts 65a and 65b. Vias 72c and 72f are formed in the layer above first metal interconnection line 70e.

First metal interconnection line 70e is formed in the same manufacturing steps as the first metal interconnection lines employed for connecting the internal storage nodes in the memory cell (MC). In the memory cell, contacts electrically connected to active regions 60a and 60d shown in FIG. 35 are arranged instead of vias 72c and 72f, and shared contacts 65a and 65b are electrically isolated (see FIG. 25).

In word line voltage adjusting circuit 58, as shown in FIG. 36, the nodes corresponding to the storage nodes in the memory cell are mutually connected by first metal interconnection line 70e in the same layer as the first metal interconnection lines employed for the storage node connection in the memory cell, and the interconnection layout achieving the diode connection of the load transistors in the memory cell is provided.

A first metal interconnection line 70g of a rectangular form is formed for contact 64f, and a first metal interconnection line 70h of a rectangular form elongated in the X direction is formed for contact 64g. A via 72g is formed at an end of first metal interconnection line 70h. A first metal interconnection line 70i elongated in the Y direction is formed for contact 64d, and a via 72h is formed for first metal interconnection line 70i. Word line voltage adjusting circuit 58 can have an interconnection line layout point-symmetrical with respect to the center thereof.

Figure 37:
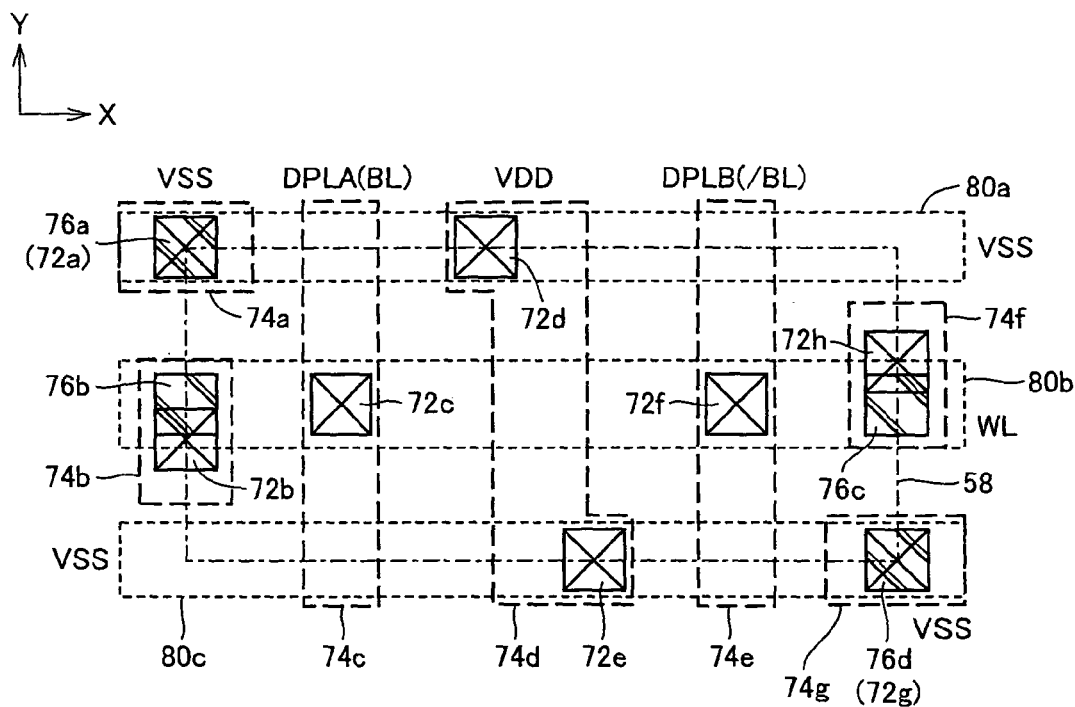
FIG. 37 shows an interconnection line layout in a layer above the interconnection line layout shown in FIG. 36.

FIG. 37 shows an interconnection layout in a layer above the interconnection layout shown in FIG. 36. In FIG. 37, vias corresponding to those in FIG. 36 are allotted with the same reference numerals, and description thereof is not repeated.

In the interconnection layout shown in FIG. 37, a rectangular-shaped second metal interconnection line 74a is arranged in a layer above via 72a, and is provided with a second via 76a overlapping with via 72a.

A rectangular second metal interconnection line 74b elongated in the Y direction is arranged for via 72b, and a third via 76b having a portion overlapping with via 72b is arranged in a layer above second metal interconnection line 74b. A second metal interconnection line 74c extending in the Y direction is arranged for via 72c. Second metal interconnection line 74c forms a clamping power supply line DPLA, and corresponds to bit line BL in memory cell MC.

A second metal interconnection line 74d extending in the Y direction is connected to vias 72d and 72e. Second metal interconnection line 74d transmits power supply voltage VDD for the memory cells.

A second metal interconnection line 74e extending in the Y direction is arranged for via 72f. Second metal interconnection line 74e forms clamping power supply line DPLB, and forms complementary bit line /BL in memory cell MC.

A rectangular-shaped first metal interconnection line 74f elongated in the Y direction is arranged for via 72h, and a second via 76c having a portion overlapping with via 72h is arranged above first metal interconnection line 74f. A rectangular-shaped second metal interconnection line 74g is arranged for via 72g. A via 76d overlapping with via 72g is formed on second metal interconnection line 74g.

Third metal interconnection lines 80a, 80b and 80c each extending in the X direction are arranged with spaces in between. Third metal interconnection line 80a is connected to second metal interconnection line 74a through second/third via 76a. Third metal interconnection line 80b is coupled to second metal interconnection lines 74f and 74b through second vias 76c and 76b, respectively. Third metal interconnection line 80b corresponds to word line WL, and third metal interconnection line 80a corresponds to the ground line transmitting ground voltage VSS.

Third metal interconnection line 80c is coupled to second metal interconnection line 74g through via 76d, and transmits ground voltage VSS.

Ground voltage VSS is transmitted to second metal interconnection lines 74a and 74g through second/third vias 76a and 76d, respectively, and accordingly, the ground voltage and the power supply voltage can be transmitted while preventing a collision between the ground line and power supply line 74d transmitting power supply voltage VDD in the memory cell.

In the structure shown in FIG. 37, the interconnection layout of memory cell MC is the same as that of word line voltage adjusting circuit 58, except for that vias 72c and 72f are not employed. Third metal interconnection line 80b forming word line WL, the ground line and third metal interconnection lines 80a and 80c may be laid out to extend continuously in the X direction and corresponding to the memory cell row.

As shown in FIGS. 35-37, therefore, word line voltage adjusting circuit 58 may be arranged by using the transistor arrangement in memory cell MC and using substantially the same interconnection layout as that, and the same transistor arrangement as memory cell MC can be repeated. Also, the bit lines and clamping power supply lines are be arranged with the same interconnection layers and the same interconnection layout. Without adversely affecting the interconnection layout of the memory cell array, the power supply voltage of the word line driver can be clamped at the level of (VDD-Vthp), and the voltage level of the selected word line can be adjusted according to and closely in linkage with the fluctuations in threshold voltage of the load transistor in the memory cell.

Level shifter LSF includes the transistors arranged in the same layout as memory cell MC. The transistor forming the level shifter may be configured to have the size ratio in a range from 0.8 to 2.0 with respect to the corresponding load transistor in the memory cell, similarly to the second embodiment.

As described above, according to the sixth embodiment of the invention, the word line voltage adjusting circuit or the level shifter is formed in the same transistor arrangement and in substantially the same interconnection line layout as the memory cell is provided for adjusting the voltage level of the selected word line voltage, and therefore, the word line voltage adjusting circuit can be arranged efficiently without adversely affecting the interconnection line layout of the memory cell array.

The level shifter or the word line voltage adjusting circuit having the same transistor arrangement as the memory cell are used, and the selected word line voltage level can be adjusted by accurately reflecting the word line voltage in the variations in electric characteristic of the memory cell transistor closely in linkage with the electric characteristics of the transistors in the memory cell.

Seventh Embodiment

Figure 38:
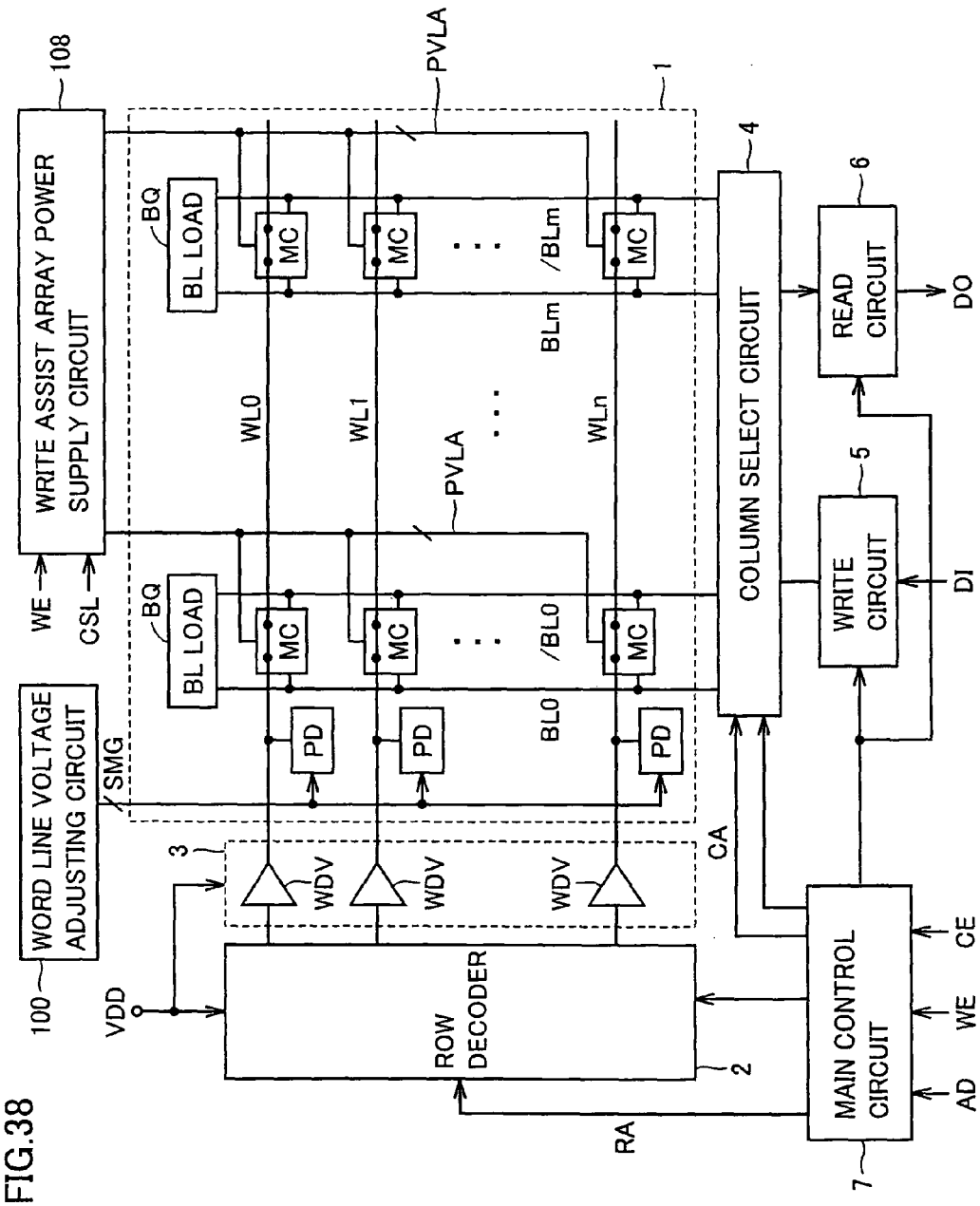
FIG. 38 schematically shows a whole construction of a semiconductor memory device according to a seventh embodiment of the invention.

FIG. 38 schematically shows a whole construction of a semiconductor memory device according to a seventh embodiment of the invention. The semiconductor memory device shown in FIG. 38 differs from the semiconductor memory device shown in FIG. 7 in the following construction.

A word line voltage adjusting circuit 100 is arranged for pull-down elements PD arranged corresponding to respective word lines WL0-WLn for the purpose of adjusting the number of the conductive transistors in these pull-down elements, respectively. As already described in the second embodiment, pull-down element PD includes a plurality of transistor elements coupled in parallel to the corresponding word line. The number of the transistor elements made conductive is adjusted according to a control signal group SMG applied for adjusting the static noise margin from word line voltage adjusting circuit 100. Thereby, the voltage level of the selected word line in the read operation can be optimized in the design stage. In the product manufacturing process, the number of the pull-down transistor elements made conductive is adjusted to compensate for variations in characteristic of the memory cell in linkage with the characteristics of the memory cell, and thereby the voltage on the selected word line is set to the optimum level.

Cell power supply interconnection lines PVLA are arranged corresponding to the memory cell columns, respectively. A write assist array power supply circuit 108 adjusts the voltage levels of cell power supply interconnection lines PVLA in units of columns. Cell power supply interconnection line PVLA, of which construction will be described later, includes a cell power supply line transmitting a high-side power supply voltage VDD to the memory cell and a down power supply line used for lowering the voltage level of the cell power supply line.

Write assist array power supply circuit 108 lowers the voltage level of the cell power supply line (VDD power supply line) in the selected column according to write instruction signal WE and a column select signal CSL in the data write operation, and thereby the operation margin in the write operation is increased. As already described in relation with the second embodiment and others, read-assisting pull-down element PD lowers the voltage level of a selected word line to decrease the driving power of the access transistors, and thereby ensures the read margin. In this case, lowering of the write margin may occur depending on the power supply voltage level. For suppressing the decreasing of write margin, the voltage level of the cell power supply line (VDD power supply line) is slightly lowered to decrease the latching capability of memory cell MC, to increase the write margin. Thereby, fast writing and reading of data can be reliably and stably performed.

In the memory cell on the selected row and an unselected column, the voltage level of the cell power supply line lowers, but a sufficient read margin is ensured because the access transistor has a small driving power. In the memory cell on an unselected row and the selected column, the access transistor is off, and the data can be stably held even when the high-side cell power supply voltage lowers.

Figure 39A:
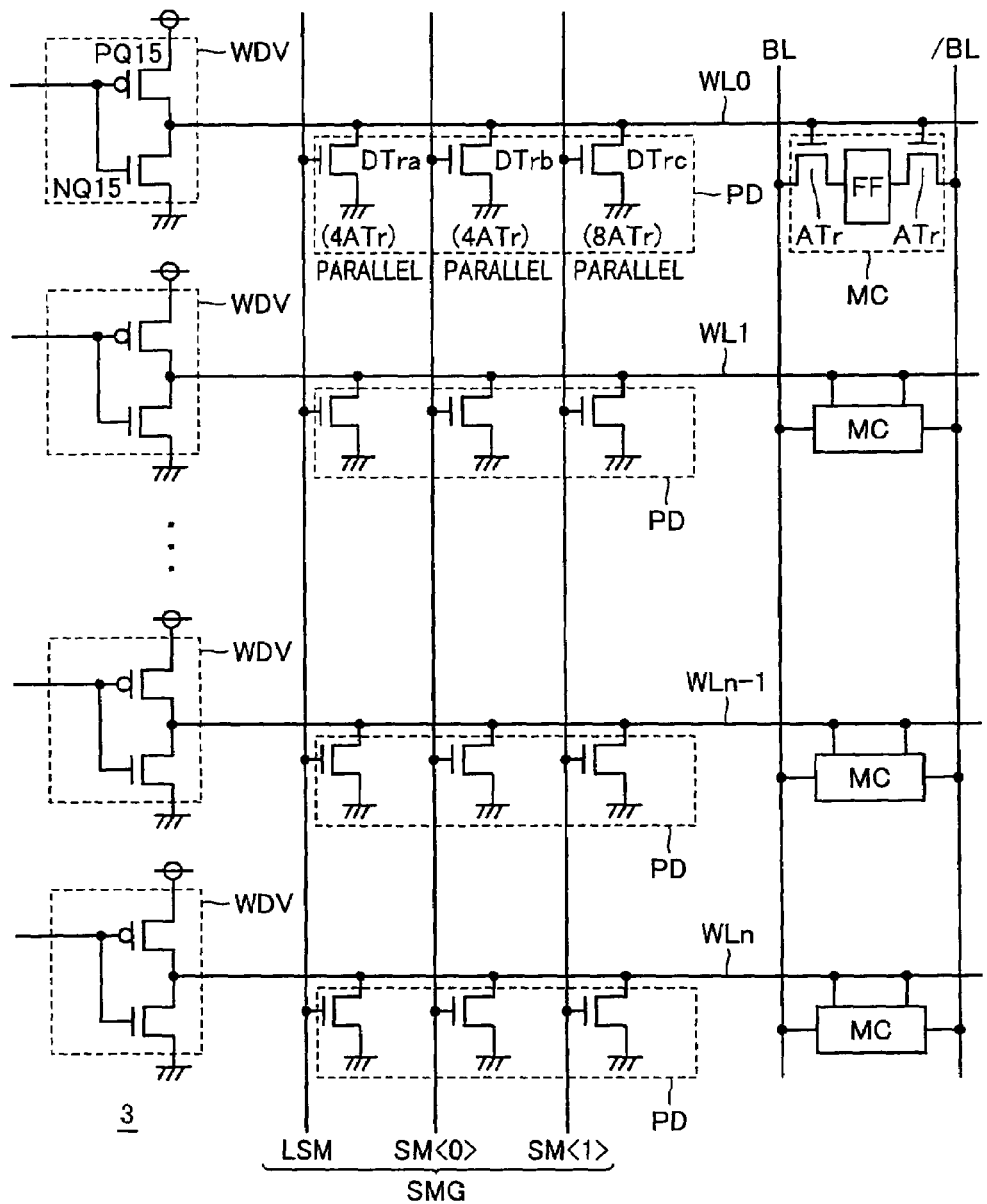
FIGS. 39A and 39B show a specific construction of a pull-down element of the semiconductor memory device shown in FIG. 38.
Figure 39B:
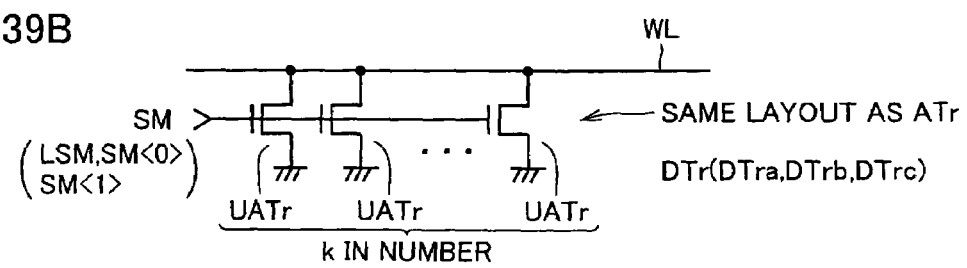

FIGS. 39A and 39B show by way of example the constructions of pull-down element PD and word line driver WDV shown in FIG. 38. In FIG. 39A, word line drivers WDV are arranged corresponding to word lines WL0-WLn, respectively, and the corresponding word line is driven to the selected state according to the word line select signal (decode signal).

Since word line drivers WDV have the same construction, reference characters are assigned to the components of word line driver WDV arranged for word line WL0 in FIG. 39A. Word line driver WDV includes P-channel MOS transistor PQ15 for supplying power supply voltage VDD to a corresponding word line (WL0) according to the word line select signal, and N-channel MOS transistor NQ15 for discharging the corresponding word line (WL0) to the ground voltage level according to the word line select signal.

Memory cells MC are arranged corresponding to the crossings between the bit line pairs BL and /BL and word lines WL0-WLn, respectively. Memory cells MC have the same construction, and the construction of memory cell MC connected to word line WL0 is representatively shown. Memory cell MC includes a flip-flop FF formed of an inverter latch for storing data, and an access transistors ATr connecting the internal storage nodes to bit lines BL and /BL in response to the signal on the corresponding word line (WL0).

Since pull-down elements PD arranged corresponding to respective word lines WL0-WLn have the same constructions, reference characters are assigned to components of pull-down element PD provided for word line WL0 in FIG. 39A. Pull-down element PD includes a pull-down transistor DTra that is selectively made conductive to couple the corresponding word line to the ground node according to a pull-down control signal LSM, a pull-down transistor DTrb that is selectively made conductive to couple the corresponding word line to the ground node according to a pull-down control signal SM<0>, and a pull-down transistor DTrc that is selectively made conductive according to a pull-down control signal SM<1 > to couple the corresponding word line (WL0) to the ground node.

Each of pull-down transistors DTra and DTrc is formed of a parallel connection of transistors (replica transistors) having the same threshold voltage characteristics (the same layout) as access transistor ATr in memory cell MC. In the example shown in FIG. 39A, each of pull-down transistors DTra and DTrb is formed of four replica access transistors ATr, and pull-down transistor DTrc is formed of eight replica access transistors ATr.

FIG. 39B shows a construction of pull-down transistor DTr (one of transistors DTra-DTrc) shown in FIG. 39A. In FIG. 39B, pull-down transistor DTr (DTra, DTrb or DTrc) includes a plurality of unit transistors (replica access transistors) UATr connected in parallel between word line WL and the ground node. Unit transistors UATr each have the same layout as access transistor ATr in memory cell MC, and are arranged for the word line with the same gate electrode pitch and the same gate-contact distance as those of access transistors ATr in memory cell MC. The layout of the pull-down transistor will be described later.

Unit transistors UAtr of k in number are arranged in parallel, and are made conductive in parallel according to control signals SM (LSM, SM<0> and SM<1>). Assuming that each unit transistor has on-resistance Rn, the combined on-resistance of k unit transistors UATr is equal to Rn/k. Therefore, the control signals can set the number of unit transistors UATr to be made conductive, whereby the resistance ratio to the on-resistance of pull-up transistor PQ15 of word line driver WDV can be adjusted, so that the selected word line can be set to the optimum voltage level.

As shown in FIG. 39A, pull-down element PD includes pull-down transistor DTr formed of the transistors (replica access transistors) that have the same layout as access transistors ATr in memory cell MC. Therefore, the transistor parameters of pull-down element PD such as the threshold voltage characteristics and the on-resistance can reflect the variations in transistor parameters of the drive transistors included in flip-flop FF through access transistors ATr in memory cell MC. Similarly to the foregoing case where the pull-down element is formed of the dummy cells in FIG. 22, therefore, the potential drop quantity of each of word lines WL0-WLn can be adjusted according to the degree of fluctuations in threshold voltage of access transistors ATr in memory cell MC, so that the decreasing of the static noise margin of memory cell MC can be suppressed, and the read margin can be increased.

In particular, control signals LSM, SM<0> and SM<1> are used for selectively making conductive pull-down transistors DTra, DTrb and DTrc in pull-down element PD. By this construction, the combined on-resistance of pull-down element PD can be minutely and sophisticatedly adjusted. In the design stage, the dividing ratio of the resistance-dividing circuit determined by the on-resistance of P-channel MOS transistor PQ15 included in word line driver WDV and the combined on-resistance of pull-down element PD can be set to the optimum value according to the characteristics of memory cell MC. When starting up the production, the voltage level of the selected word line is finely adjusted with these control signals before the manufacturing process is settled in the manufacturing steps, and thereby the read and write margins are optimized. In the mass-production stage where the manufacturing process is established, the word line voltage level is adjusted according to the margin of the memory cell, and thereby the product yield can be improved.

Control signals LSM, SM<0> and SM<1> are included in control signal group SMG applied from word line voltage adjusting circuit 100 shown in FIG. 38. In the test steps of the semiconductor memory device, tests are performed on the characteristics such as read and write margins by successively and selectively driving control signals LSM, SM<0> and SM<1> to the selected state. According to the result of these tests, control signals LSM, SM<0> and SM<1> have the potential levels fixed, e.g., by a fuse program circuit.

Control signal LSM may be configured to be normally to the selection state as a so-called "default". When only one control signal LSM is kept active, and both control signals SM<0> and SM<1> are kept in the unselected state, the resistance value of the pull-down element takes the maximum value, the potential of the selected word line lowers a minimum quantity, and memory cell MC has maximum static noise margin SNM. As static noise margin SNM decreases, the number of pull-down unit transistors UATr kept is increased.

Figure 40:
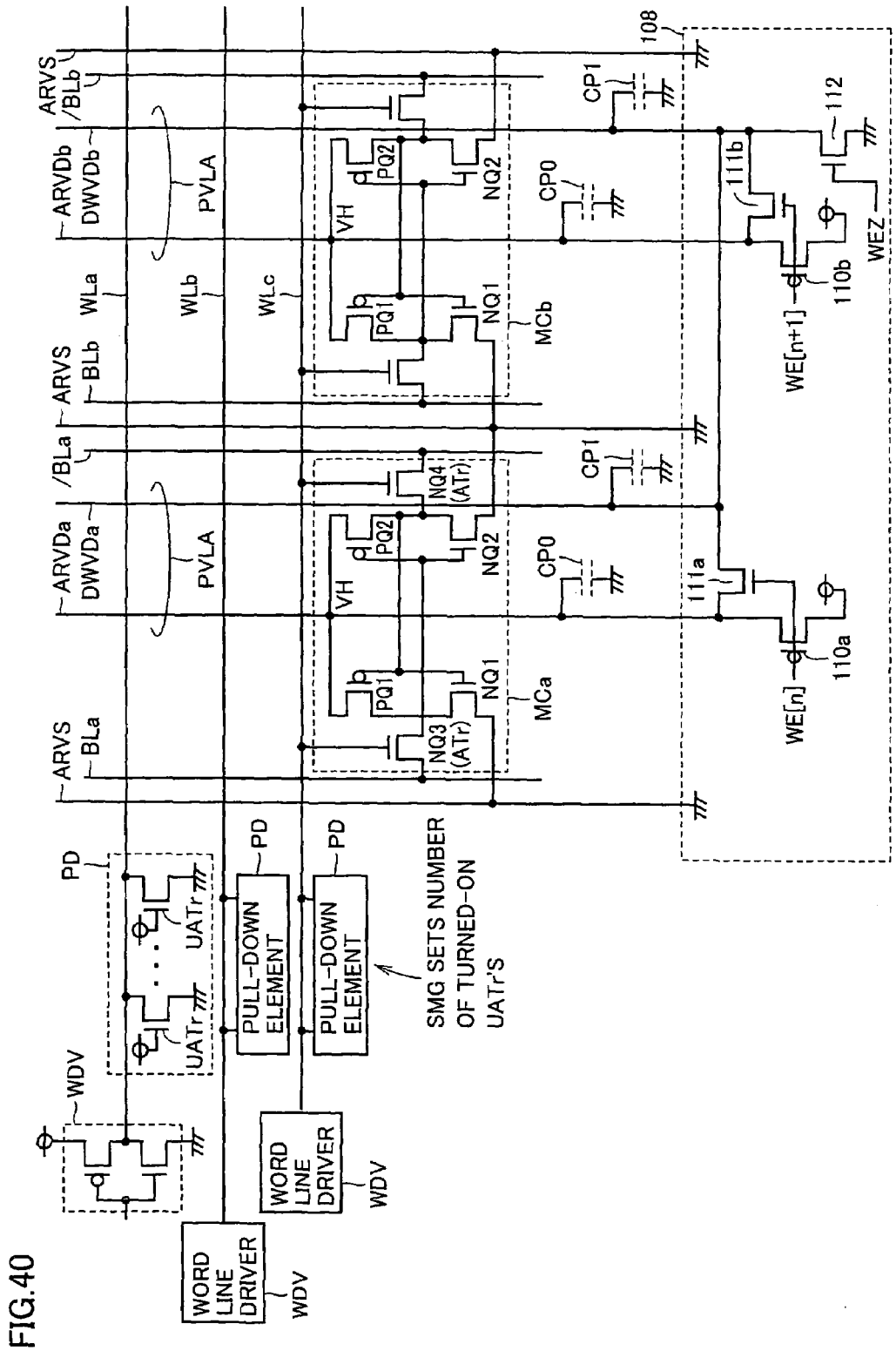
FIG. 40 shows a construction of a main portion of a semiconductor memory device shown in FIG. 38.

FIG. 40 specifically shows a construction of a main portion of a semiconductor memory device shown in FIG. 38. FIG. 40 shows memory cells MCa and MCb arranged in one row and two columns as typical examples of memory cells MC. Each of word lines WLa-WLc is connected to memory cells MC. Word line driver WDV and pull-down element PD are arranged for each of word lines WLa-WLc. Control signal group SMG shown in FIGS. 39A and 39B selectively turns on unit transistors (replica access transistors) UATr in pull-down element PD. FIG. 40 does not show the unit transistors that are kept off. Since the control signals in control signal group SMG are set to the power supply voltage level when in selected state, FIG. 40 shows the state in which the gates of turned-on unit transistors UATr in pull-down element PD are connected to the power supply node.

Memory cell MCa is connected to bit lines BLa and /BLa, and memory cell MCb is coupled to bit lines BLb and /BLb.

Cell power supply interconnection lines PVLA includes cell power supply lines ARVD (ARVDa and ARVDb) and down power supply lines DWVD (DWVDa and DWVDb). Cell ground lines ARVS each extending linearly in the column direction are arranged for memory cells MCa and MCb, respectively. Cell ground line ARVS is shared between two memory cells adjacent to each other in the row direction. Cell power supply lines ARVDa and ARVDb are coupled to high-side power supply nodes VH of memory cells MCa and MCb in the corresponding columns, and have parasitic capacitances CP0, respectively. Each of down power supply lines DWVDa and DWVDb likewise has a parasitic capacitance CP1 caused by its line capacitance.

Down power supply lines DWVDa and DWVDb corresponding to the two columns are commonly connected. Cell power supply line ARVD is connected to high-side power supply node VH of the memory cells in the corresponding column. In the read operation and standby state, down power supply line DWD is coupled to the ground node, and is not connected to the memory cells. Therefore, the line capacitance of cell power supply line ARDV is larger than that of down power supply line DWDV because there is a parasitic capacitance of the load transistors of the memory cells. For eliminating this difference in line capacitance to lower the voltage level of the cell power supply line in the selected state, a plurality of down power supply lines DVDW are handled as one group, and are coupled to cell power supply line ARDV in the selected column.

Write assist array power supply circuit 108 adjusts the voltage level of the cell power supply line on a column-by-column basis, or in units of memory cell columns in the data write operation. Specifically, write assisting array power supply circuit 108 includes a P-channel MOS transistor (insulated gate field effect transistor) 110a that is rendered conductive to couple cell power supply line ARVDa to the power supply node when a write column instruction signal WE[n] is unselected, an N-channel MOS transistor 111a that is rendered conductive to couple cell power supply line ARVDa to down power supply lines DWVDa and DWVDb when write column select signal WE[n] is selected, a P-channel MOS transistor 110b that is rendered conductive to couple cell power supply line ARVDb to the power supply node when write column instruction signal WE[n+1] is unselected, an N-channel MOS transistor 111b that is rendered conductive to couple cell power supply line ARVDb to down power supply lines DWVDa and DWVDb when write column instruction signal WE[n+1] is selected, and an N-channel MOS transistor 112 that is rendered conductive to couple down power supply lines DWVDa and DWVDb to the ground node when a write instruction signal WEZ is inactive (during standby or in the data read operation).

Write column instruction signals WE[n] and WE[n+1] are driven to the selected state (H-level) when the corresponding memory cell columns (bit lines BLa and /BLa, and BLb and /BLb) are selected in the data write operation. Write instruction signal WEZ is set to the L level in the write mode. In the write mode, therefore, down power supply lines DWVDa and DWVDb are maintained in the electrically floating state at the ground voltage level. Cell power supply line ARVD (ARVDa or ARVDb) in the write column is connected to down power supply lines DWVDa and DWVDb. Therefore, through the capacitance division by the capacitance circuit of parasitic capacitances CP0 and 2·CP1 of charges accumulated on cell power supply line ARDV, the voltage level of cell power supply line ARVD (ARVDa or ARVDb) lowers in the selected column.

Figure 41:
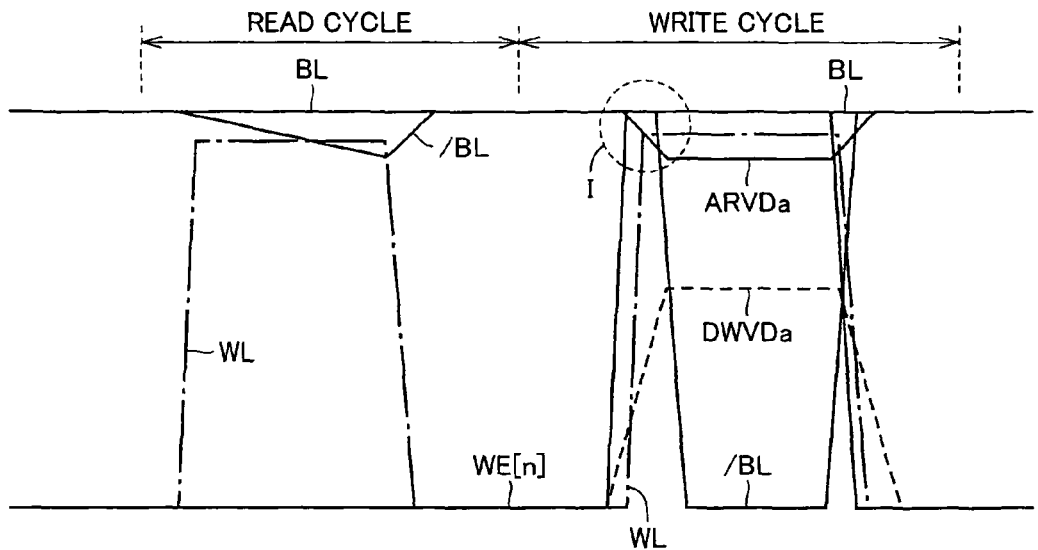
FIG. 41 is a signal waveform diagram representing an operation of the semiconductor memory device shown in FIG. 38.

FIG. 41 represents the operation of write assist array power supply circuit 108 shown in FIG. 40.

In the read cycle during which data reading is performed, word line driver WDV corresponding to a selected row drives corresponding word line WL to the selected state. In this operation, pull-down element PD sets the voltage on the selected word line WL to the level lower than the array power supply voltage (bit line precharge voltage). When word line WL is driven to the selected state, access transistors ATr (NQ3 and NQ4) of the memory cell in the corresponding row turns conductive to lower the voltage level of the bit line (/BL) connected to the storage node storing the L level data.

In the read cycle, both write column instruction signals WE[n] and WE[n+1] are at the L level, and write instruction signal WEZ is at the H level. In write assist array power supply circuit 108, therefore, MOS transistors 110a and 110b are in the on state, and MOS transistors 111a and 111b are in the off state. Therefore, high-side power supply node VH of each memory cell is supplied with the cell power supply voltage via cell power supply line ARVD (ARVDa or ARVDb). The access transistor has a small conductance, and accordingly, the current driving power is small so that the static noise margin of the memory cell in this selected row is large, and the data can be stably read.

In the write cycle during which data writing is performed, write instruction signal WEZ is set to the L level, and MOS transistor 112 in write assist array power supply circuit 108 is in the off state. Thereby, down power supply lines DWVDa and DWVDb enter the floating state at the ground voltage level. The write column instruction signal (WE[n]) for each column is driven to the H level according to the write instruction signal and the column select signal that is applied from the column select circuit according to a column address signal (not shown). Accordingly, MOS transistor 110a is turned off, and MOS transistor 111a is turned on, so that cell power supply line ARVDa for memory cell MCa is isolated from the power supply node, and is electrically connected to down power supply lines DWVDa and DWVDb. The charges accumulated in parasitic capacitance CP0 of cell power supply line ARVDa are distributed to parasitic capacitances CP1 of down power supply lines DWVDa and DWVDb, and the voltage level of cell power supply line ARVDa lowers in proportion to the capacitance ratio between parasitic capacitances CP0 and CP1.

FIG. 41 shows a state in which cell power supply line ARVDa and down power supply line DWVDa are maintained at different levels, respectively. This is because the on-resistances of switching MOS transistors 111a and 111b cause the voltage distribution (gradation). Since parasitic capacitance CP0 of cell power supply line ARDV is much greater than parasitic capacitance CP1 of down power supply line DVDW, the degree of potential drop of cell power supply line ARVD is sufficiently small even when these power supply lines ARVD and DWDV are at the same voltage level, and therefore the data held in an unselected memory cell is not destructed. When cell power supply line ARVD and down power supply line DWDV have the same potential, a voltage Vs on these lines is expressed by the following equation:

$$Vs = CP0 \cdot VDD \cdot (CP0 + CP1).$$

When switching MOS transistors 111a and 111b are configured to have relatively large on-resistances and cell power supply line ARDV and down power supply line DWDV are intentionally set to the different voltage levels, respectively, lowering of the voltage level of cell power supply line ARVDa can be reliably suppressed, and it is possible to inhibit the static noise margin of the unselected memory cell from lowering to invert the held data.

The lowered voltage of the cell power supply line is merely required to be at the level that can compensate for the lowering of the write margin caused by lowering of the driving power of the access transistor due to lowering of the voltage level of the selected word line, and can sufficiently maintain the static noise margin of the unselected memory cell.

The power supply voltage of cell power supply line ARVDa is connected to high-side power supply node VH of memory cell MCa. Therefore, load MOS transistors PQ1 and PQ2 have small current driving powers (because the source voltage lowers to decrease the source to gate voltage of the load transistor receiving L level data on the gate). The current driving power of access transistors ATr (NQ3 and NQ4) are the same as that in the data read operation, and does not change. Therefore, the write margin of memory cell MCa in the selected column increases, and the storage node storing the H level data is quickly discharged to the L level according to the write data. Thus, data can be written fast into the selected memory cell according to the data transmitted onto bit lines BL and /BL.

When the data writing is completed, the bit line load circuit restores bit lines BL and /BL to the array power supply voltage level, and word line WL is driven to the unselected state. Then, write column select signal WE[n] attains the unselected state, and MOS transistor 111a is turned off, and MOS transistor 110a and 112 are turned on. Responsively, down power supply lines DWVDa and DWVDb are driven to the ground voltage level again, and cell power supply line ARVDa returns to the array power supply voltage level.

Figure 42:
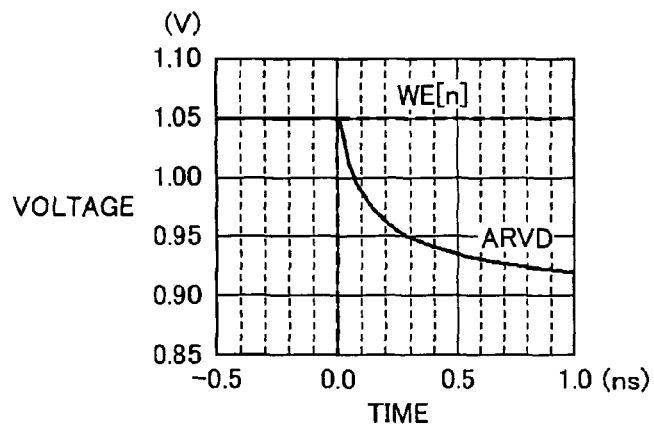
FIG. 42 represents, on an enlarged scale, signal waveforms in a region I shown in FIG. 41.

FIG. 42 shows, on an enlarged scale, signal waveforms in a region I represented by broken line in FIG. 41. In FIG. 42, the ordinate axis measures the voltage (V), and the abscissa axis measures the time (ns). As shown in FIG. 42, when write column select signal WE[n] is driven to the selected state, the voltage level of cell power supply line ARVD lowers fast. This is caused not by charging from the power supply node but merely through movement of charges between the capacitances. Since the charges move fast between the conductive lines (power supply lines), the voltage level of cell power supply line ARVD in the selected column can be dropped fast. For example, the voltage level of the cell power supply line lowers about 100 mV when 0.3 ns elapses after start of the write operation.

Only the movement of charges is caused through the use of the parasitic capacitances of the down and cell power supply lines, and it is not necessary to switch the voltage on this cell power supply line in the write and read operations through the use of another power supply line, so that the construction of the power supply circuitry can be made simple. The movement of charges occurs merely between the capacitance elements, and a path conducting a through-current is not present between the cell power supply line and the ground node in the write cycle, so that the power consumption can be low.

The voltage level of cell power supply line ARVDa in the write operation can be adjusted by setting the capacitance ratio of an appropriate value between parasitic capacitance CP0 of cell power supply line ARVD (ARVDa and ARVDb) and parasitic capacitance CP1 of down power supply line DWVD (DWVDa and DWVDb). According to the voltage level of the selected word line set by the pull-down element, the voltage level of the cell power supply line in the selected column is set to an optimum level in the write operation.

In the arrangement shown in FIG. 40, down power supply lines DWVDa and DWVDb arranged in two columns are short-circuited or electrically coupled to cell power supply line ARVD (ARVDa or ARVDb) in the selected column during the data write operation. However, each down power supply line may be arranged for four columns depending on the voltage level of the cell power supply line in the write operation and the capacitance values of parasitic capacitances CP0 and CP1, and the cell power supply line in the selected column may be coupled to the corresponding down power supply line. Further, the cell power supply line in the selected column may be coupled to one down power supply line.

Figure 43:
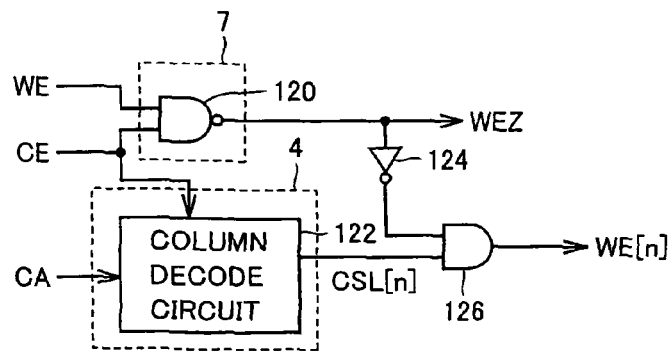
FIG. 43 shows an example of a construction of a portion generating a control signal shown in FIG. 40.

FIG. 43 shows an example of a construction of a portion for generating write instruction signal WEZ and write column instruction signal WE[n] shown in FIG. 40. In FIG. 43, an NAND circuit 120 included in main control circuit 7 shown in FIG. 38 generates write instruction signal WEZ. NAND circuit 120 externally receives write enable signal WE and chip enable signal CE, and sets write instruction signal WEZ to the L level indicative of the active state when both the signals WE and CE are active (H level).

Write column instruction signal WE[n] is produced from an AND circuit 126 that receives write instruction signal WEZ applied via an inverter 124 and column select signal CSL[n] applied from column decode circuit 122. AND circuit 126 is arranged for each column in the memory cell array, and produces write column instruction signal WE[i] for the corresponding column according to column select signal CSLi in the write operation.

Column decode circuit 122 is included in column select circuit 4 shown in FIG. 38. When chip enable signal CE is active, column decode circuit 122 decodes column address signal CA received from main control circuit 7, and drives column select signal CSL[n] corresponding to the selected column to the H level indicative of the selected state.

Write column instruction signal WE[n] turns active and attains the H level when write instruction signal WEZ is at the L level indicating the write mode and column select signal CSL[n] is at the H level to designate the corresponding column (bit line pair BLa and /BLa).

According to the seventh embodiment of the invention, as describe above, the pull-down element is formed of a plurality of unit transistors (replica access transistors) selectively set to the on state according to the control signals. In the design stage, therefore, the word line voltage level for the read operation can be finely adjusted until the word line voltage level is set to the optimum value, and the word line voltage level achieving the optimum operation characteristics can be achieved. In the actual mass-production stage, the number of the replica access transistors to be turned on can be adjusted in each product according to the variations in threshold voltage of the memory cells, and thereby the optimum voltage level can be set.

The write assist array power supply circuit is used, and the voltage level of the cell power supply line arranged for each column is lowered by the movement of charges between the parasitic capacitances caused by the electric coupling to the down power supply line. Even in the case where the voltage level of the selected word line is low, the level of the high-side power supply voltage of the selected memory cell is rapidly lowered in the data write operation so that the write margin can be increased. Thereby, it is possible to provide the semiconductor memory device that can stably and rapidly write and read the data even with a low power supply voltage.

In the foregoing description, word lines WL have the non-hierarchical configuration. However, the word lines may have a hierarchical word line configuration divided into main words lines and sub-word lines as already described in the previous embodiment. Pull-down element PD is arranged for each sub-word line.

[Layout of Pull-Down Element]

Pull-down element PD arranged for each word line is implemented by using the replica transistors (having the same layout and the threshold voltage characteristics as the access transistors) of the access transistors included in the memory cell. Since the replica transistors of the access transistors of the memory cells are arranged, the replica transistors having the same layout as the access transistors in the memory cells can be formed through the same manufacturing steps as the memory cells, similarly to the case (fifth embodiment shown in FIG. 22) of using the dummy cells already described in connection with the foregoing embodiment. Description will now be given on the layout of the replica access transistors forming the pull-down elements and the layout of the memory cells.

Figure 44:
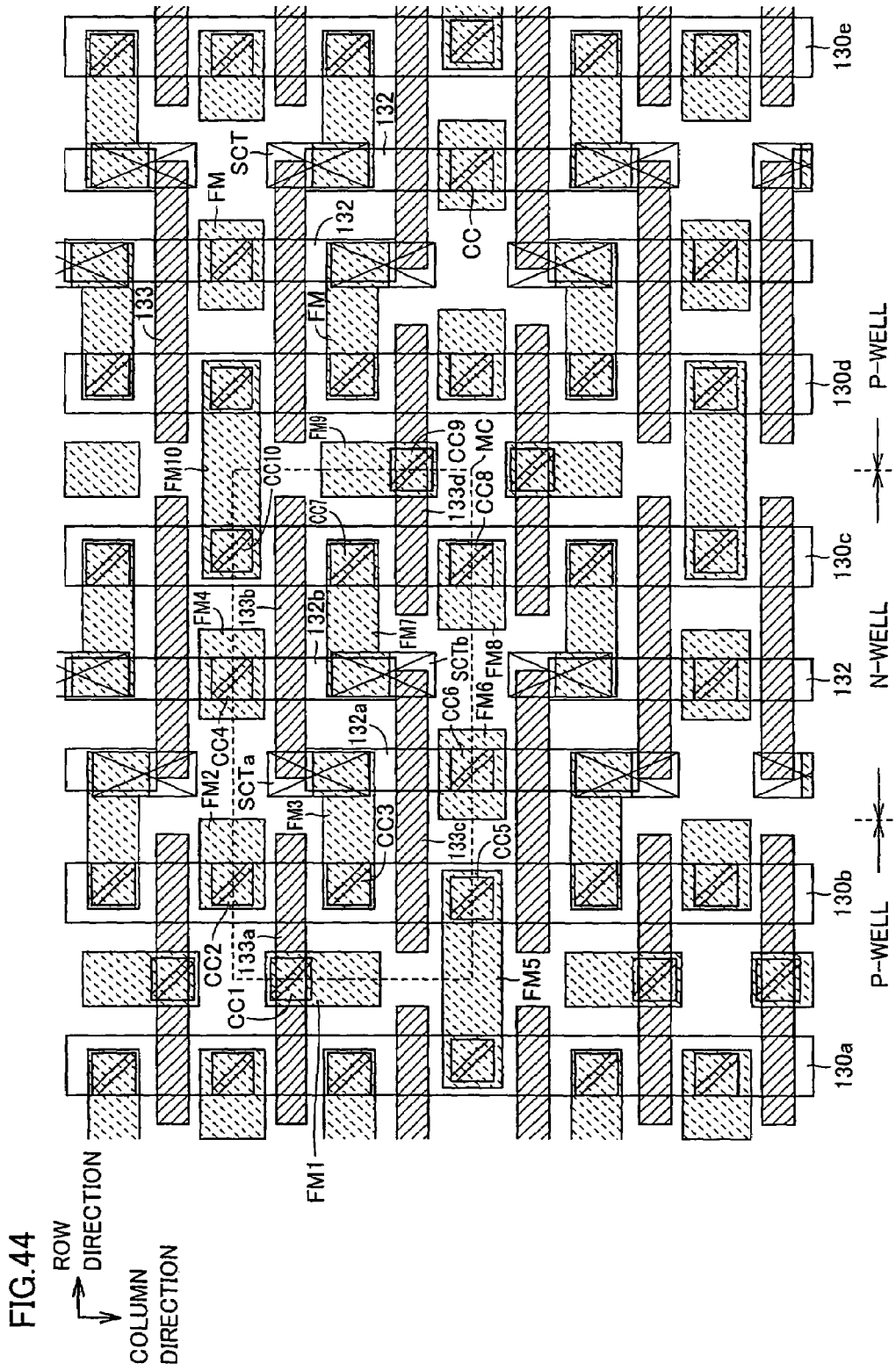
FIG. 44 shows a planar layout of active regions of memory cells and first metal interconnection lines according to a seventh embodiment of the invention.

FIG. 44 shows a layout of active regions, first metal interconnection lines and components formed in a memory cell array. In FIG. 44, N-type active regions 130a-130e extend linearly in the column direction with spaces in between. N-type active regions 130a-130e are formed in P-well regions. In these N-type active regions 130a-130e, the access transistors and drive transistors (N-channel MOS transistors) of memory cells MC are formed.

In the layout of the memory cell array shown in FIG. 44, the arrangement of memory cells MC that form mirror images symmetrical with respect to a boundary in between is repeated in the row and column directions. In FIG. 44, therefore, reference characters are assigned to the interconnection lines and contacts for memory cell MC for the sake of simplicity. In the region of memory cell MC, P-type active regions 132a and 132b each having a rectangular form elongated in the column direction are arranged being staggered and spaced from each other. Load transistors (P-channel MOS transistors) are formed in P-type active regions 132a and 132b.

A gate electrode 133a extends in the row direction across N-type active region 130b. Gate electrode 133a is electrically connected to first metal interconnection line FM1 through a contact CC1. First metal interconnection line FM1 has a rectangular form elongated in the column direction, and is used as an intermediate layer for making contact with the interconnection line in an upper layer.

Active regions 130b and 132a are electrically coupled by first metal interconnection line FM3 to a contact CC3 and a shared contact SCTa. Shared contact SCTa is electrically connected to a gate electrode 133b extending in the row direction, and couples active region 132a to gate electrode 133b. Gate electrode 133b extends in the row direction across active regions 132b and 132c, and is arranged in the region of memory cell MC.

In the boundary region of memory cells MC, first metal interconnection lines FM2 and FM4 are arranged adjacent to gate electrodes 133a and 133b, respectively. First metal interconnection lines FM2 and FM4 are connected to active regions 130b and 132b through contacts CC2 and CC4, respectively.

Active region 132b is also coupled to active region 130c via a first metal interconnection line FM7. First metal interconnection line FM7 is coupled to impurity region 130c through contact CC7, and is coupled to impurity active region 132b and a gate electrode 133c through shared contact SCTb. Gate electrode 133c is arranged extending in the row direction across active regions 132a and 130b within in memory cell MC.

First metal interconnection lines FM5 and FM6 are arranged adjacent to gate electrode 133c. First metal interconnection line FM5 is electrically coupled to impurity region 130b through contact CC5, and first metal interconnection line FM6 is coupled to active region 132a through a contact CC6.

A gate electrode 133d crossing impurity regions 130c and 130d are aligned in the row direction with gate electrode 133c with a space in between. Gate electrode 133d is coupled to a first metal interconnection line FM9 through a contact CC9.

A first metal interconnection line FM10 is arranged facing first metal interconnection line FM9 and gate electrode 133b. First metal interconnection line FM10 is electrically connected to active region 130c through a contact CC10, and is coupled to active region 130b via a contact (CC).

The above arrangement of memory cell MC is mirror-symmetrically repeated in the row and column directions, first metal interconnection lines FM, shared contacts SCT, P-type active regions 132 and contacts CC are arranged, and memory cells MC are arranged in rows and columns.

As shown in FIG. 44, all the gate electrodes have rectangular forms elongated in the row direction, respectively, and the gate electrodes and contacts are arranged at equal pitches in the column direction in active regions 132a-132e. Therefore, the access transistors and drive transistors can be arranged in the same pattern, and variations in characteristic of these transistors can be suppressed.

The active region extends linearly in the column direction. Therefore, all the interconnection lines and the active regions are arranged linearly in the layout, which simplifies the layout of the memory cells, and can eliminate the influence of the edge effect of the interconnection lines.

Figure 45:
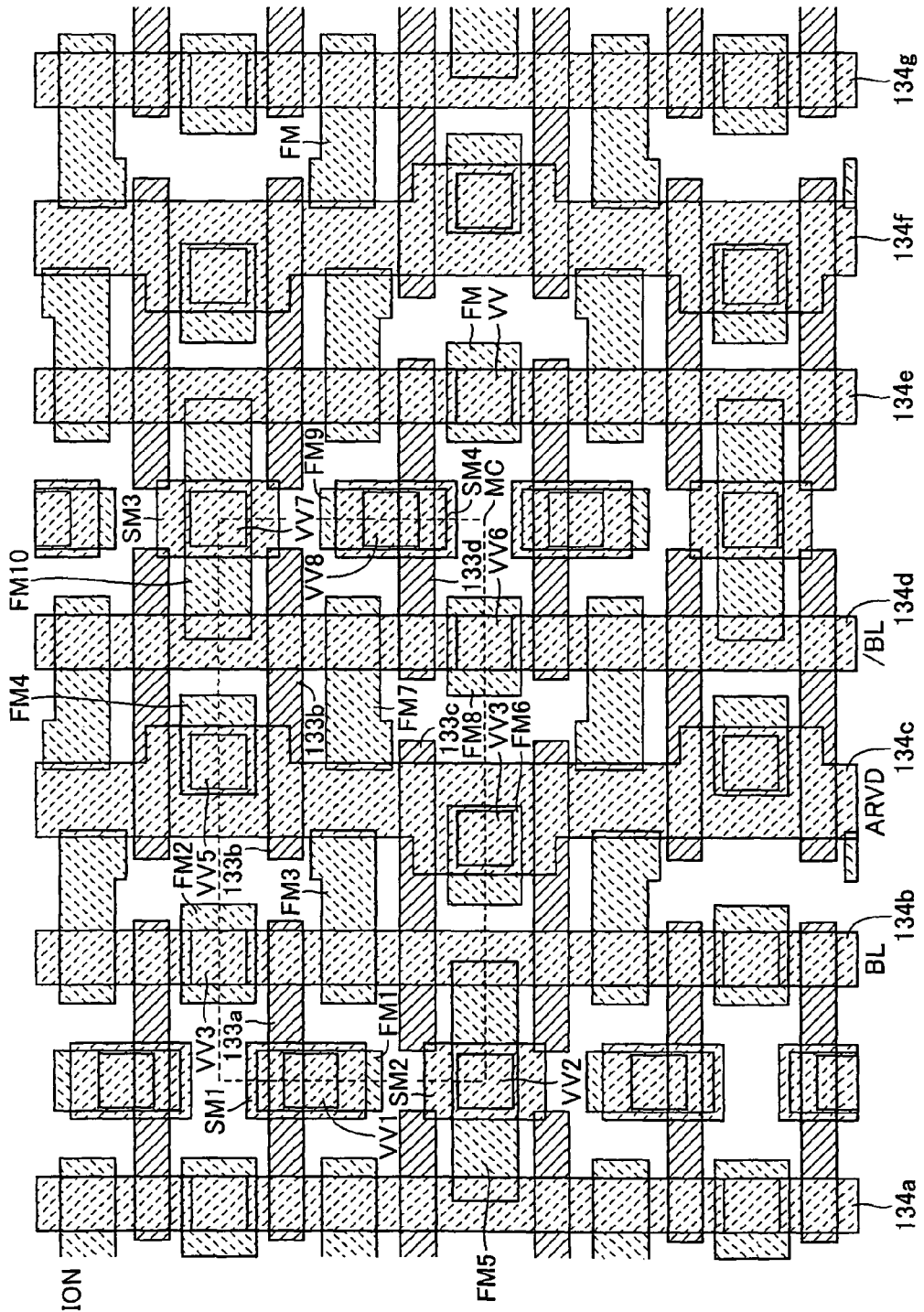
FIG. 45 shows a layout of second metal interconnection lines in a layer above the interconnection line layout shown in FIG. 40.

FIG. 45 shows a layout of the gate electrodes and the first metal interconnection lines shown in FIG. 44 as well as second metal interconnection lines in the upper layer. In FIG. 45, second metal interconnection lines 134a-134g each corresponding to the N-type active region and the two columns of the P-type active regions extend linearly in the column direction. Second metal interconnection lines 134b and 134d arranged corresponding to N-type active regions 134b and 134c in FIG. 44 form bit lines BL and /BL, respectively, and second metal interconnection line 134c arranged corresponding to P-type active regions 132a and 132b in FIG. 44 forms cell power supply line ARVD, and transmits the cell power supply voltage to the load transistors in memory cells MC in the corresponding column.

In FIG. 45, the interconnection layout for memory cell MC is repeated mirror-symmetrically in the row and column directions, so that the reference characters are assigned to only the interconnection lines of memory cell MC.

In FIG. 45, gate electrodes 133a-133d correspond to gate electrode interconnection lines 133a-133d shown in FIG. 44, respectively. First metal interconnection line FM1 provided for gate electrode interconnection line 133a is coupled to second metal interconnection line SM1 through via VV1. Likewise, first metal interconnection line FM5 is coupled to second metal interconnection line SM2 through via VV2. This second metal interconnection line SM2 is used for transmitting a cell ground voltage ARVSS.

First metal interconnection line FM2 is electrically coupled to second metal interconnection line 134b through via VV3. Likewise, first metal interconnection line FM4 is coupled to second metal interconnection line 134 through a via VV5. First metal interconnection line FM6 is coupled to second metal interconnection line 134c through via VV3.

First metal interconnection line FM8 is coupled to second metal interconnection line 134d through a via VV6. Likewise, first metal interconnection line FM9 coupled to gate electrode 133d is coupled to second metal interconnection line SM4 through a via VV8.

First metal interconnection line FM10 is coupled to second metal interconnection line SM3 through a via VV7. Second metal interconnection line SM3 coupled to via VV3 is used for transmitting the cell ground voltage. These second metal interconnection lines SM1-SM4 are used as intermediate layers for making electric contact between the corresponding first metal interconnection lines and upper layer interconnection lines.

First metal interconnection lines FM3 and FM7 connect the transistors to the storage nodes in memory cell MC, and are not connected to the metal interconnection lines in an upper layer.

Similarly to the arrangement in memory cell MC, vias VV, first metal interconnection lines FM and second metal interconnection lines SM are arranged in the memory cell array mirror-symmetrically aligned in the row and column directions.

Figure 46:
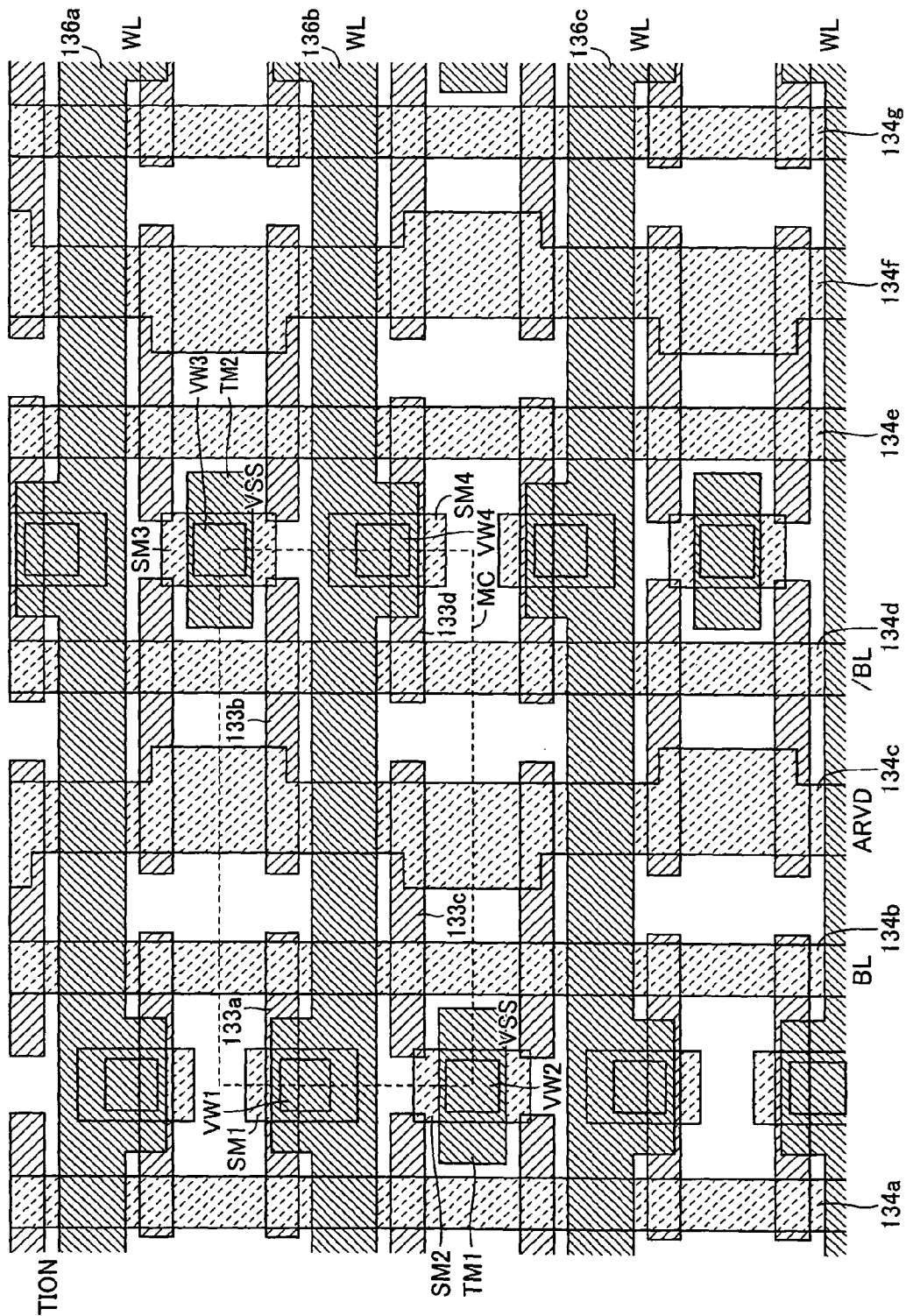
FIG. 46 shows a layout of third metal interconnection lines in a layer above the planar layout shown in FIG. 45.

FIG. 46 schematically shows the layout of the second and third metal interconnection lines in the memory cell array together with the layout of the gate electrodes. FIG. 46 shows gate electrodes 133a-133d arranged for memory cell MC.

In FIG. 46, third metal interconnection lines 136a-136c extend continuously and linearly in the row direction with spaces in between. Third metal interconnection lines 136a-136c have mirror-symmetrical interconnection layout at connection portions to the access transistors in the column direction.

In FIG. 46, the reference characters are assigned to the components of memory cell MC, and are not assigned to other portions. The above interconnection line layout for memory cell MC is mirror-symmetrically repeated in the row and column directions.

In the region of memory cell MC, third metal interconnection line 136b is coupled through a via VW1 to second metal interconnection line SM1 coupled to gate electrode 133a. Likewise, third metal interconnection line 136b is coupled through a via VW4 to second metal interconnection line SM4 coupled to gate electrode 133b. Second metal interconnection line SM2 is coupled to a third metal interconnection line TM1 through a via VW2. In memory cell MC, second metal interconnection line SM3 arranged at point-symmetrical portion to second metal interconnection line SM2 is coupled through a via VW3 to a third metal interconnection line TM2.

Each of third metal interconnection lines 136a-136c forms word line WL, and transmits a row select signal. Accordingly, each of third metal interconnection lines 136a-136c is electrically coupled at each contact portion to the gate electrodes of the two access transistors.

Figure 47:
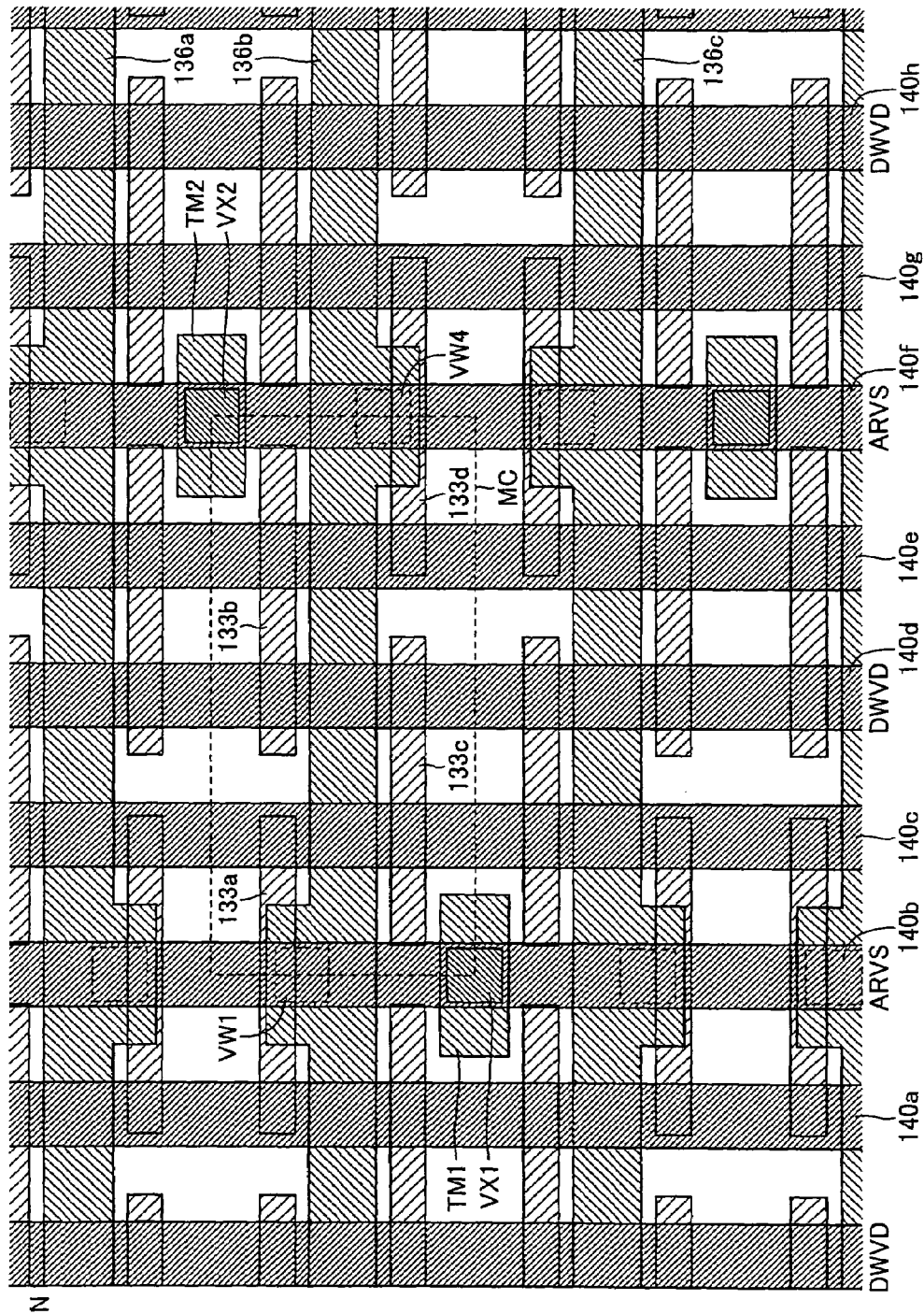
FIG. 47 shows a layout of fourth metal interconnection lines in a layer above the interconnection line layout shown in FIG. 46.

FIG. 47 shows the layout of third and fourth metal interconnection lines in the memory cell array together with the interconnection layout of the gate electrodes according to the seventh embodiment of the invention. In FIG. 47, the gate electrodes in memory cell MC are assigned reference numerals 133a-133d, respectively. The interconnection layout of memory cell MC is mirror-symmetrically repeated in the row and column directions.

In FIG. 47, fourth metal interconnection lines 140a-140h extend linearly in the column direction, and substantially overlap with the second metal interconnection lines shown in FIG. 46 in the planar layout. For memory cell MC, fourth metal interconnection line 140b is coupled to third metal interconnection line TM1 through a via VX1. Third metal interconnection line TM1 is coupled to active region 130b shown in FIG. 44, and is coupled to a source node of the drive transistor in the memory cell. Fourth metal interconnection line 140b is used as cell ground line ARVS transmitting the cell ground voltage.

Fourth metal interconnection line 140d substantially overlaps with second metal interconnection line 134c shown in FIG. 46 in the planar layout. Fourth metal interconnection line 140d is used as down power supply line DWVD, is not connected to a component of memory cell MC, and is selectively and electrically connected to the cell power supply (see FIG. 45) formed in the lower layer in the data write operation.

Fourth metal interconnection line 140f is likewise coupled to third metal interconnection line TM2 through a via VX2 in memory cell MC. As shown in FIG. 44, third metal interconnection line TM2 is coupled to active region 130c, and is coupled to the source nodes of the drive transistors in memory cell MC. Fourth metal interconnection line 140a is used as cell ground line ARVS.

Fourth metal interconnection lines 140a, 140c, 140e and 140g are not coupled to memory cell MC. These fourth metal interconnection line 140a, 140c, 140e and 140g may be used, e.g., as signal lines for transmitting control signals (write column select signal) for adjusting the voltage level of the cell power supply line or the write instruction signal in the data write operation. Also, these interconnection lines may be used as an interconnection line layer transmitting some other control signals. Further, these may be used merely as shield lines for the bit lines.

Figure 48:
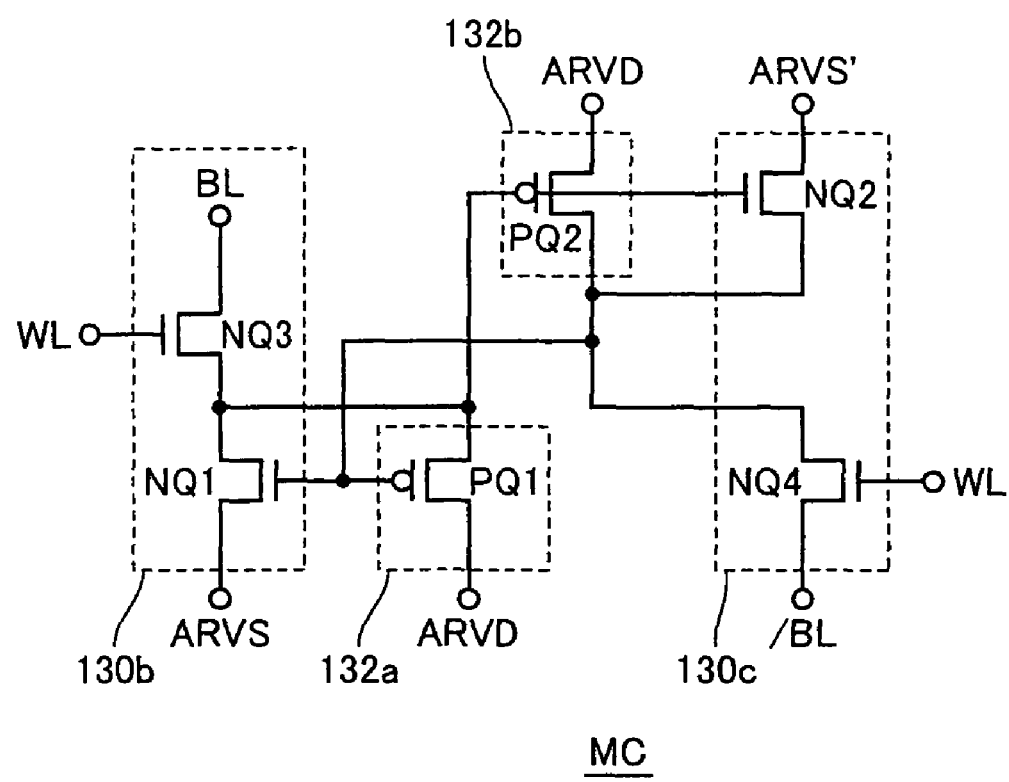
FIG. 48 shows an electrically equivalent circuit of a memory cell in the interconnection line layouts shown FIGS. 44-47.

FIG. 48 shows an electrically equivalent circuit of memory cell MC shown in FIGS. 44-47. In FIG. 48, memory cell MC includes N-channel MOS transistors NQ3 and NQ1 which are arranged in N-type active region 130b, and form the access transistor and the drive transistor, respectively. P-channel MOS transistors PQ1 and PQ2 serving as the load transistors are formed in P-type active regions 132a and 132b, respectively. N-channel MOS transistors NQ2 and NQ4 serving as the drive transistor and the access transistor, respectively, are arranged in N-type active region 130c.

MOS transistor NQ3 has a gate coupled to word line WL, and is coupled at one conduction nodes to bit line BL and at the other conduction node to drains of MOS transistors NQ1 and PQ1. MOS transistor NQ1 is coupled at its source to cell ground line ARVS. MOS transistor 132a is coupled at its source to cell power supply line ARVD.

Gates of these MOS transistors NQ1 and PQ1 are coupled through the shared contact shown in FIG. 44 and the first metal interconnection lines to the drains of MOS transistors PQ2, NQ2 and NQ4. Gates of MOS transistors PQ2 and NQ2 are coupled to the drains of MOS transistors NQ3, NQ1 and PQ1. Sources of MOS transistors PQ2 and NQ2 are coupled to cell power supply line ARVD and cell ground line ARVS, respectively. A source of MOS transistor NQ4 is coupled to bit line /BL.

Therefore, for memory cells MC, the active region extending continuously in the column direction is used, and the cell power supply line and the cell ground line linearly extend in the column direction. Thus, the voltage levels of the cell power supply lines can be easily adjusted on a column-by-column basis, or in units of memory cell columns. In particular, by using the fourth metal interconnection lines to arrange the down power supply lines DWVD continuously extending in the column direction, the connection between the cell power supply lines and the down power supply lines can be controlled in units of memory cell columns, and the voltage level of cell power supply lines ARDV can be easily adjusted in units of memory cell columns in the write operation.

Figure 49:
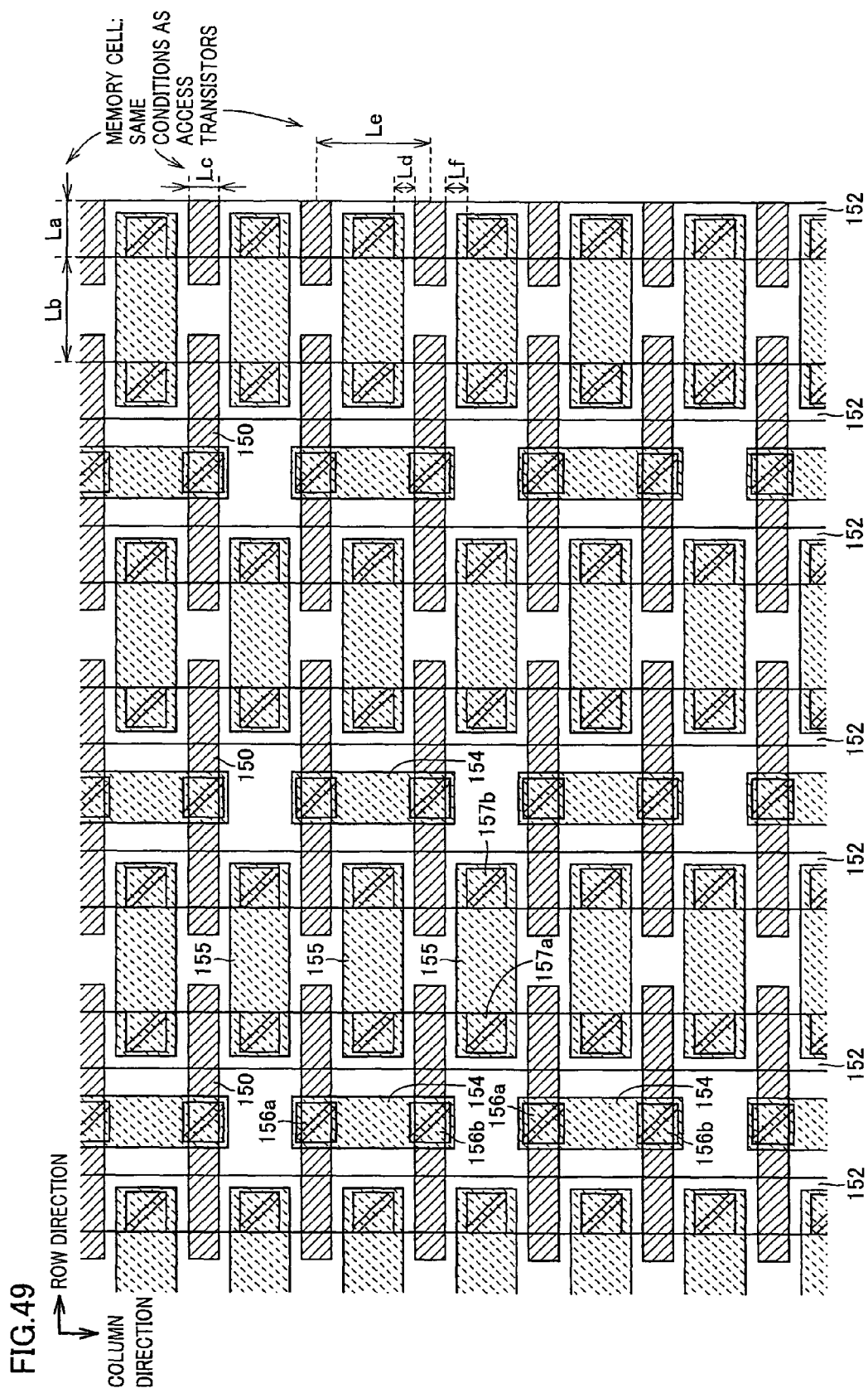
FIG. 49 shows a planar layout of active regions of pull-down elements and first metal interconnection lines according to a seventh embodiment of the invention.

FIG. 49 shows a planar layout of the unit transistors (replica access transistors) forming the pull-down elements. FIG. 49 shows the active regions, gate electrodes and the voltages on the first interconnection lines.

In FIG. 49, N-type active regions 152 extend linearly in the column direction with spaces in between. Gate electrodes 150 are arranged in alignment in the row and column directions. Each gate electrode 150 crosses two active regions 152. Each gate electrode column is arranged corresponding to two active regions.

Two gate electrodes 150 adjacent to each other in the column direction are coupled to a first metal interconnection line 154 through contacts 156a and 156b, respectively. In active region 152, gate electrodes 150 and first metal interconnection lines 155 are arranged alternately to each other. Each first metal interconnection line 155 is arranged for two active regions adjacent to each other in the row direction, and is electrically connected to contacts 157a and 157b to corresponding active regions 152, respectively.

These active regions 152 and gate electrodes 150 are fabricated in parallel when fabricating N-type active regions 130 and gate electrodes 133 of the memory cells.

A width La in the row direction of active region 152 and a distance Lb between active regions 152 adjacent in the row direction are equal to the width and the pitch of the active regions (130a and 130b) of the access transistors at the memory cell boundary region shown in FIG. 44. A width Lc in the column direction of gate electrode 150 is equal to those of gate electrodes 133 (133a and 133b) shown in FIG. 44, and a pitch Le of gate electrode 150 is equal to the pitch of the adjacent access transistors in the memory cells shown in FIG. 44. Further, distances Ld and Lf between gate electrode 150 and the adjacent contacts are equal to those in the access transistors arranged in the memory cell boundary region shown in FIG. 44. The length of gate electrode 150 in the row direction is equal to the length in the row direction of gate electrode 133 of the memory cell.

Therefore, the unit transistors (replica access transistors) of the pull-down elements in FIG. 49 are the same in figure parameters and layout parameters as the access transistors in the memory cells shown in FIG. 44. Active region 152 has the same impurity concentration as active regions 130a and 130b shown in FIG. 44. Thereby, the unit transistors (replica access transistors) of the pull-down element have the same the electric characteristics as the access transistors in the memory cell. Thus, the on-resistance of the pull-down element can be automatically adjusted according to and closely in linkage with fluctuations in electric characteristics caused by variations in manufacturing parameters of the access transistors in the memory cells, and the voltage level of the selected word line can be set to the optimum value according to the characteristics of the memory cells.

In each active region 152, the gate electrodes can be arranged with the equal pitch in the column direction, and thus the unit transistors for pull-down can be arranged at a high density. Accordingly, even in the construction having a plurality of unit transistors arranged for each word line, the unit transistors for pull-down can be arranged in the memory cell array while suppressing increase in layout area of the memory cell array.

Figure 50:
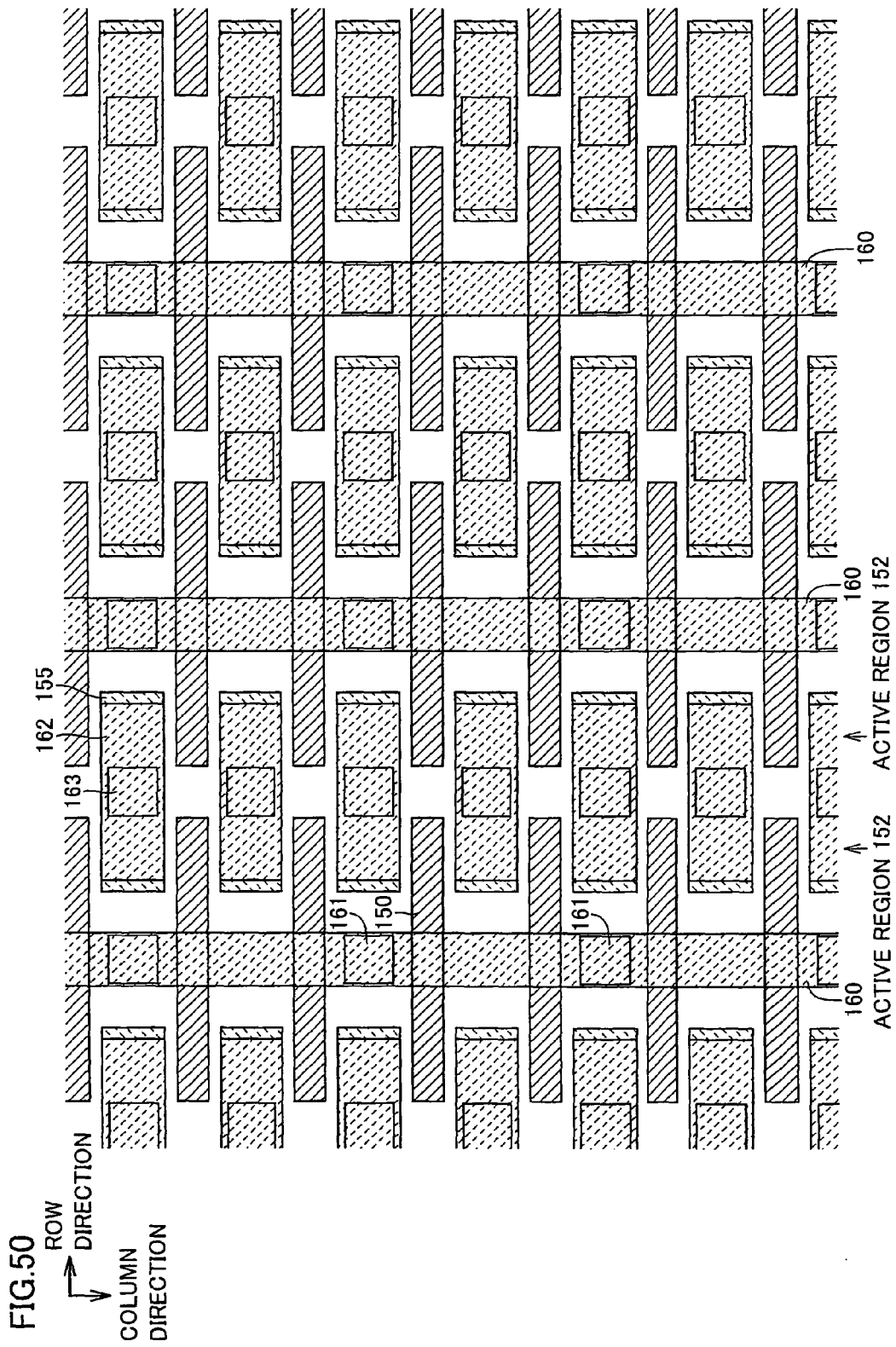
FIG. 50 shows a planar layout of second metal interconnection lines in a layer above the interconnection line layout shown in FIG. 49.

FIG. 50 shows a layout of the second metal interconnection lines of the pull-down elements according to the seventh embodiment of the invention. FIG. 50 also shows a layout of gate electrodes 150. In FIG. 50, second metal interconnection lines 160 extend linearly in the column direction, two active regions 152 are located between adjacent second metal interconnection lines 160. Second metal interconnection line 160 is electrically connected through a via 161 to first metal interconnection line 154 formed in a lower layer. Each via 161 is arranged for two gate electrodes 150 adjacent in the column direction. Each via 161 is used for selecting four transistors laid around concurrently.

A second metal interconnection line 162 is arranged corresponding to first metal interconnection line 155 electrically connecting adjacent active regions 152. Second metal interconnection line 162 is connected through a via 163 to first metal interconnection line 155 in a lower layer. Second metal interconnection lines 160 and 162 are fabricated concurrently in manufacturing of the bit lines and cell power supply lines of the memory cells.

As shown in FIG. 50, therefore, second metal interconnection lines 160 and 162 make the electric connections to first metal interconnection lines 154 and 155 isolated from each other, and vias 161 and 163 for making the electric connections are aligned in the row directions. Vias 163 are arranged correspond to first metal interconnection lines 155, and for the respective rows. Thus, the source of each unit transistor can be coupled to the ground node.

Figure 51:
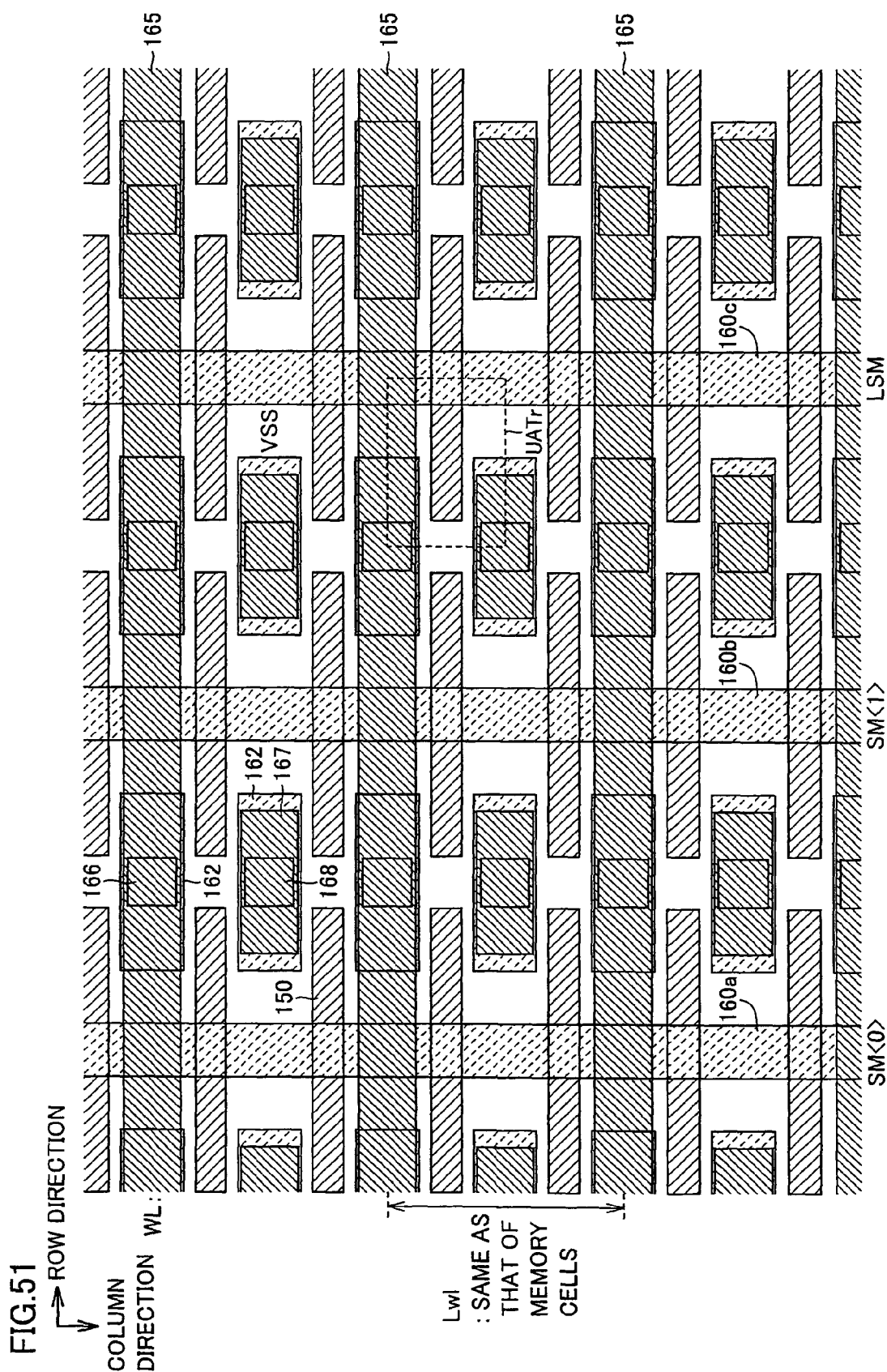
FIG. 51 shows a planar layout of third metal interconnection lines in a layer above the planar layout shown in FIG. 50.

FIG. 51 shows a layout of third metal interconnection lines of the pull-down elements according to the seventh embodiment of the invention. FIG. 51 also shows gate electrodes 150 and second metal interconnection lines 160 (160a, 160b and 160c).

In FIG. 51, third metal interconnection lines 165 each arranged for two gate electrode rows extend continuously in the row direction. Third metal interconnection lines 165 are formed in the same steps as the third metal interconnection lines (136a-136c) forming the word lines in the memory cell array, and are coupled thereto. Third metal interconnection lines 165 are connected to second metal interconnection lines 162 shown in FIG. 50 through vias 166, respectively. Second metal interconnection line 162 electrically connects the adjacent active regions. Therefore, one via 166 connects the drain regions of the two transistors to third metal interconnection line 165 forming the corresponding word line.

Third metal interconnection lines 165 and 167 are arranged alternately in the column direction between second metal interconnection lines 160 (160a-160c). Each third metal interconnection line 167 is arranged for second metal interconnection line 162, and is electrically connected to corresponding second metal interconnection line 162 through a via 168. Third metal interconnection line 167 is used as a contact for transmitting the cell ground voltage.

Each third metal interconnection line 165 forming word line WL is arranged for two gate electrodes 150 adjacent in the column direction. Therefore, third metal interconnection lines 165 can be arranged at the same interconnection line pitch Lwl as third metal interconnection lines 136a-136c shown in FIG. 46, and the third metal interconnection lines that continuously and linearly extend to form word lines WL can be arranged for the unit transistors (replica access transistors) of the pull-down elements and memory cells.

Second metal interconnection lines 160a, 160b and 160c transmit the control signals SM<0>, SM<1> and LSM, respectively.

Each of second metal interconnection lines 160a-160c selects four unit transistors (replica access transistors) UATr per one word line. Specifically, it selects in parallel the four unit transistors (replica access transistors) UATr that are arranged around (upper, lower, right and left) of the crossing of third metal interconnection line 165 forming the word line and second metal interconnection line 160 (160a-160c) forming the control signal line. By increasing the number of the control signal lines, it is possible to increase further the number of the unit transistors that are selected simultaneously per word line. FIG. 51 shows an example of the interconnection layout in which each of control signals SM<0>, SM<1> and LSM selects four unit transistors (replica access transistors) UATr per word line. By using a plurality of gate electrodes arranged in rows and columns, one contact/via can transmit the select signal to a plurality of gate electrodes, and one control signal line can select concurrently a plurality of unit transistors per word line.

Figure 52:
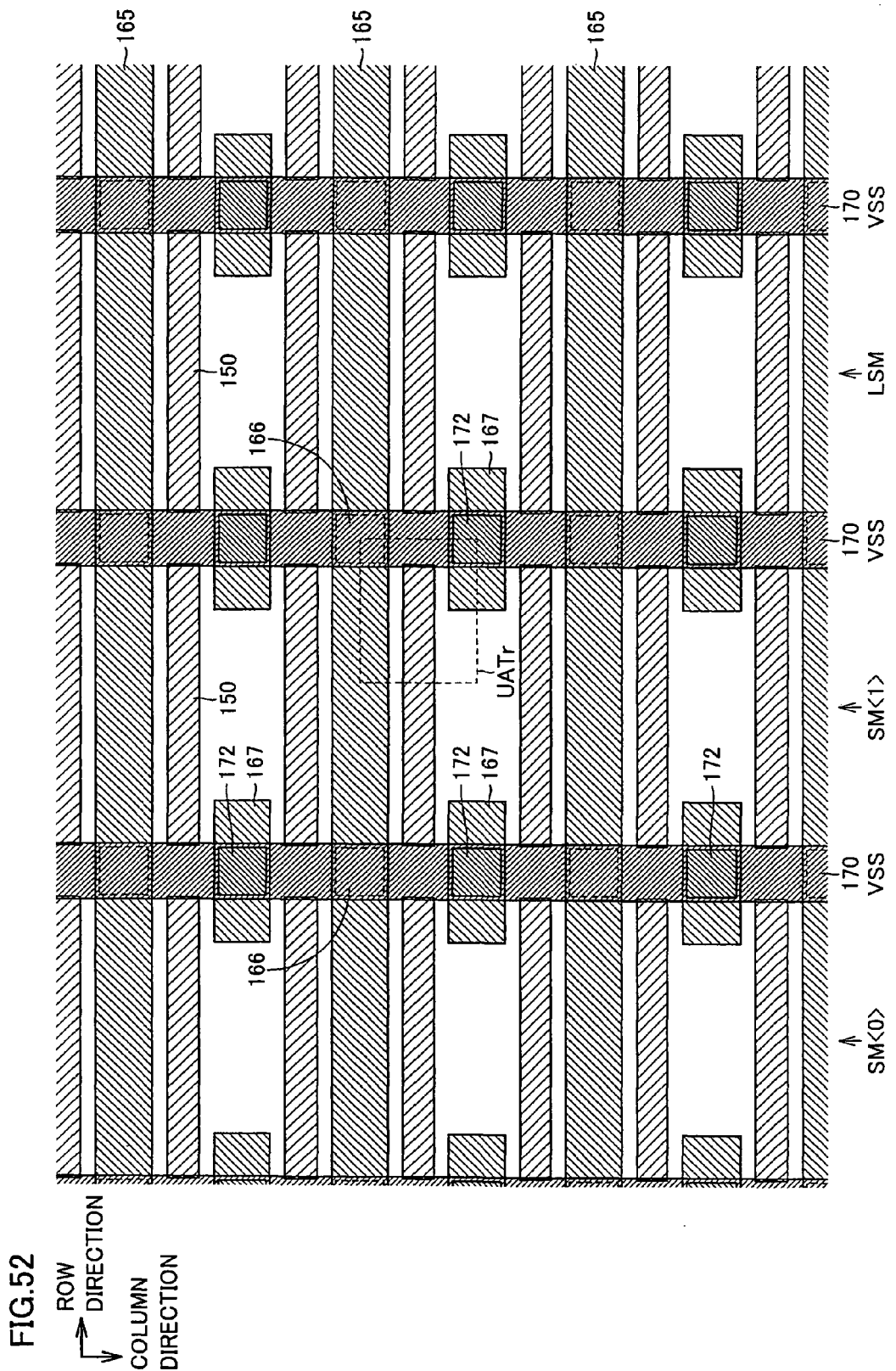
FIG. 52 shows a planar layout of fourth metal interconnection lines in a layer above the planar layout shown in FIG. 51.

FIG. 52 shows a layout of the third and fourth metal interconnection lines according to the seventh embodiment of the invention. FIG. 52 also shows the layout of gate electrodes 150.

In FIG. 52, fourth metal interconnection lines 170 extending linearly in the column direction are arranged alternately in the planar layout with second metal interconnection lines 160a-160c in FIG. 51. Fourth metal interconnection line 170 is electrically connected through a via 172 to third metal interconnection line 167 arranged in the corresponding column. Fourth metal interconnection line 170 transmits cell ground voltage VSS. Therefore, vias 166 for third metal interconnection lines 165 and vias 172 for third metal interconnection lines 167 are arranged for each fourth metal interconnection line 170, being aligned and alternately in the column direction. In the column direction, four unit transistors UATr are arranged for vias 166 and 172. Two unit transistors (replica access transistors) UATr are arranged between vias 172 adjacent in the column direction.

Accordingly, the layout of the unit transistors for pull-down including connections to interconnection lines in the upper layer can be substantially the same as the layout of the access transistors of the memory cell, and the replica transistors of the access transistors of the memory cell can be accurately formed. Similarly to the layout of the memory cells, the interconnection lines merely extend linearly in the row or column direction, which simplifies the layout, and allows accurate patterning in the manufacturing process for manufacturing the replica transistors of the access transistors of the memory cells.

Figure 53:
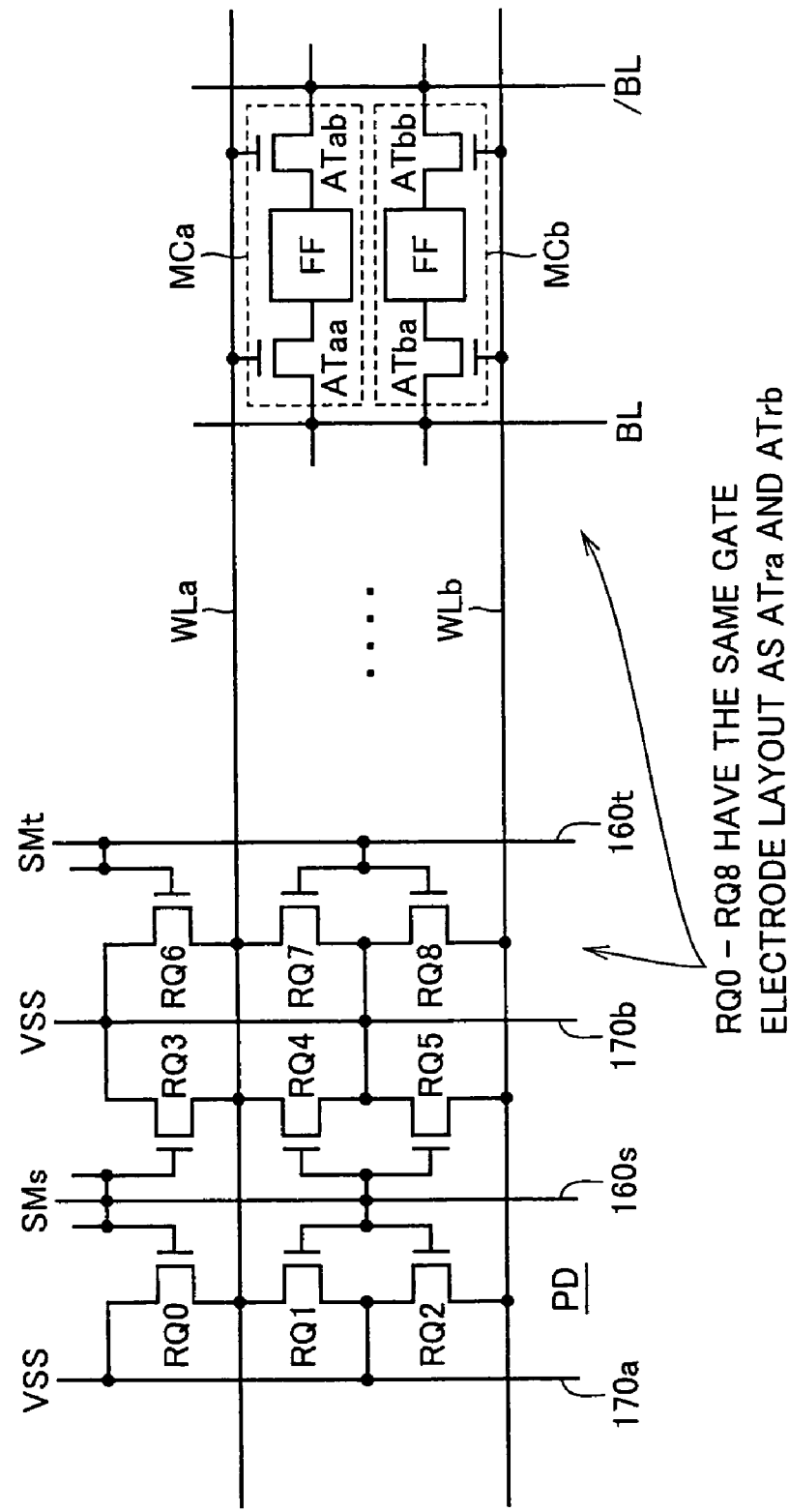
FIG. 53 shows an electrically equivalent circuit of the pull-down element in the interconnection line layout shown in FIGS. 49-52.

FIG. 53 shows an electrically equivalent circuit of pull-down element PD together with electrically equivalent circuits of memory cells MCa and MCb. FIG. 53 shows arrangements of two control signal lines SMa and SMb as well as the unit transistors in pull-down element PD arranged for word lines WLa and WLb.

In pull-down element PD shown in FIG. 53, N-channel MOS transistors RQ0-RQ2 coupled to a common ground line 170a are aligned in one column, MOS transistors RQ3 and RQ5 are aligned in one column, and MOS transistors RQ2 and RQ8 are aligned in one column.

Each of MOS transistors RQ0-RQ5 receives on its gate a control signal SMs via a control signal line 160s. Each of MOS transistors RQ6-RQ8 receives, on its gate, a control signal SMt through a control signal line 160t.

MOS transistors RQ1, RQ2, RQ4 and RQ5 arranged between word lines WLa and WLb are coupled to control signal line 160s through a shared contact and a via, and MOS transistors RQ7 and RQ8 are coupled to control signal line 160t through a shared contact and a via. In this case, MOS transistors RQ1 and RQ2 are coupled to ground line 170a through a shared contact and a via, and MOS transistors RQ4, RQ5, RQ7 and RQ8 are coupled to a cell ground line 170b through a common via and a common contact.

A required number of MOS transistors RQ0-RQ8 are arranged in rows and columns, and are supplied with corresponding control signals.

Control signals SMs and SMt are included in control signal group SMG. When control signals SMs and SMt are the same control signal, eight unit transistors can be selected concurrently per word line.

Memory cell MCa includes access transistors ATaa and ATab that are turned on according to the signal on word line WLa, thereby to couple internal flip-flop FF to bit lines BL and /BL, respectively. Memory cell MCb includes access transistors ATba and ATbb that are turned on according to the signal potential on word line WLb, thereby to couple flip-flop FF to bit lines BL and /BL, respectively.

MOS transistors RQ0-RQ8 have the same layout in connection with the gate electrodes as access transistors ATaa, ATba, ATab and ATbb. Therefore, MOS transistors RQ0-RQ8 have the same electric characteristics as access transistors ATaa, ATab, ATba and ATbb. When variations occur in threshold voltage of memory cells MCa and MCb due to variations in manufacturing parameters, similar variations occur in threshold voltage of MOS transistors RQ0-RQ8 due to reflection of similar variations in manufacturing parameters (e.g., misalignment of mask, and variations in impurity concentration and others), and the voltage level of the selected word line can be adjusted according to the operation characteristics of the memory cells thus determined.

As described above, the pull-down element is formed of the replica transistors of the access transistors of the memory cell. The unit transistors (replica access transistors) of pull-down element PD are manufactured in the same manufacturing steps as the memory cell in manufacturing process of the memory cells. Thus, the replica access transistors can be formed with the same layout and under the same gate electrode conditions as the access transistors of the memory cells. Even when variations occur in manufacturing parameters of the memory cell, the same variations can be reflected in the replica access transistors. Therefore, a selected word line can be set to the voltage level reflecting the variations in manufacturing parameters. Thus, the read margin can be ensured, and the writing and reading of data can be stably performed.

Pull-down element PD does not employ a dummy cell, but employs only the replica transistors of the access transistors, so that the arrangement area of pull-down element PD can be reduced.

In the foregoing description, both pull-down element PD for improving the read margin and the write assist array power supply circuit performing write assistance are employed. Thereby, the write margin can be stably ensured even in the construction of pulling down the voltage level of a selected word line. However, the write assist cell power supply circuit may be solely arranged independently of the pull-down element. The write margin can be reliably increased.

Eight Embodiment

Figure 54:
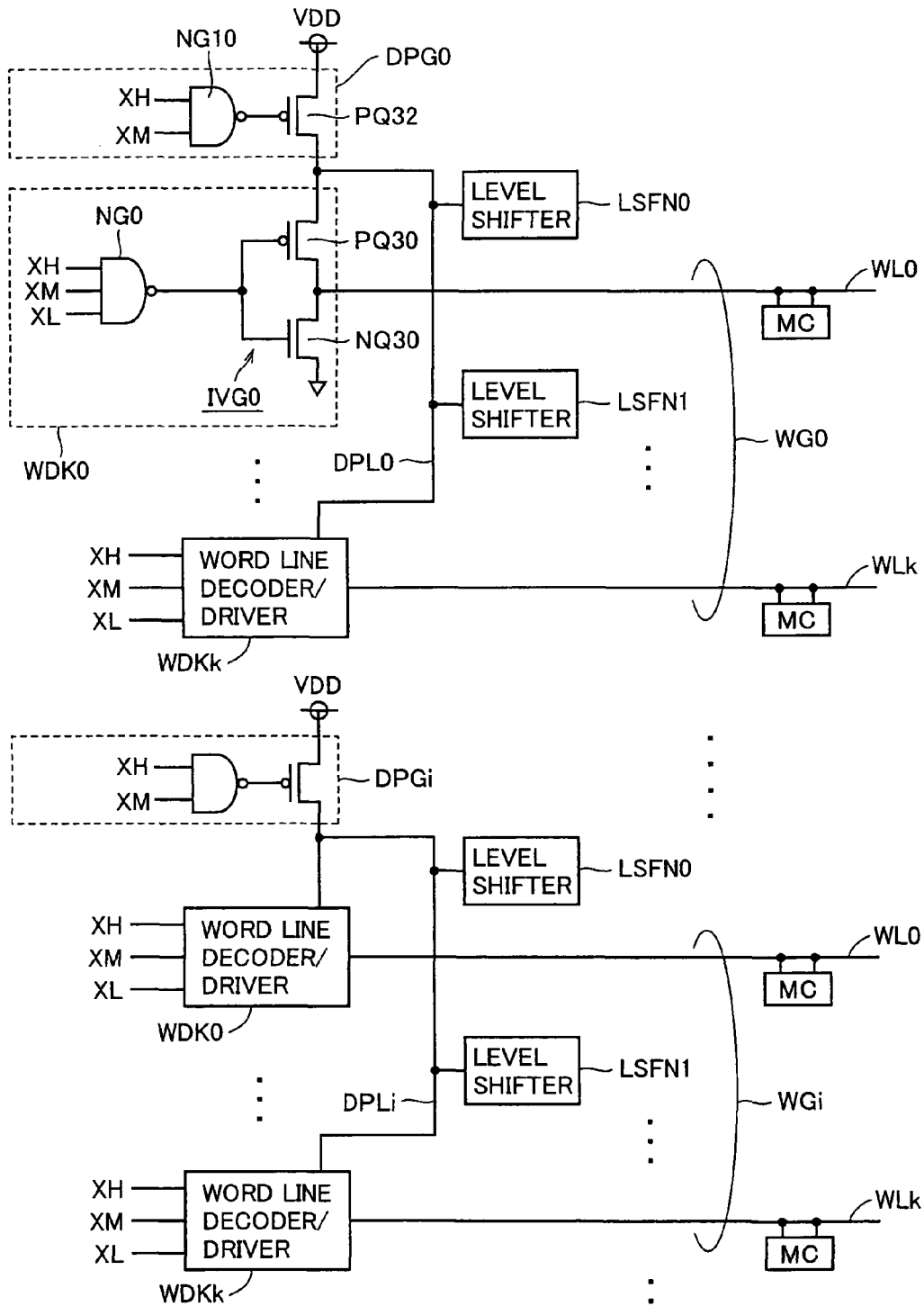
FIG. 54 shows a construction of a main portion of a semiconductor memory device according to an eighth embodiment of the invention.

FIG. 54 shows a construction of a main portion of a semiconductor memory device according to an eighth embodiment of the invention. The semiconductor memory device shown in FIG. 54 differs from the semiconductor memory device shown in FIG. 28 in the following constructions. A plurality of level shifters LSFN0, LSFN1, . . . are arranged corresponding to driver power supply lines DPL0-DPLi that are arranged corresponding to word line groups WG0-WGi, respectively. Each of level shifters LSFN0, LSFN1, . . . includes one or more transistors (replica access transistors UATr) similar to the access transistors in memory cell MC.

The unit transistor in each of level shifters LSFN0, LSFN1, . . . operates in a resistance mode, and pulls down the voltage level of the corresponding driver power supply line (through resistance division).

In driver power supply line precharge circuits DPG0-DPGi, a P-channel MOS transistor PQ32 is selectively turned on according to an output signal of an NAND circuit NG10 receiving upper predecode signals, thereby to couple corresponding driver power supply line DPL to the power supply node.

Other constructions of the semiconductor memory device shown in FIG. 54 are the same as those of the semiconductor memory device shown in FIG. 28. Corresponding portions are allotted with the same reference numerals, and description thereof is not repeated.

Each of word line groups WG0-WGi is selected when corresponding upper predecode signals XI and XM are both at the H level. Therefore, the driver power supply line corresponding to a selected word line group is electrically coupled to the power supply node. For an unselected word line group, driver power supply line DPL is isolated from the power supply node, and is maintained at the ground voltage level by level shifters LSFN0 and LSFN1. Thus, it is possible to prevent flow of a leakage current through the unselected word line group via the word line drivers, so that the current consumption can be reduced, and the current consumption during standby can be reduced.

By arranging the pull-down level shifter for the driver power supply line, the elements can be reduced in number as compared with the construction employing the pull-down element for each word line, and the increase in array area can be suppressed.

Figure 55A:
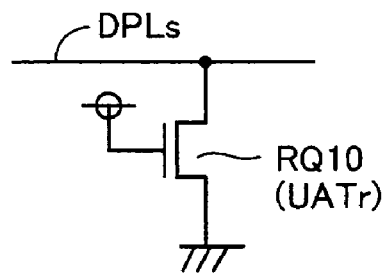
FIGS. 55A and 55B show specific constructions of a level shifter shown in FIG. 54.
Figure 55B:
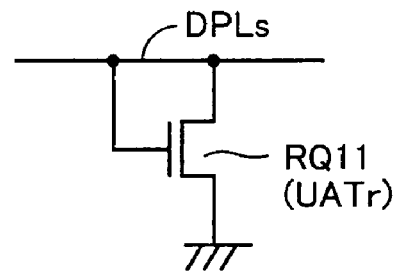

FIGS. 55A and 55B show an example of constructions of level shifters LSFN0 and LSFN1 shown in FIG. 54. In FIG. 55A, each level shifter LSFN (LSFN0 or LSFN1) includes an N-channel MOS transistor RQ10 connected between corresponding driver power supply line DPLs and the ground node and having a gate coupled to the power supply node. MOS transistor RQ10 is formed of the transistor (replica access transistor) UATr of the same layout as the access transistor of the memory cell, and reflects the fluctuations in threshold voltage of the access transistor of the memory cell. The transistor has a gate coupled to the power supply node, and is normally on, so that it operates as a resistance element due to its channel resistance (on-resistance).

Level shifter LSFN shown in FIG. 55B includes an N-channel MOS transistor RQ11 having a gate and a drain coupled together to corresponding driver power supply line DPLs, and also having a source coupled to the ground node. MOS transistor RQ11 has the same layout as the access transistor of the memory cell, and reflects the fluctuations in threshold voltage of the N-channel MOS transistor of the memory cell. MOS transistor RQ11 has the gate and drain connected with each other, and operates in a resistance mode to lower the voltage level of corresponding driver power supply line DPL.

Figure 56:
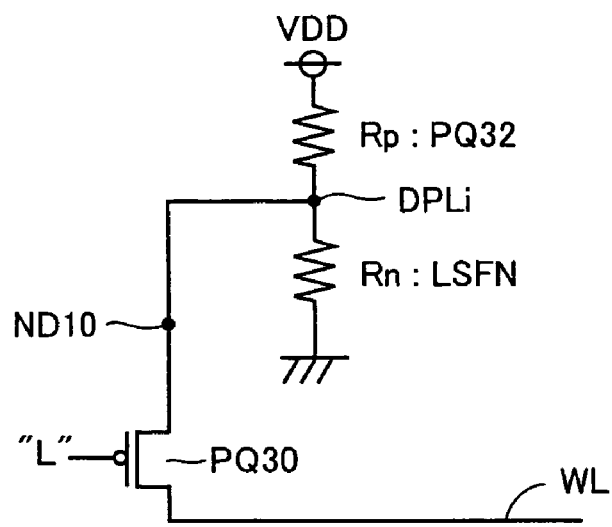
FIG. 56 shows an electrically equivalent circuit of a word line driver power supply portion in a data read operation of the semiconductor memory device shown in FIG. 54.

FIG. 56 shows electrical connections of driver power supply line precharge circuit DPG, level shifter LSFN and the word line driver for a corresponding driver power supply line DPL in the selected word line group. In FIG. 56, MOS transistor PQ32 in the driver power supply line precharge circuit has an on-resistance Rp. MOS transistor (PQ0 or PQ11) in the level shifter has an on-resistance Rn. Driver power supply line DPLi is coupled to word line WL via MOS transistor PQ30 of the word line driver. A potential V(ND10) of a source node ND10 (driver power supply line) of the word line driver transistor is represented by the following equation:

$$V(ND10)=VDD \cdot Rn/(Rp+Rn)=VDD/(1+(Rp/Rn)).$$

When the threshold voltage of the access transistor in the memory cell increases, the current driving power decreases and accordingly, the conductance decreases. In this case, the resistance value of resistance Rn increases. Thus, potential V(ND10) of source node ND10 of the driver transistor increases, and the potential on selected word line WL rises. In the state where the threshold voltage of the access transistor in the memory cell is high, the current driving power of the access transistor is small, and the static noise margin of the memory cell is sufficiently ensured and the storage data of the memory cell is stably held even when the potential of the selected word line is high. In this case, the on-resistance of the MOS transistor in level shifter LSFN is high, and the excessive drop of the voltage level of the selected word line can be suppressed.

Conversely, when the threshold voltage of the access transistor in the memory cell lowers, the current driving power increases and the conductance increases accordingly. In this case, the resistance value of resistance Rn lowers. Accordingly, the potential of source node ND10 of the driver transistor lowers, and the potential of the selected word line lowers. The current driving power of the access transistor in the memory cell transistor decreases, and the static noise margin of the memory cell increases.

Accordingly, the power supply voltage of the word line driver is lowered by using the resistance-dividing circuit that utilizes the on-resistances of MOS transistors PQ32 and RQ10 (or RQ11). By adjusting on-resistances Rp and Rn of these transistors, the selected word line can be set to the optimum voltage level according to the static noise margin of the memory cell, and the data can be read stably even with a low power supply voltage.

In the data write operation, when the threshold voltage of the access transistors in the memory cell is low, the write margin of the memory cell is large, and a sufficient write margin can be ensured to achieve fast data writing even when the voltage on the selected word line is low. When the threshold voltage of the access transistor in the memory cell is high, the write margin lowers due to lowering of the voltage level of the selected word line. In this state, however, lowering of the voltage level of the selected word line is suppressed in the above state, and the deterioration of the write margin is suppressed so that fast writing can be achieved.

In the above description, the replica access transistor is used for the component transistor of level shifter LSFN. However, for the level shifter, there may be used the transistor (replica drive transistor) that has the same layout as the drive transistor of the memory cell and has characteristics varying closely in linkage with the characteristics of the drive transistor, in which case a similar effect can be achieved.

As shown in FIGS. 38 and 39, each level shifter LSFN may include a plurality of access/driver replica transistors, which are selectively or fixedly set to the on state by a control signals or a mask interconnection.

Further, a write assist power supply circuit may be employed, and may be combined with the level shifter to adjust the static noise margin and the write margin of the memory cell.

According to the eighth embodiment of the invention, as described above, a level shifter for pull-down is arranged for the driver power supply line, to shift down the voltage of the driver power supply line corresponding to the selected word line group. Therefore, the static noise margin and write margin of the memory cell can be improved without increasing the array area, and it is possible to provide the semiconductor memory device that can stably perform fast reading and writing of data even with a low power supply voltage.

The invention can be generally applied to the semiconductor memory device having static memory cells, and particularly can be applied to a static semiconductor memory device using a low power supply voltage for low power consumption, whereby the static semiconductor memory device operating stably with low power consumption can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of static memory cells arranged in rows and columns;
   a plurality of bit line pairs arranged corresponding to the respective memory cell columns, each connected to the memory cells in a corresponding column;
   a plurality of word lines, arranged corresponding to the respective memory cell rows, each connected to the memory cells in a corresponding row, wherein each memory cell from the plurality of static memory cells includes:
      a first p-type transistor connected to a first storage node of each memory cell;
      a second p-type transistor connected to a second storage node of each memory cell;
      a first n-type transistor connected to the first storage node of each memory cell, the first n-type and p-type transistors having respective gate electrodes commonly connected to the second storage node;
      a second n-type transistor connected to the second storage node of each memory cell, the second n-type and p-type transistors having respective gate electrodes commonly connected to the first storage node;
      a third n-type transistor connected to between the first storage node and one of the bit line pair corresponding to the column in which each memory cell is arranged, having a gate electrode connected to the word line corresponding to the row in which each memory cell is arranged; and
      a fourth n-type transistor connected to between the second storage node and another of the bit line pair corresponding to the column in which each memory cell is arranged, having a gate electrode connected to the word line corresponding to the row in which each memory cell is arranged;
   a plurality of word line drivers, arranged corresponding to said word lines, each for driving a corresponding word line to a selected state when the corresponding word line is addressed;
   a plurality of driver precharge circuits arranged corresponding to respective groups each including a predetermined number of the word lines of said plurality of word lines, each for supplying a voltage at a first voltage level to the word line drivers in a corresponding word line group when the corresponding word line group is selected; and
   a plurality of level shift circuits arranged corresponding to the respective driver precharge circuits, each for shifting the voltage at the first voltage level supplied from a corresponding driver precharge circuit to a second voltage level lower than the first voltage level, each of the plurality of word line drivers supplying the voltage at the second voltage level to the corresponding word line when the corresponding word line is addressed and supplying a voltage at a third voltage level lower than the second voltage level to the corresponding word line when the corresponding word line is not addressed, wherein each of the level shift circuits includes a transistor coupled between the respective driver precharge circuits and a ground node.

2. The semiconductor memory device according to claim 1, wherein
   the transistor has characteristics variable in linkage with fluctuations in characteristics of at least one of the first to fourth n-type transistors.

3. The semiconductor memory device according to claim 1, wherein
   the transistor of the level shift circuit is an insulated gate field effect transistor operating in a resistance mode.

4. The semiconductor memory device according to claim 1, wherein
   each driver precharge circuit isolates a node supplying the voltage at said first voltage level from corresponding word line drivers except when a word line in the corresponding word line group is addressed.

5. A semiconductor memory device comprising:
   a plurality of static memory cells arranged in rows and columns:
   a plurality of word lines arranged corresponding to the respective memory cell rows, each connected to the memory cells in a corresponding row;
   a plurality of bit line pairs arranged corresponding to the respective memory cell columns, each crossing the plurality of word lines and being connected to the memory cells in a corresponding column, each memory cell from the plurality of static memory cells including:
      a first p-type transistor connected to a first storage node of each memory cell;
      a second p-type transistor connected to a second storage node of each memory cell;
      a first n-type transistor connected to the first storage node of each memory cell, the first n-type and p-type transistors having respective gate electrodes commonly connected to the second storage node;
      a second n-type transistor connected to the second storage node of each memory cell, the second n-type and p-type transistors having respective gate electrodes commonly connected to the first storage node;
      a third n-type transistor connected to between the first storage node and one of the bit line pair corresponding to the column in which each memory cell is arranged, having a gate electrode connected to the word line corresponding to the row in which each memory cell is arranges; and
      a fourth n-type transistor connected to between the second storage node and another of the bit line pair corresponding to the column in which each memory cell is arranged, having a gate electrode connected to the word line corresponding to the row in which each memory cell is arranged;
   a plurality of word line drivers, arranged corresponding to said word lines, each for driving a corresponding word line to a selected state when the corresponding word line is addressed;
   a plurality of driver power supply lines, arranged corresponding to a plurality of word line groups, each group including plural word lines among said plurality of word lines, each driver power supply line being connected commonly to the word line drivers for driving the plural word lines in the corresponding word line group; and a plurality of word line power supply circuits being connected to the plurality of driver power supply lines, respectively, each word line power supply circuit receiving a power supply voltage and generating a word line voltage to be supplied for the driver power supply line connected thereto, the word line voltage being lower than the power supply voltage, each of the plurality of word line drivers supplying the word line voltage to the corresponding word line when the corresponding word line is addressed and a voltage lower than the word line voltage to the corresponding word line when the corresponding word line is not addressed, wherein the plurality of word line power supply circuits include respective voltage level shift circuits having a transistor coupled between the respective driver power supply lines and a ground node, shifting the power supply voltage to the word line voltage.

6. The semiconductor memory device according to claim 5, wherein the transistor has characteristics variable in linkage with fluctuations in characteristics of at least one of the first to fourth n-type transistors.

* * * * *